(12) United States Patent
Warburton

(10) Patent No.: US 8,364,444 B2
(45) Date of Patent: Jan. 29, 2013

(54) METHOD FOR DESIGNING DISTRIBUTING FRAME

(76) Inventor: Kenneth J. Warburton, Hempstead, NY (US)

(*) Notice: Subject to any disclaimer, the term of this patent is extended or adjusted under 35 U.S.C. 154(b) by 1277 days.

(21) Appl. No.: 11/949,743

(22) Filed: Dec. 3, 2007

(65) Prior Publication Data

US 2008/0077646 A1    Mar. 27, 2008

Related U.S. Application Data

(62) Division of application No. 10/999,650, filed on Nov. 29, 2004, now Pat. No. 7,304,865.

(60) Provisional application No. 60/525,151, filed on Nov. 28, 2003.

(51) Int. Cl.
  *G06F 17/50* (2006.01)

(52) U.S. Cl. .................. 703/1; 703/13; 361/826

(58) Field of Classification Search .............. 703/13, 703/1
  See application file for complete search history.

(56) References Cited

U.S. PATENT DOCUMENTS

| | | | |
|---|---|---|---|
| 816,847 A | 4/1906 | Cook | |
| 822,590 A | 6/1906 | Dommerque | |
| 3,743,613 A | 7/1973 | Searls | |
| 3,755,630 A | 8/1973 | Boyer | 379/325 |
| 4,002,856 A | 1/1977 | Sedlacek et al. | 379/327 |
| 4,158,754 A | 6/1979 | Yonezaki et al. | 379/328 |
| 4,204,095 A | 5/1980 | De Luca et al. | 439/527 |
| 4,237,546 A | 12/1980 | Wells | 710/100 |
| 4,320,261 A | 3/1982 | Scerbo et al. | |
| 4,356,461 A | 10/1982 | Acoraci | 333/116 |
| 4,472,765 A | 9/1984 | Hughes | 361/791 |
| 4,498,717 A | 2/1985 | Reimer | |
| 4,838,798 A | 6/1989 | Evans et al. | 439/61 |
| 5,211,565 A | 5/1993 | Krajewski et al. | 439/65 |
| 5,296,748 A | 3/1994 | Wicklund et al. | 327/565 |
| 5,335,146 A | 8/1994 | Stucke | 361/785 |
| 5,352,123 A | 10/1994 | Sample et al. | 439/61 |
| 5,459,644 A | 10/1995 | Warburton | |
| 5,634,822 A | 6/1997 | Gunell | 439/668 |
| 5,704,115 A | 1/1998 | Warburton | |
| 6,163,464 A | 12/2000 | Ishibashi et al. | 361/788 |
| 6,258,737 B1 | 7/2001 | Steibel et al. | 442/172 |
| 6,335,867 B1 | 1/2002 | Ishibashi et al. | |
| 6,392,142 B1 | 5/2002 | Uzuka et al. | 174/52.1 |
| 6,422,876 B1 | 7/2002 | Fitzgerald et al. | 439/61 |
| 6,528,737 B1 | 3/2003 | Kwong et al. | 174/262 |
| 6,529,877 B1 * | 3/2003 | Murphy et al. | 705/7.22 |
| 6,538,899 B1 | 3/2003 | Krishnamurthi et al. | 361/788 |
| 6,608,762 B2 | 8/2003 | Patriche | 361/788 |
| 6,647,362 B1 | 11/2003 | Reblewski et al. | 703/28 |
| 6,658,192 B2 * | 12/2003 | Glynn | 385/135 |

(Continued)

OTHER PUBLICATIONS

Kennet et al, "Beyond the Rhetoric: An Introduction to Implementing TELRIC", Review of Network Economics, vol. 1, Issue 2, Sep. 2002.*

*Primary Examiner* — Mary C Jacob

(57) ABSTRACT

A method for designing a distributing frame and a computer readable medium having computer instructions thereon for causing a computer to perform the method. The distributing frame may include a first distribution portion having a first series of verticals, and a first series of horizontal shelves; a second distribution portion having a second series of verticals, and a second series of horizontal shelves, the second distribution portion being disposed generally parallel to and spaced apart from the first distribution portion; and at least one horizontal bridge between the first distribution portion and the second distribution portion to support interconnections between a shelf of the first distribution portion and a shelf of the second distribution portion. A portion of a first face of a portion of the shelves can be used for terminal blocks for connecting outside connector cables to the interconnections.

22 Claims, 47 Drawing Sheets

Connection Densities for 2x3(1,1,1) BP Array, E=6
Solid Line = Full Connection, Dashed Line = Half Connection

U.S. PATENT DOCUMENTS

| | | | |
|---|---|---|---|
| 6,690,584 B2 | 2/2004 | Uzuka et al. | 361/796 |
| 6,814,582 B2 | 11/2004 | Vadasz et al. | 439/61 |
| 6,903,939 B1 | 6/2005 | Chea et al. | 361/788 |
| 6,922,342 B2 | 7/2005 | Doblar et al. | 361/736 |
| 7,158,614 B2 | 1/2007 | Arias | 379/27.07 |
| 2002/0018339 A1 | 2/2002 | Uzuka et al. | 361/796 |
| 2002/0181215 A1 | 12/2002 | Guenthner | 361/784 |
| 2002/0181217 A1 | 12/2002 | Patriche | 361/796 |

* cited by examiner

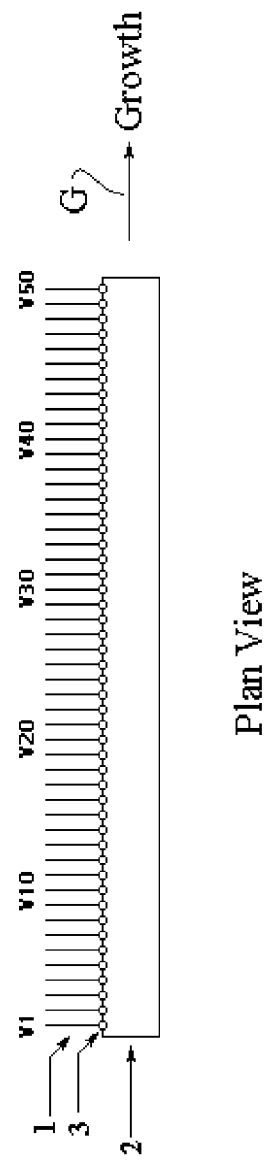
FIG. 1A  *PRIOR ART*
Plan View
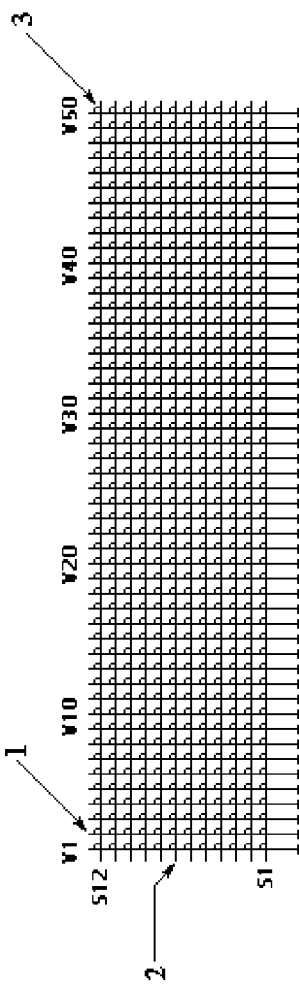
FIG. 1C
Elevation
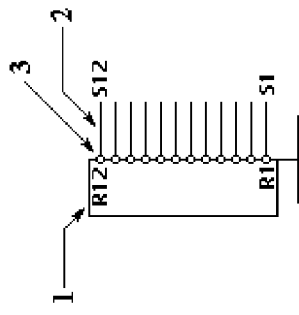
FIG. 1B
Side View Plan View Side View Plan View Elevation Side View

*PRIOR ART*

*PRIOR ART*

Plan View

Side View

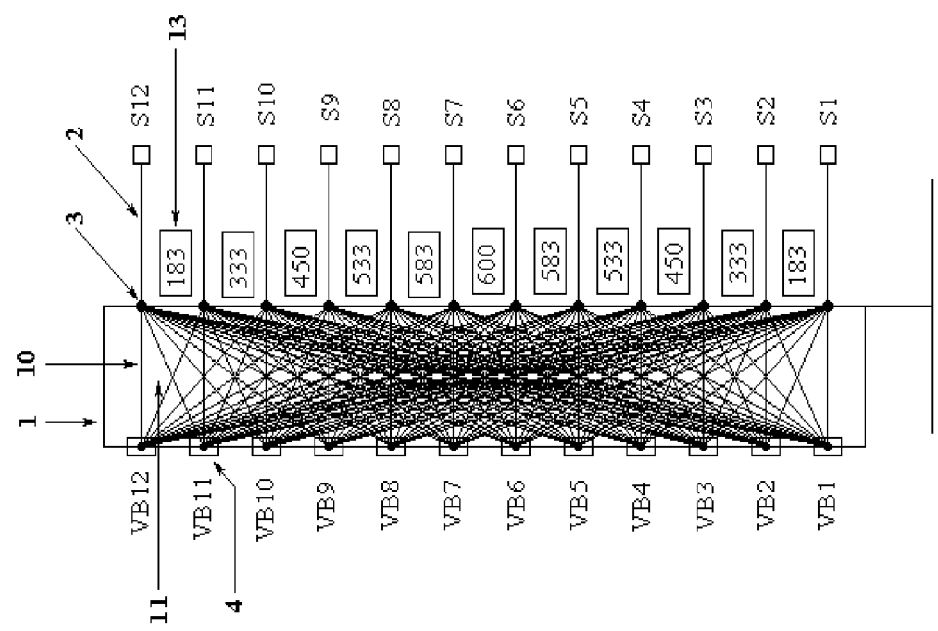

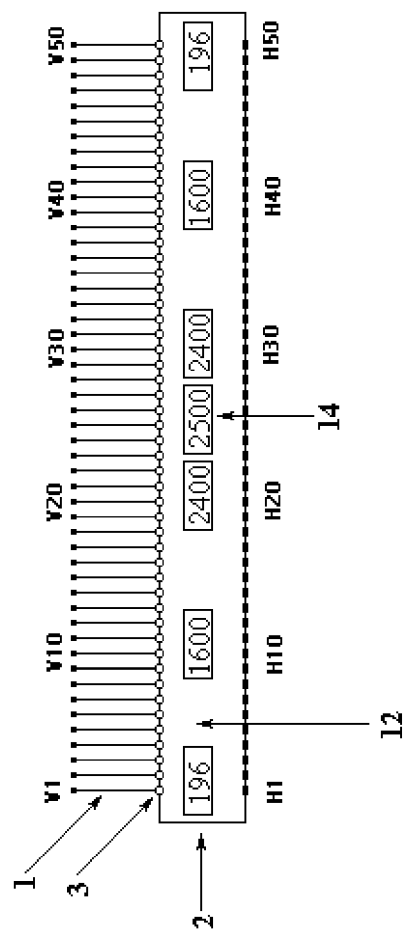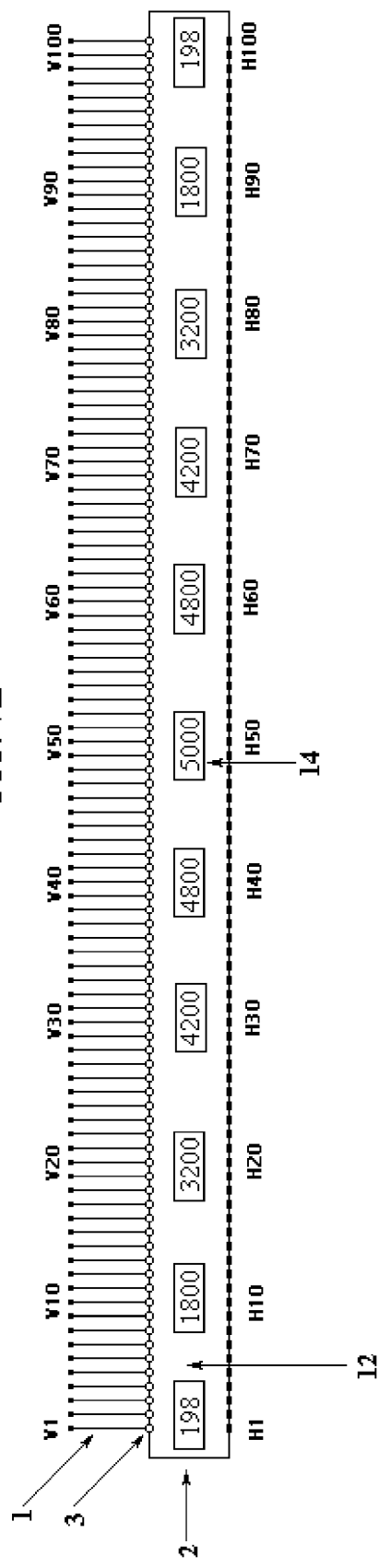

Shelf Density as DF Size Increases at 100% Randomness

500V Linear DF - Full Random vs Limited Random

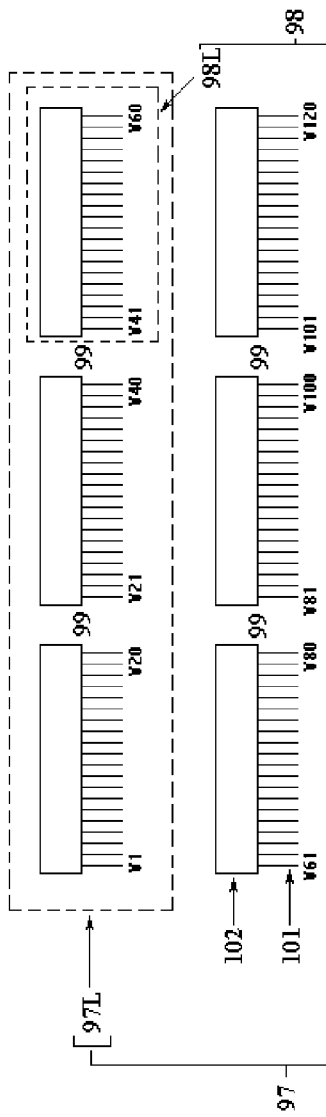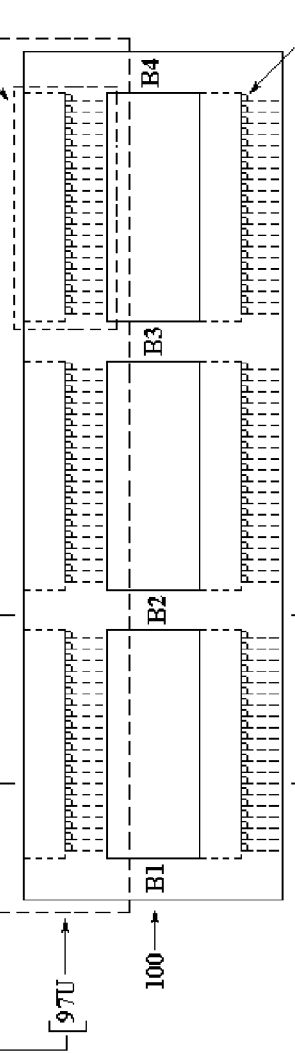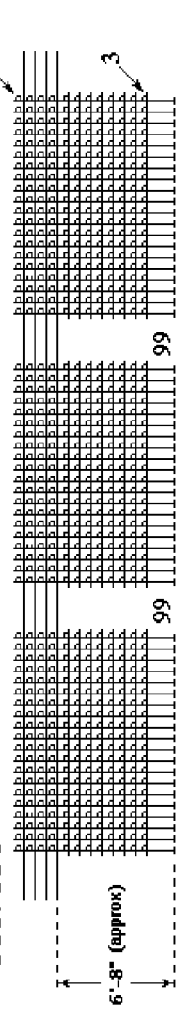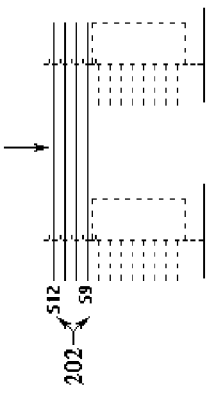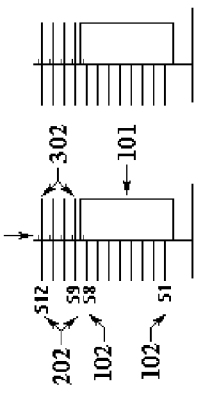

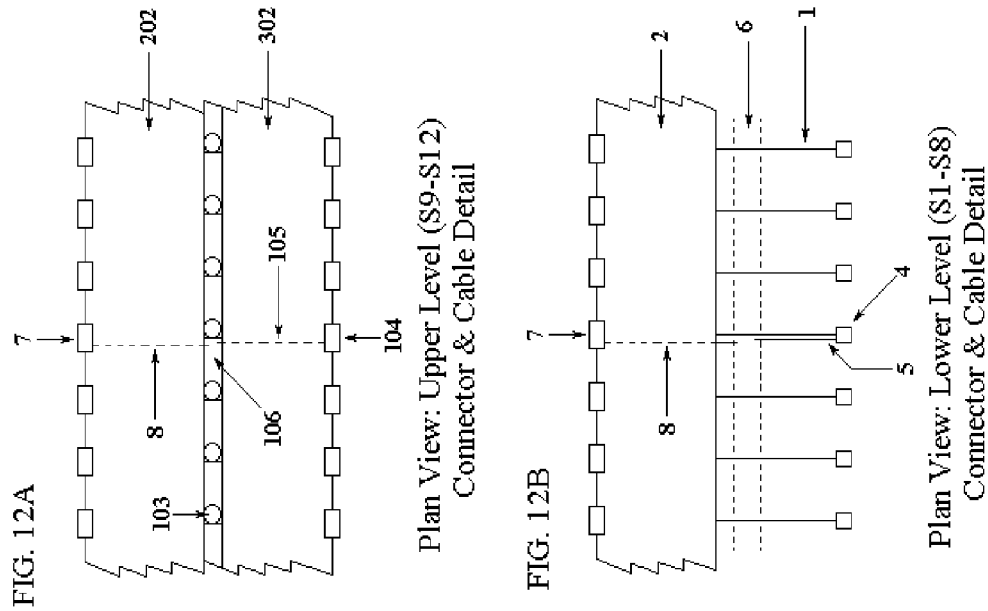
FIG. 12A Plan View: Upper Level (S9-S12) Connector & Cable Detail
FIG. 12B Plan View: Lower Level (S1-S8) Connector & Cable Detail
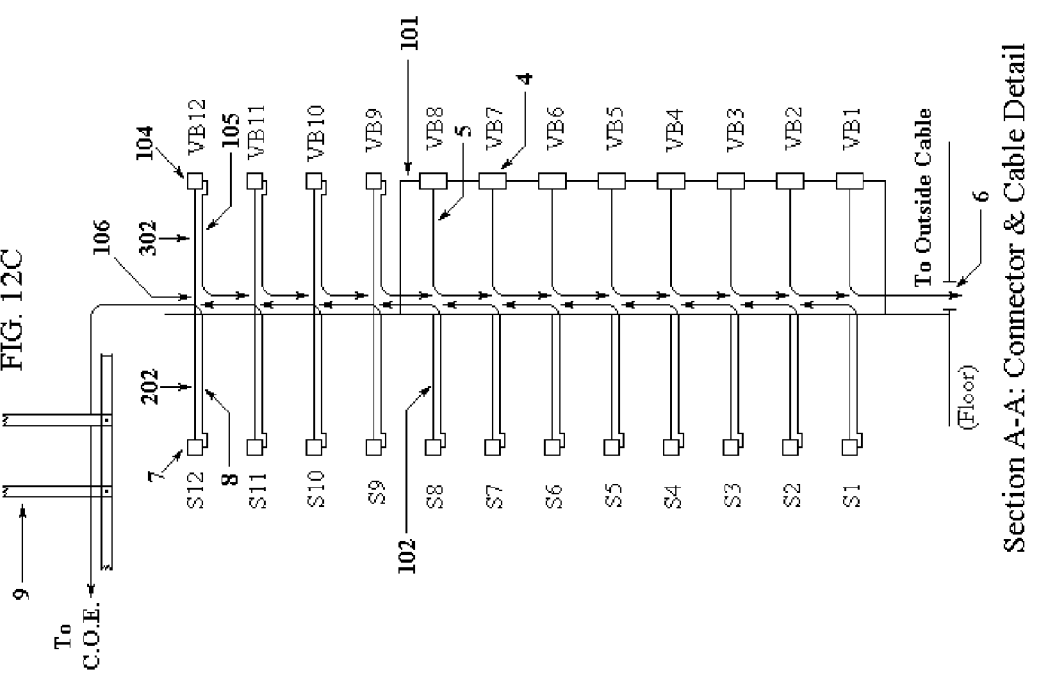
FIG. 12C Section A-A: Connector & Cable Detail

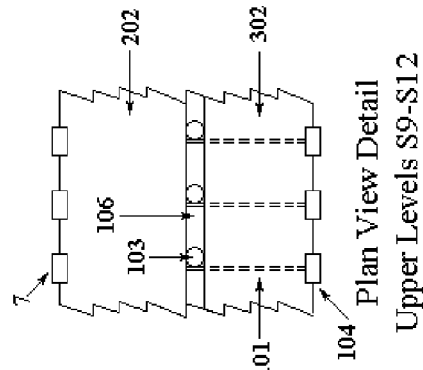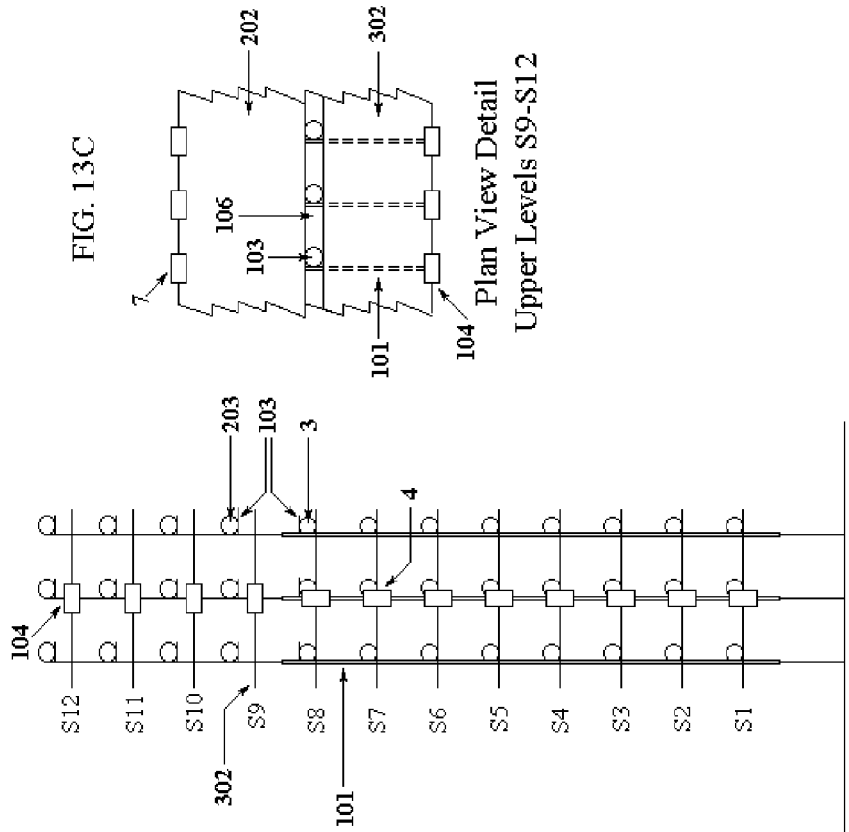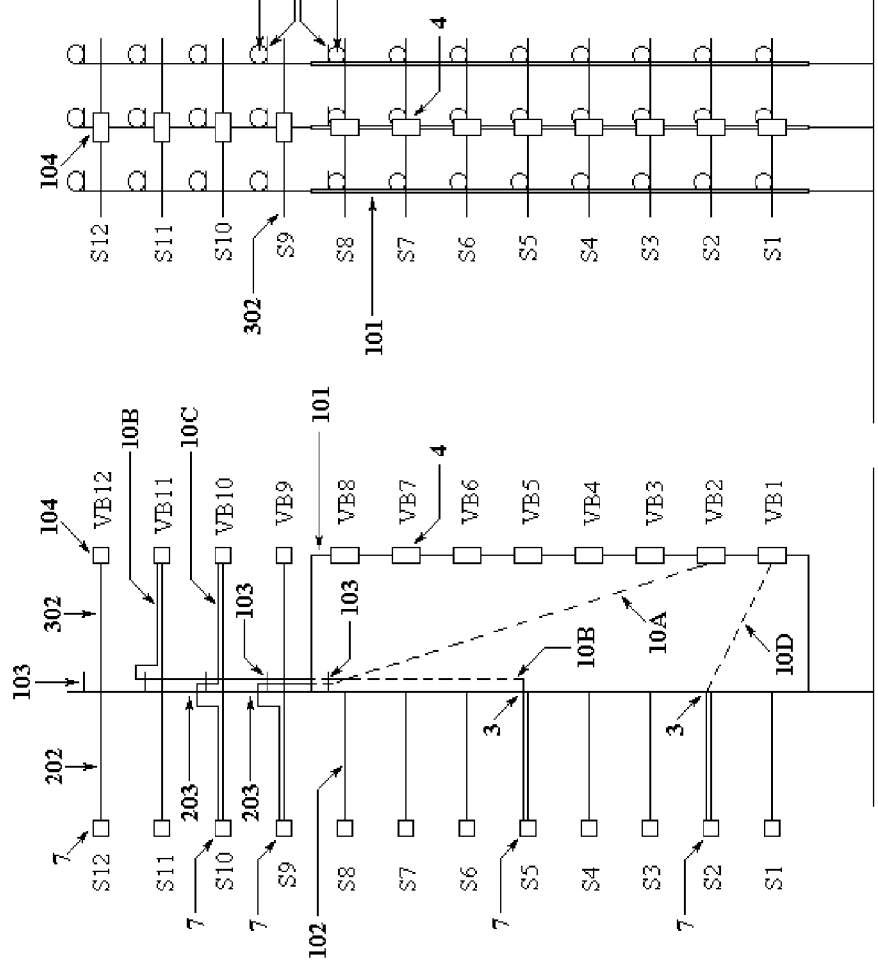

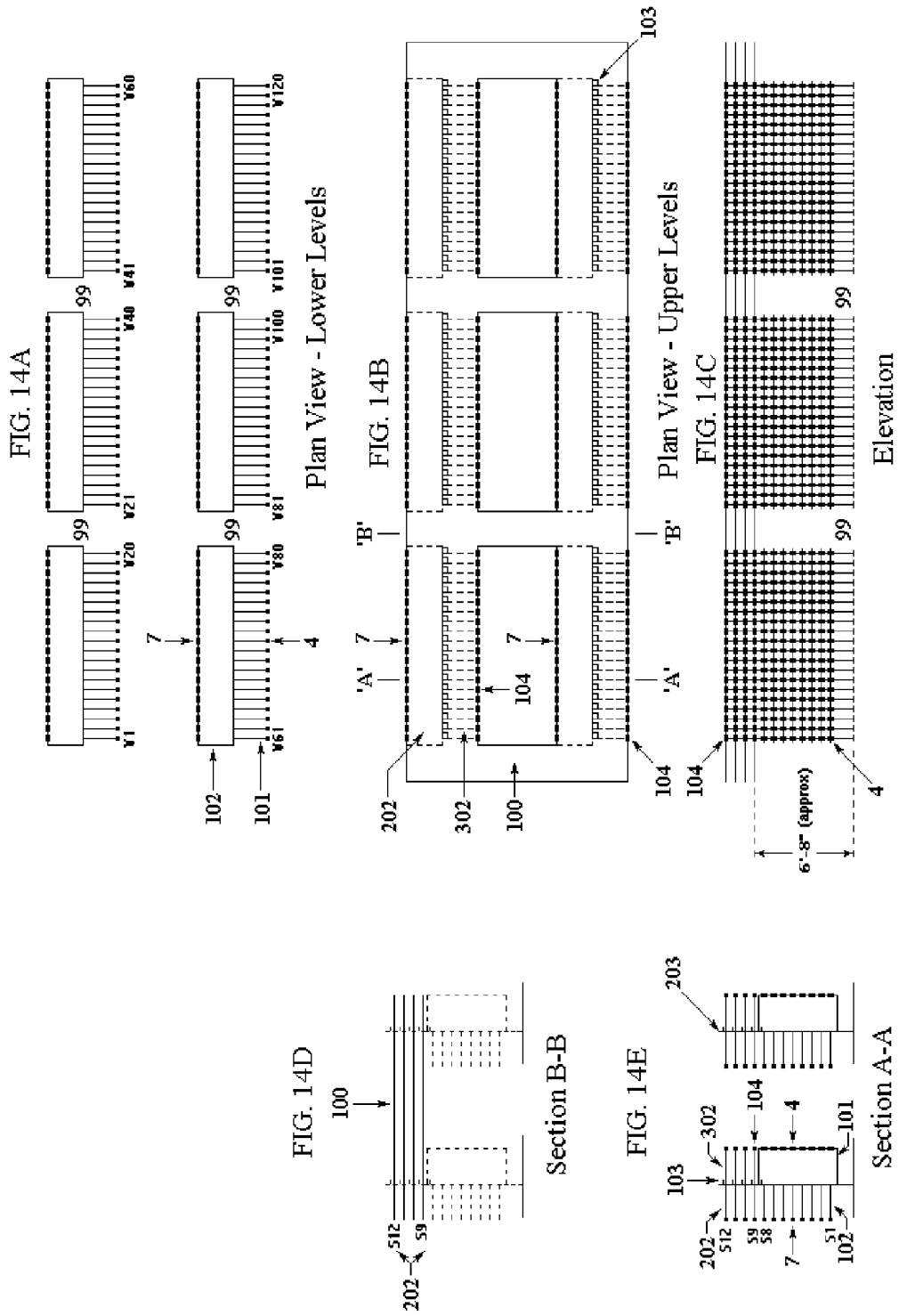

Plan View - Lower Levels

Plan View - Upper Levels

Elevation

Section B-B

Section A-A

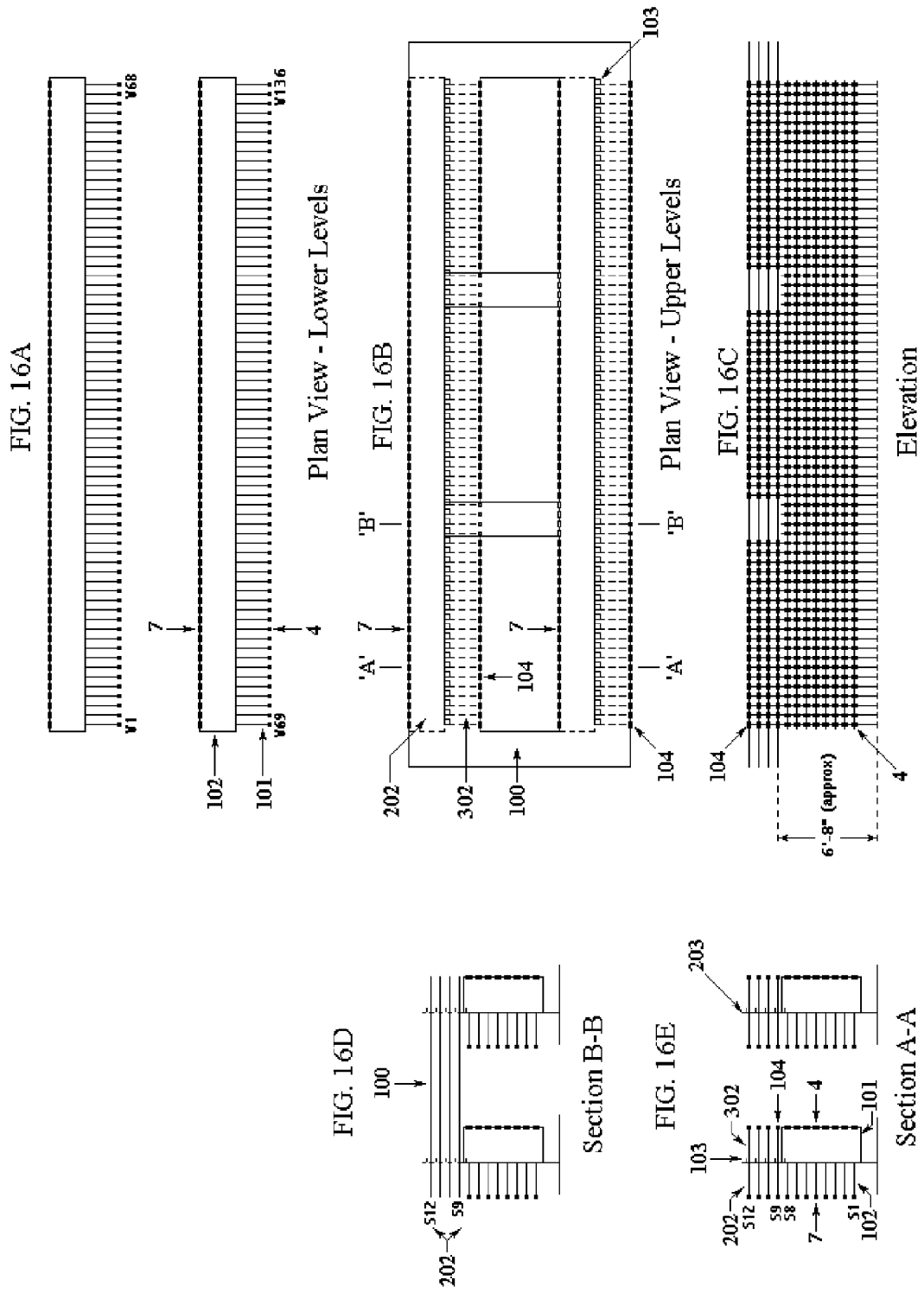

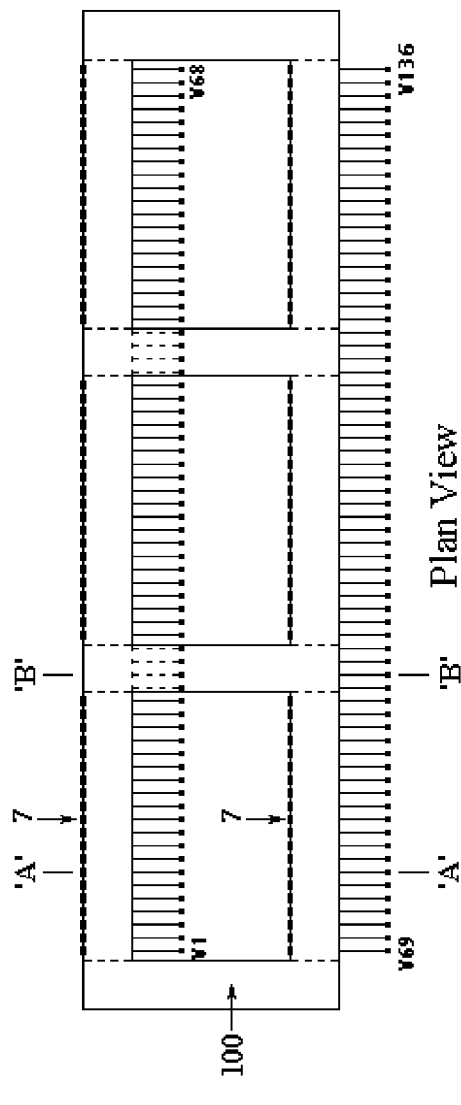
FIG. 17A Plan View
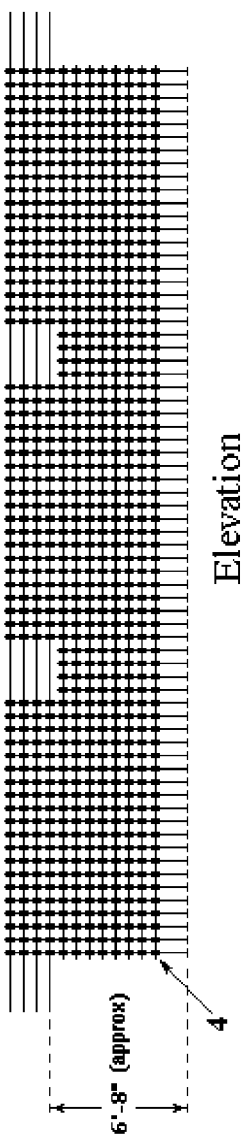
FIG. 17B Elevation
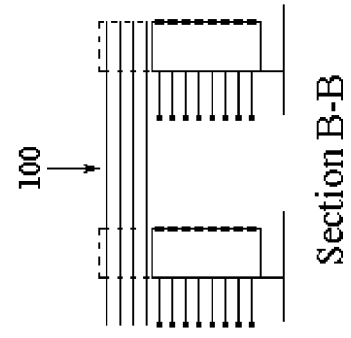
FIG. 17C Section B-B
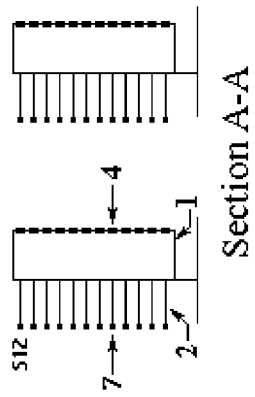
FIG. 17D Section A-A Plan View - Upper Levels
Possible Expansion to 180 Verticals Plan View - Upper Levels
Possible Expansion to 240 Verticals Plan View - Upper Levels
Possible Expansion to 200 Verticals Plan View - Upper Levels
Possible Expansion to 500 Verticals Alternating Shelf-to-Shelf, Vertical-to-Vertical Alignment

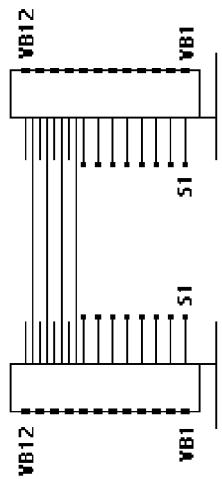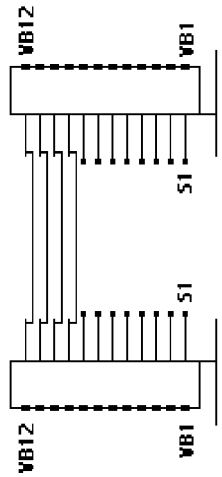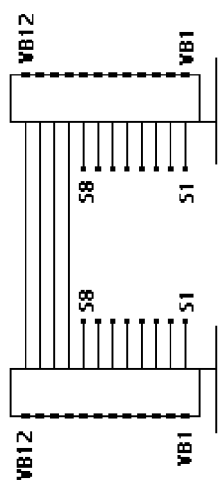
FIG. 23A — Direct Attachment to Shelf
FIG. 23B — Split Level Attachment to Shelf
FIG. 23C — Split Level Attachment to Vertical
Bridge Attachment Methods Using Shelf-to-Shelf Alignment

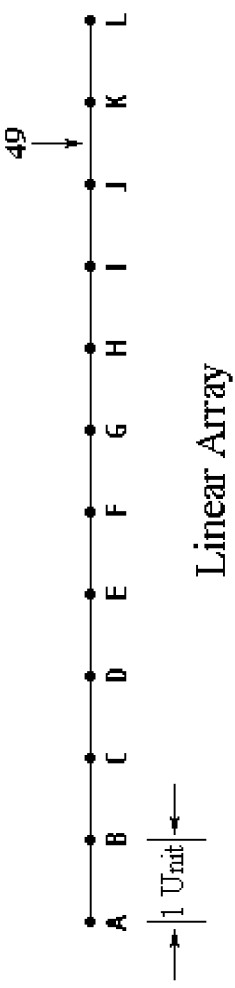
FIG. 24A  Linear Array
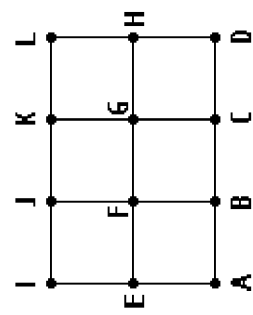
FIG. 24D  3x4 Array
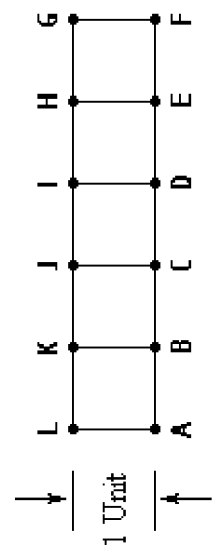
FIG. 24C  2x6 Array
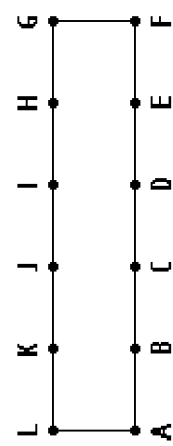
FIG. 24B  Ring Array A to G Simple Path #1

A to G Simple Path #2

Simple Path Density Contributions

A to G Random Path #1

A to G Random Path #2

A to G Random Path #3

A to G Random Path #4

A to G Random Path #5

A to G Random Path #6

Random Path Density Contributions

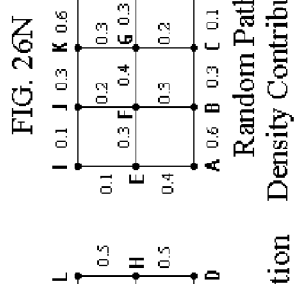
FIG. 26M Simple Path Density Contribution
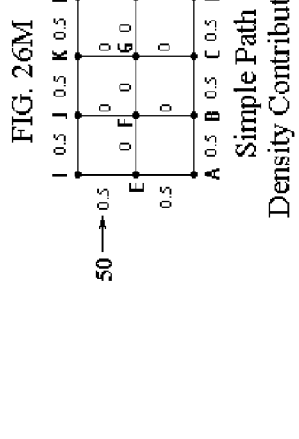
FIG. 26N Random Path Density Contribution
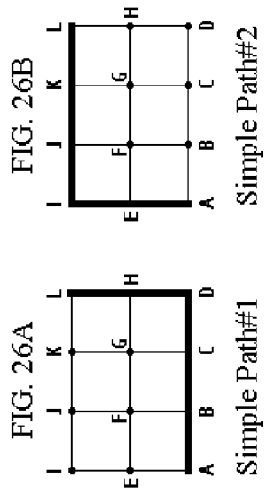
FIG. 26A Simple Path#1
FIG. 26B Simple Path#2
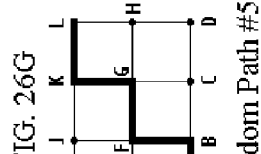
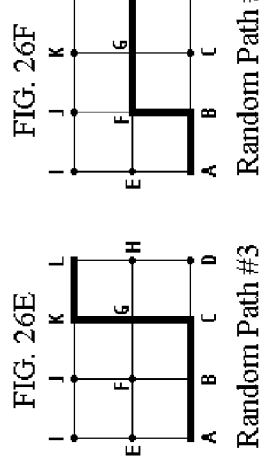
FIG. 26C Random Path #1
FIG. 26D Random Path #2
FIG. 26E Random Path #3
FIG. 26F Random Path #4
FIG. 26G Random Path #5
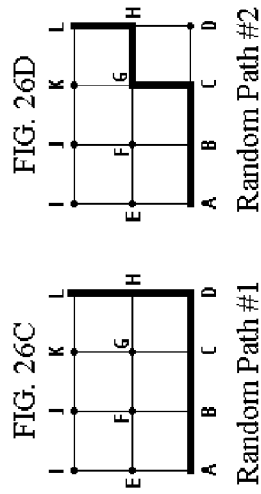
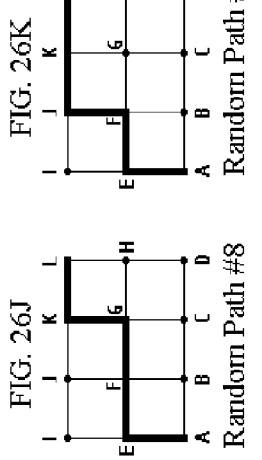
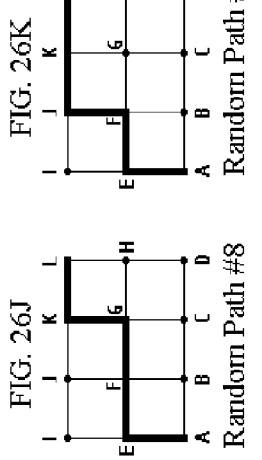
FIG. 26H Random Path #6
FIG. 26I Random Path #7
FIG. 26J Random Path #8
FIG. 26K Random Path #9
FIG. 26L Random Path #10
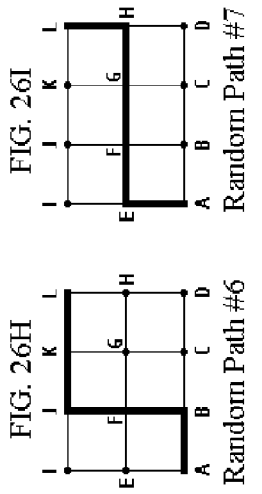

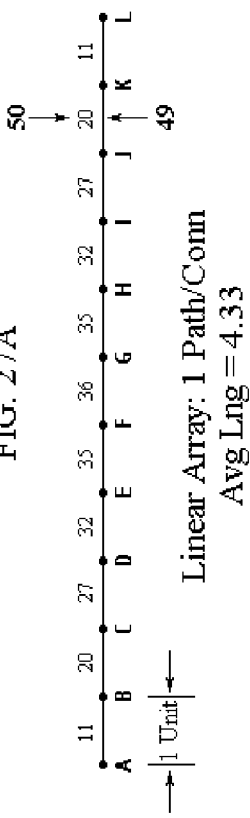
FIG. 27A
Linear Array: 1 Path/Conn
Avg Lng = 4.33
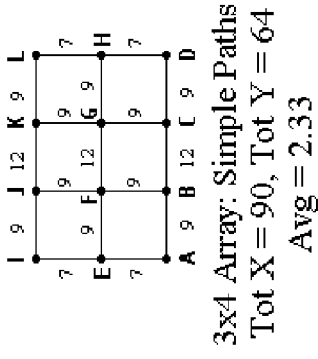
FIG. 27D(2)
3x4 Array: Simple Paths
Tot X = 90, Tot Y = 64
Avg = 2.33
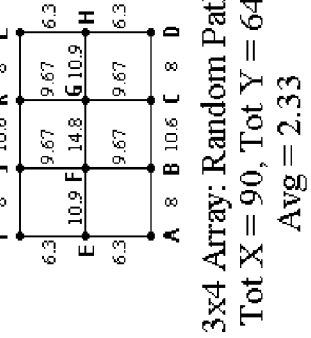
FIG. 27D(1)
3x4 Array: Random Paths
Tot X = 90, Tot Y = 64
Avg = 2.33
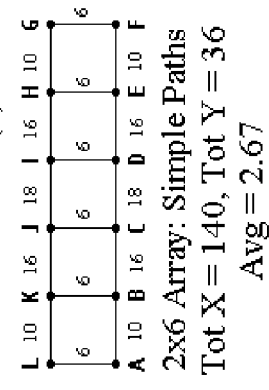
FIG. 27C(2)
2x6 Array: Simple Paths
Tot X = 140, Tot Y = 36
Avg = 2.67
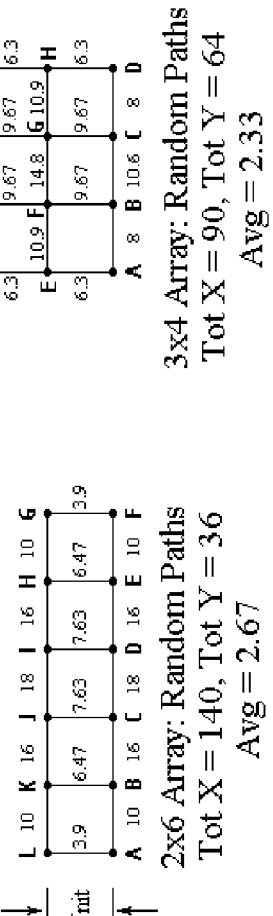
FIG. 27C(1)
2x6 Array: Random Paths
Tot X = 140, Tot Y = 36
Avg = 2.67
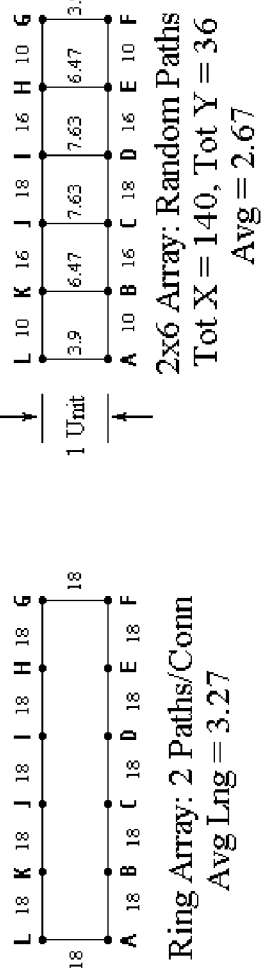
FIG. 27B
Ring Array: 2 Paths/Conn
Avg Lng = 3.27

Types of Connection Paths on a BP Array

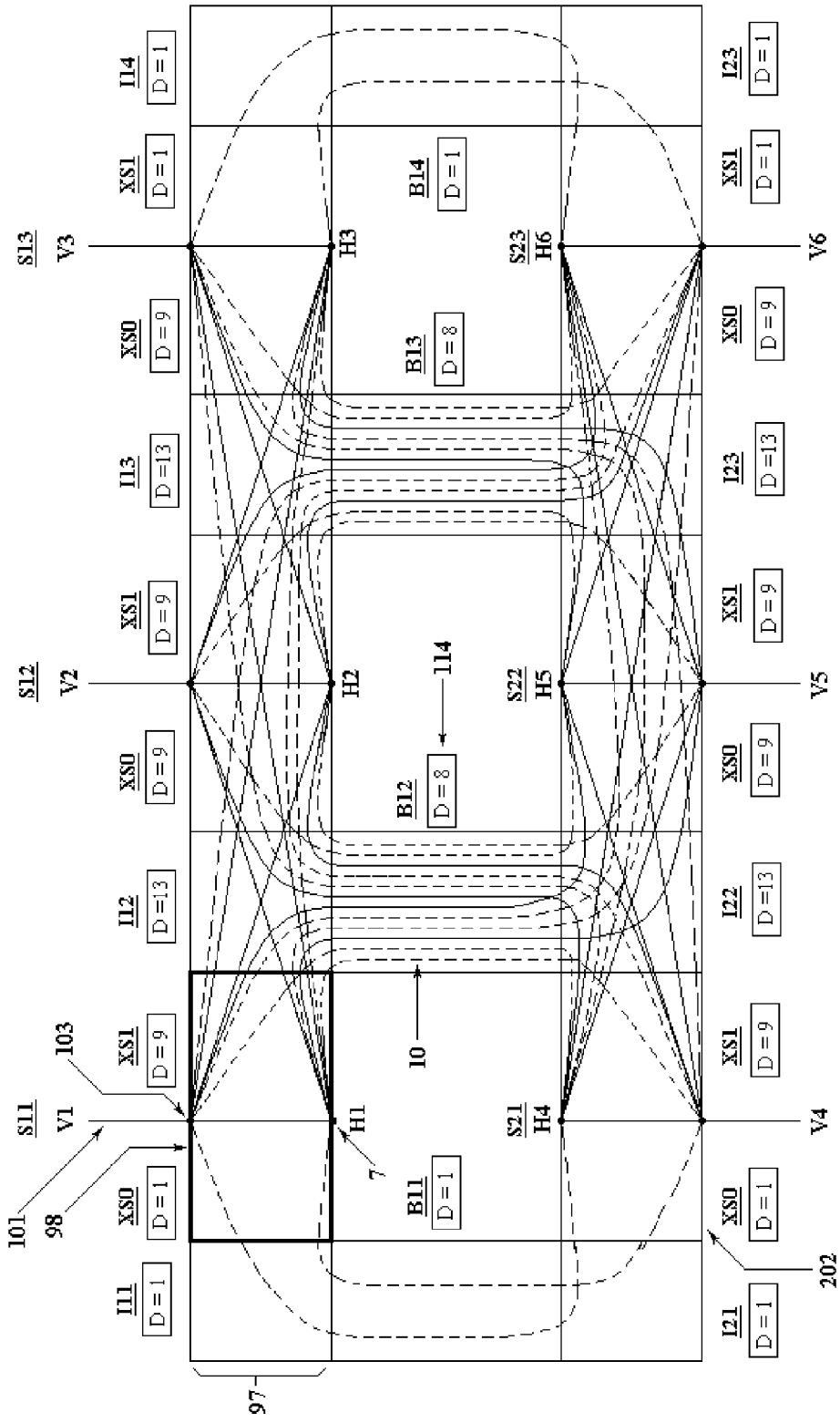

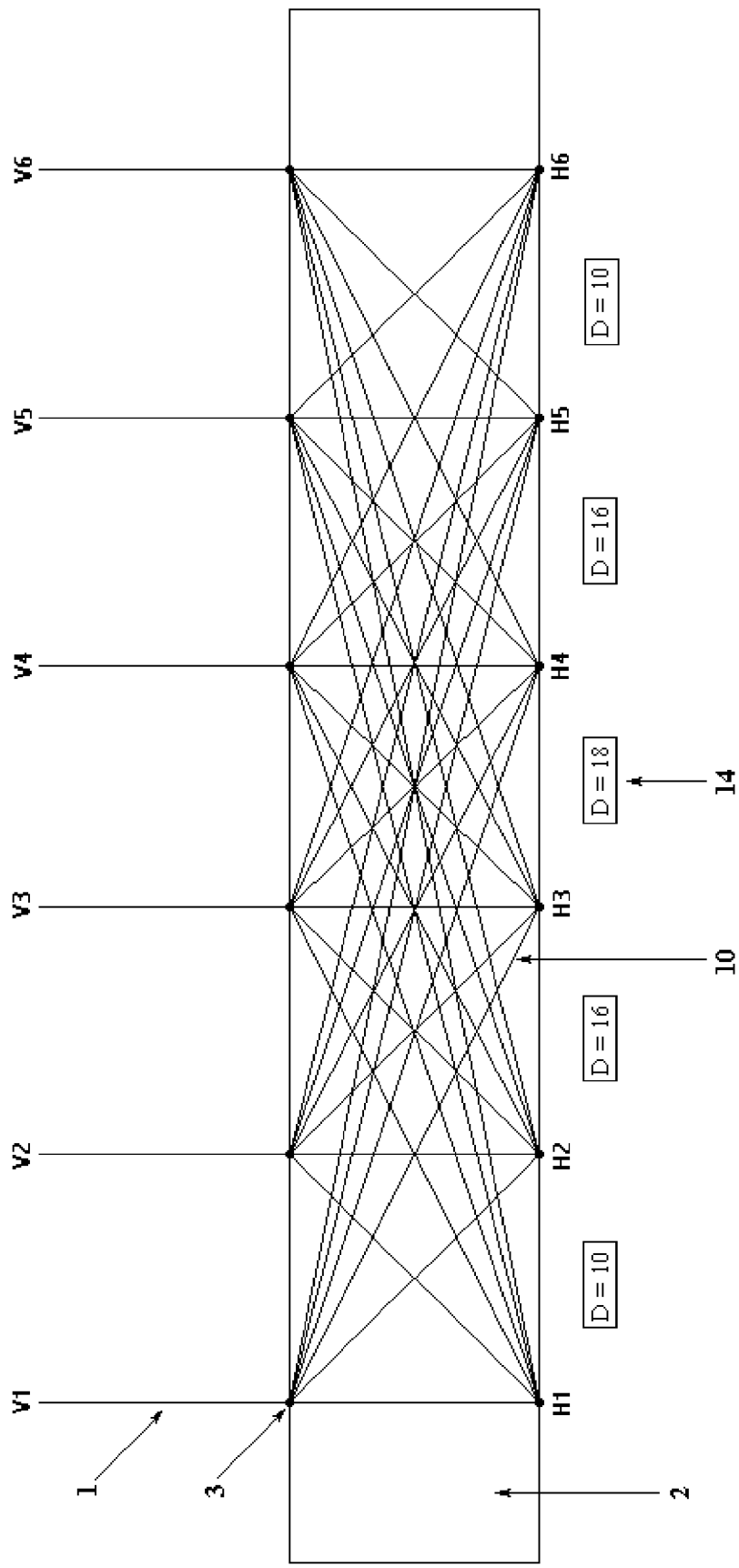

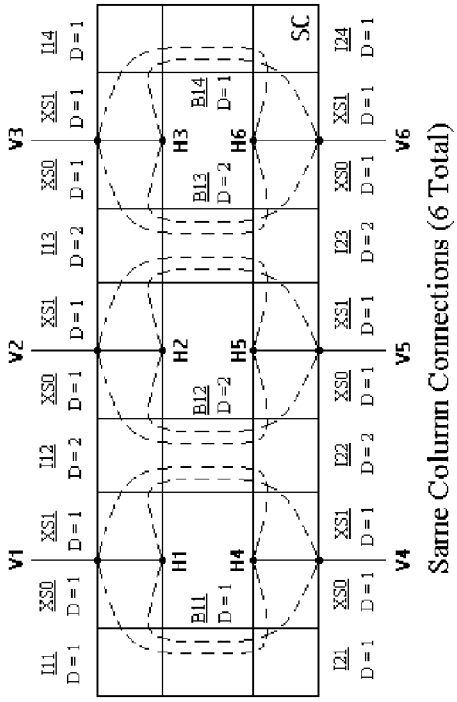
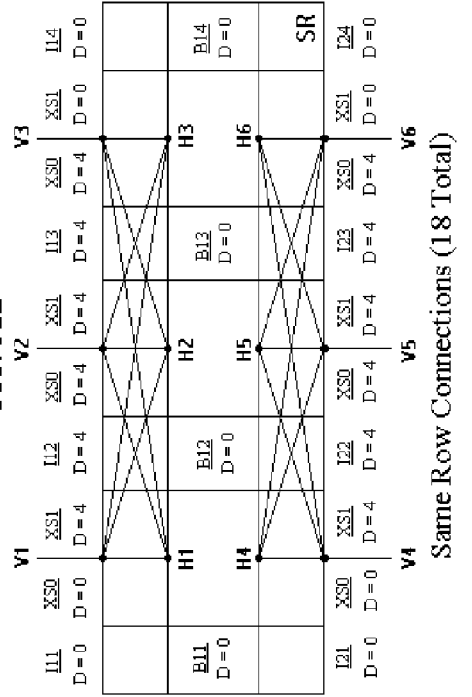
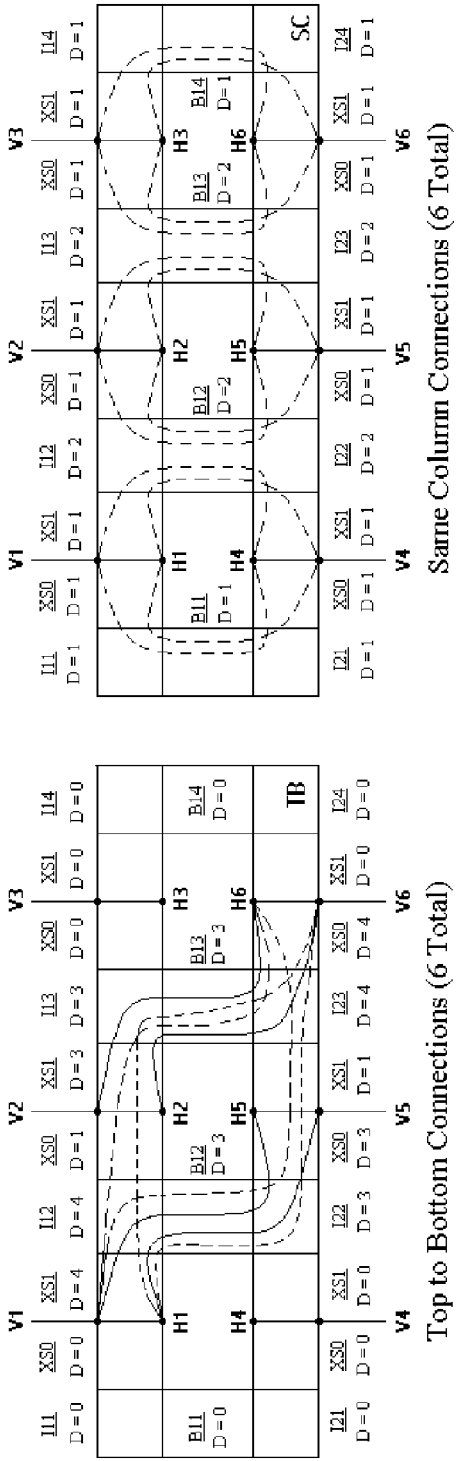
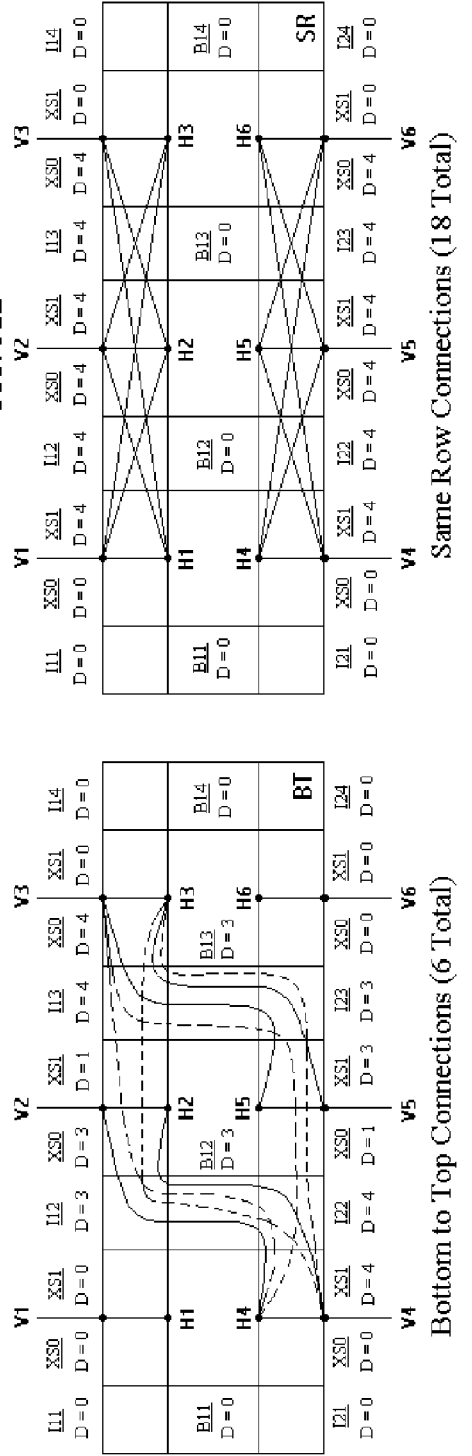

Upper Level Densities

Upper Level High Density Details

Lower Level Densities

Upper Level Densities

Upper Level High Density Details

Lower Level Densities

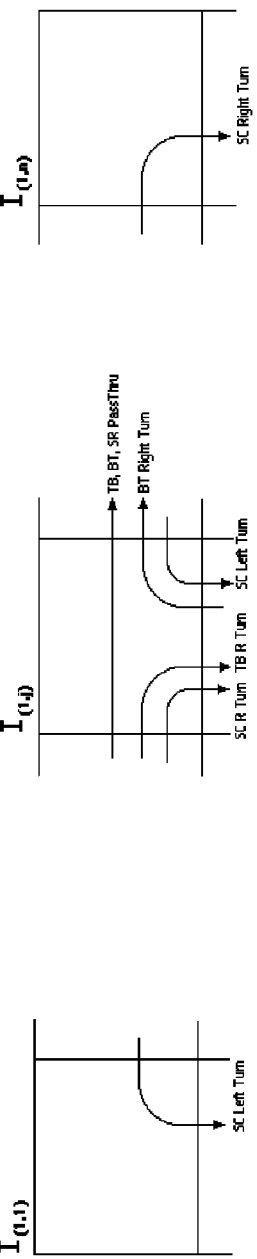
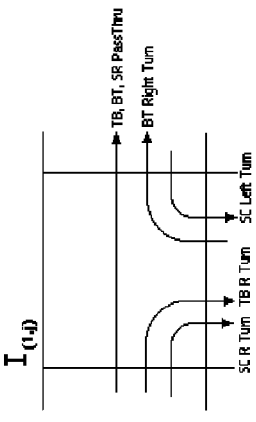
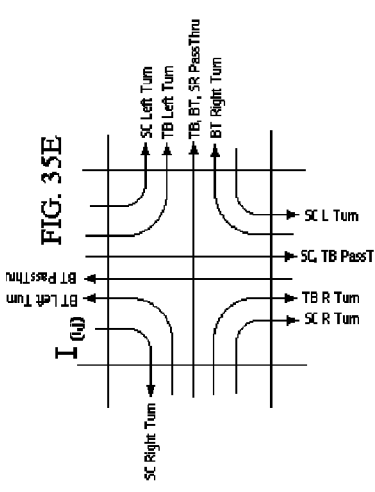
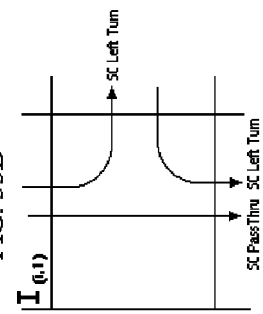
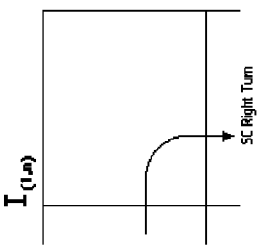
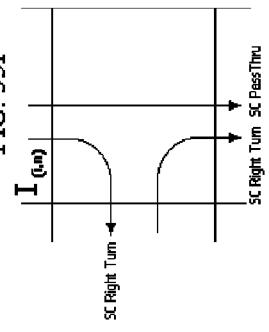
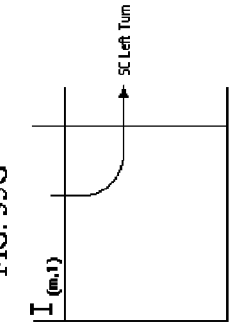
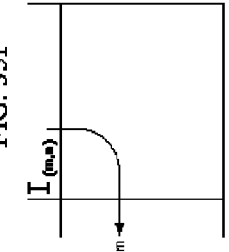
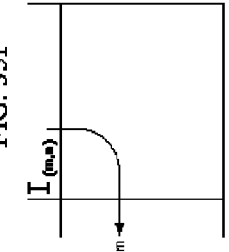
Types of Connections Inside Intersections

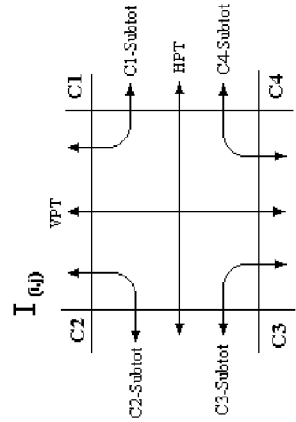

FIG. 36B

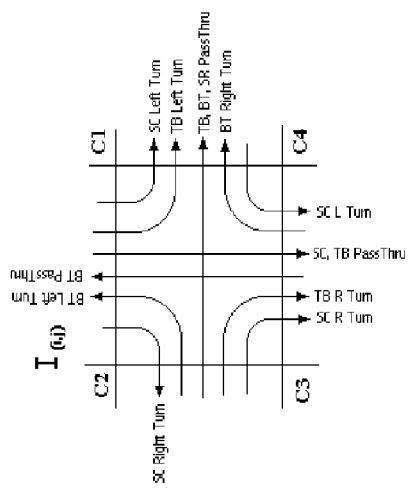

FIG. 36A

Densities Recorded for All Intersections

Corner1-SC-Left-Turn  
Corner1-TB-Left-Turn  ⎫ C1-Subtot
Corner2-SC-Right-Turn
Corner2-BT-Left-Turn  ⎫ C2-Subtot
Corner3-SC-Right-Turn
Corner3-TB-Right-Turn ⎫ C3-Subtot
Corner4-SC-Left-Turn
Corner4-BT-Right-Turn ⎫ C4-Subtot
Horizontal-PassThru-TB
Horizontal-PassThru-BT
Horizontal-PassThru-SR ⎫ HPT-Subtot
Vertical-PassThru-TB
Vertical-PassThru-BT
Vertical-PassThru-SC   ⎫ VPT-Subtot TB - Top to Bottom Path   BT - Bottom to Top Path   SC - Same Column Path   SR - Same Row Path FIG. 37 – Output Files for 2x3(1,1,1), E=6 User Request

| A | B | C | D | E | F | G | H | I | J | K | L | M | N | O | P |
|---|---|---|---|---|---|---|---|---|---|---|---|---|---|---|---|
| Section Density File: | | | | | | | | | | | | | | | |
| I11 | | | | 1 | | | | | | | | | | | |
| S11 | XS0 | 1 | | 1 | | | | | | | | | | | |
| S11 | | 1 | 10 | 9 | | | | | | | | | | | |
| I12 | | | | 13 | | | | | | | | | | | |
| S12 | XS0 | 1 | | 9 | | | | | | | | | | | |
| S12 | | 2 | 16 | 9 | | | | | | | | | | | |
| I13 | | | | 13 | | | | | | | | | | | |
| S13 | XS0 | 1 | | 9 | | | | | | | | | | | |
| S13 | | 3 | 18 | 1 | | | | | | | | | | | |
| I14 | | | | 1 | | | | | | | | | | | |
| I21 | | | | 1 | | | | | | | | | | | |
| S21 | XS0 | 1 | | 1 | | | | | | | | | | | |
| S21 | | 4 | 18 | 9 | | | | | | | | | | | |
| I22 | | | | 13 | | | | | | | | | | | |
| S22 | XS0 | 1 | | 9 | | | | | | | | | | | |
| S22 | | 5 | 10 | 9 | | | | | | | | | | | |
| I23 | | | | 13 | | | | | | | | | | | |
| S23 | XS0 | 1 | | 9 | | | | | | | | | | | |
| S23 | | 6 | 0 | 1 | | | | | | | | | | | |
| I24 | | | | 1 | | | | | | | | | | | |
| Bridge Density File: | | | | | | | | | | | | | | | |
| B11 | 1 | | | | | | | | | | | | | | |
| B12 | 8 | | | | | | | | | | | | | | |
| B13 | 8 | | | | | | | | | | | | | | |
| B14 | 1 | | | | | | | | | | | | | | |
| Intersection Density Detail File: | | | | | | | | | | | | | | | |
| I11 | 1 | 0 | 0 | 0 | 0 | 0 | 0 | 1 | 0 | 0 | 0 | 0 | 0 | 0 | 0 |
| I12 | 13 | 0 | 0 | 0 | 0 | 1 | 3 | 3 | 1 | 3 | 0 | 0 | 4 | 0 | 0 | 0 |
| I13 | 13 | 0 | 0 | 0 | 0 | 1 | 3 | 3 | 1 | 3 | 0 | 0 | 4 | 0 | 0 | 0 |
| I14 | 1 | 0 | 0 | 0 | 1 | 0 | 0 | 0 | 0 | 0 | 0 | 0 | 0 | 0 | 0 | 0 |
| I21 | 1 | 1 | 0 | 0 | 1 | 0 | 0 | 0 | 0 | 0 | 0 | 0 | 0 | 0 | 0 | 0 |
| I22 | 13 | 1 | 0 | 0 | 3 | 3 | 0 | 0 | 0 | 0 | 0 | 0 | 0 | 0 | 0 | 0 |
| I23 | 13 | 0 | 1 | 3 | 0 | 0 | 0 | 0 | 0 | 0 | 0 | 0 | 0 | 0 | 0 | 0 |
| I24 | 1 | 0 | 0 | 0 | 0 | 0 | 0 | 0 | 0 | 0 | 0 | 0 | 0 | 0 | 0 | 0 |
| Intersection Density Subtotal File: | | | | | | | | | | | | | | | |
| I11 | 0 | 0 | 0 | 0 | 1 | 0 | 0 | 1 | 0 | 0 | 0 | 0 | 0 | 0 | 0 |
| I12 | 0 | 0 | 4 | 4 | 5 | 0 | 13 | 0 | 0 | 0 | 0 | 0 | 0 | 0 | 0 |
| I13 | 0 | 0 | 4 | 4 | 5 | 0 | 13 | 0 | 0 | 0 | 0 | 0 | 0 | 0 | 0 |
| I14 | 1 | 4 | 1 | 0 | 0 | 0 | 1 | 0 | 0 | 0 | 0 | 0 | 0 | 0 | 0 |
| I21 | 4 | 4 | 0 | 0 | 5 | 0 | 13 | 0 | 0 | 0 | 0 | 0 | 0 | 0 | 0 |
| I22 | 4 | 4 | 0 | 0 | 5 | 0 | 13 | 0 | 0 | 0 | 0 | 0 | 0 | 0 | 0 |
| I23 | 4 | 1 | 0 | 0 | 5 | 0 | 13 | 0 | 0 | 0 | 0 | 0 | 0 | 0 | 0 |
| I24 | 0 | 0 | 0 | 0 | 0 | 0 | 1 | 0 | 0 | 0 | 0 | 0 | 0 | 0 | 0 |

FIG. 38 – File Outputs for 2x3(8,8,8), E=48 User Request

Section Density File - Row 1

| Sec | Sec Vert# | Abs Vert# | BP Den | Conv Den |
|---|---|---|---|---|
| I11 | XS0 | | | 64 |
| S11 | 1 | 1 | 128 | 94 |
| S11 | 2 | 2 | 192 | 184 |
| S11 | 3 | 3 | 256 | 270 |
| S11 | 4 | 4 | 320 | 352 |
| S11 | 5 | 5 | 384 | 430 |
| S11 | 6 | 6 | 448 | 504 |
| S11 | 7 | 7 | 512 | 574 |
| S11 | 8 | 8 | 576 | 640 |
| I12 | | | 832 | |
| S12 | XS0 | | 576 | |
| S12 | 1 | 9 | 576 | 702 |
| S12 | 2 | 10 | 576 | 760 |
| S12 | 3 | 11 | 576 | 814 |
| S12 | 4 | 12 | 576 | 864 |
| S12 | 5 | 13 | 576 | 910 |
| S12 | 6 | 14 | 576 | 952 |
| S12 | 7 | 15 | 576 | 990 |
| S12 | 8 | 16 | 576 | 1024 |
| I13 | | | 832 | |
| S13 | XS0 | | 576 | |
| S13 | 1 | 17 | 512 | 1054 |
| S13 | 2 | 18 | 448 | 1080 |
| S13 | 3 | 19 | 384 | 1102 |
| S13 | 4 | 20 | 320 | 1120 |
| S13 | 5 | 21 | 256 | 1134 |
| S13 | 6 | 22 | 192 | 1144 |
| S13 | 7 | 23 | 128 | 1150 |
| S13 | 8 | 24 | 64 | 1152 |
| I14 | | | 64 | |

Section Density File - Row 2

| Sec | Sec Vert# | Abs Vert# | BP Den | Conv Den |
|---|---|---|---|---|
| I21 | XS0 | | | 64 |
| S21 | 1 | 25 | 128 | 1150 |
| S21 | 2 | 26 | 192 | 1144 |
| S21 | 3 | 27 | 256 | 1134 |
| S21 | 4 | 28 | 320 | 1120 |
| S21 | 5 | 29 | 384 | 1102 |
| S21 | 6 | 30 | 448 | 1080 |
| S21 | 7 | 31 | 512 | 1054 |
| S21 | 8 | 32 | 576 | 1024 |
| I22 | | | 832 | |
| S22 | XS0 | | 576 | 990 |
| S22 | 1 | 33 | 576 | 990 |
| S22 | 2 | 34 | 576 | 952 |
| S22 | 3 | 35 | 576 | 910 |
| S22 | 4 | 36 | 576 | 864 |
| S22 | 5 | 37 | 576 | 814 |
| S22 | 6 | 38 | 576 | 760 |
| S22 | 7 | 39 | 576 | 702 |
| S22 | 8 | 40 | 576 | 640 |
| I23 | | | 832 | |
| S23 | XS0 | | 576 | |
| S23 | 1 | 41 | 512 | 574 |
| S23 | 2 | 42 | 448 | 504 |
| S23 | 3 | 43 | 384 | 430 |
| S23 | 4 | 44 | 320 | 352 |
| S23 | 5 | 45 | 256 | 270 |
| S23 | 6 | 46 | 192 | 184 |
| S23 | 7 | 47 | 128 | 94 |
| S23 | 8 | 48 | 64 | 0 |
| I24 | | | 64 | |

Bridge Density File

| Brg | Den |
|---|---|
| B11 | 64 |
| B12 | 512 |
| B13 | 512 |
| B14 | 64 |

Intersection Density (Subtotal) File

| Int | C1 | C2 | C3 | C4 | HPT | VPT | Tot |
|---|---|---|---|---|---|---|---|
| I11 | 0 | 0 | 0 | 0 | 0 | 0 | 64 |
| I12 | 0 | 0 | 256 | 256 | 320 | 0 | 832 |
| I13 | 0 | 0 | 256 | 256 | 320 | 0 | 832 |
| I14 | 0 | 0 | 64 | 0 | 0 | 0 | 64 |
| I21 | 64 | 0 | 0 | 0 | 0 | 0 | 64 |
| I22 | 256 | 256 | 0 | 0 | 320 | 0 | 832 |
| I23 | 256 | 256 | 0 | 0 | 320 | 0 | 832 |
| I24 | 0 | 64 | 0 | 0 | 0 | 0 | 64 |

Intersection Details

Mapping of Densities for 2×3(8,8,8), E=48 User Request

Density Map for Equivalent Conventional Linear DF

Simulator Output: Density vs Absolute Vertical#
Raw Data: 2x3(8,8,8), E=48 User Request Density vs Absolute Vertical#: 2x3(8,8,8),E=48 User Request Adjusted for Walkways and Upper Shelf Conversion FIG. 42A — Mapping of Adjusted Densities for Upper Levels - 2x3(8,8,8) User Request FIG. 42B — Intersection Details FIG. 42C — Densities for All Lower Level Sections Density vs Absolute Vertical#
5x5(20,20,20,20),E=100 User Request
Adjusted for Walkways and Upper Shelf Conversion

FIG. 44

| | Col 1 | | Col 2 | | Col 3 | | Col 4 | | Col 5 | | Col 6 | | Col 7 |
|---|---|---|---|---|---|---|---|---|---|---|---|---|---|
| Row 1 | I11 | S11 | I12 | S12 | I13 | S13 | I14 | S14 | I15 | S15 | I16 | S16 | I17 |
| | B11 | | B12 | | B13 | | B14 | | B15 | | B16 | | B17 |
| Row 2 | I21 | S21 | I22 | S22 | I23 | S23 | I24 | S24 | I25 | S25 | I26 | S26 | I27 |
| | B21 | | B22 | | B23 | | B24 | | B25 | | B26 | | B27 |
| Row 3 | I31 | S31 | I32 | S32 | I33 | S33 | I34 | S34 | I35 | S35 | I36 | S36 | I37 |
| | B31 | | B32 | | B33 | | B34 | | B35 | | B36 | | B37 |
| Row 4 | I41 | S41 | I42 | S42 | I43 | S43 | I44 | S44 | I45 | S45 | I46 | S46 | I47 |
| | B41 | | B42 | | B43 | | B44 | | B45 | | B46 | | B47 |
| Row 5 | I51 | S51 | I52 | S52 | I53 | S53 | I54 | S54 | I55 | S55 | I56 | S56 | I57 |
| | B51 | | B52 | | B53 | | B54 | | B55 | | B56 | | B57 |
| Row 6 | I61 | S61 | I62 | S62 | I63 | S63 | I64 | S64 | I65 | S65 | I66 | S66 | I67 |

Labels: 98, 199, 100, 198, 299, 200

Simulator Max Row and Column Boundaries

FIG. 46

Working-Storage Section.
01  Path-Num   Pic 9(6)  Value 0.
01  Path-Num-r redefines Path-Num.
 05  Digit-1  Pic 9.
 05  Digit-2  Pic 9.
 05  Digit-3  Pic 9.
 05  Digit-4  Pic 9.
 05  Digit-5  Pic 9.
 05  Digit-6  Pic 9.

Procedure Division.
0-0-IRIS-3-Mainline.

Set TB-Path-IX to 1.
   Set BT-Path-IX to 1.
   Perform 1-0-Gen-Diag-Paths thru 1-0-Gen-Diag-Path-Exit
   varying Path-Num from 0 by 1
     until Path-Num > 555555.

0-0-IRIS-3-Goback.
   Goback.

1-0-Gen-Diag-Paths.
   If digit-1 > 5 or digit-2 > 5 or digit-3 > 5 or
     digit-4 > 5 or digit-5 > 5 or digit-6 > 5
     go to 1-0-Gen-Diag-Path-Exit.
   If digit-1 = digit-2 and digit-2 = digit-3 and
     digit-3 = digit-4 and digit-4 = digit-5 and
     digit-5 = digit-6
     go to 1-0-Gen-Diag-Path-Exit.
   If Digit-1 not > Digit-2 and Digit-2 not > Digit-3 and
     Digit-3 not > Digit-4 and Digit-4 not > Digit-5 and
     Digit-5 not > Digit-6
     Add 1 to Top-Bot-Path-Ctr
     Perform 1-100-Create-Top-Bot-Path thru 1-100-Top-Bot-Exit
     Set TB-Path-IX up by 1.
   If Digit-1 not < Digit-2 and Digit-2 not < Digit-3 and
     Digit-3 not < Digit-4 and Digit-4 not < Digit-5 and
     Digit-5 not < Digit-6
     Add 1 to Bot-Top-Path-Ctr
     Perform 1-200-Create-Bot-Top-Path thru 1-200-Bot-Top-Exit
     Set BT-Path-IX up by 1.
1-0-Gen-Diag-Path-Exit. Exit.

Code for Generating Diagonal Paths

METHOD FOR DESIGNING DISTRIBUTING FRAME

This application is a divisional of application Ser. No. 10/999,650, filed on Nov. 29, 2004, now U.S. Pat. No. 7,304,865 which claims priority under 35 U.S.C. §119(e) from provisional patent application Ser. No. 60/525,151 filed on Nov. 28, 2003, both of which applications are incorporated herein by reference in their entireties.

BACKGROUND OF THE INVENTION

1. Field of the Invention

The present invention relates to apparatus for making physical interconnections of, for example, wire, coax, fiber, etc. in places such as telephone communication systems. More particularly, it relates to distributing frames used in telephone communication systems for efficiently providing electrical connections between various telephone circuits, and to a method for determining connection density in such apparatus, so as to efficiently aid in their design.

2. Background Art

It is believed that the earliest patent for a telephone distributing apparatus is U.S. Pat. No. 816,847, issued to Frank B. Cook, in 1906. It was followed by U.S. Pat. No. 822,590, issued to Franz J. Dommerque, shortly thereafter, also in 1906.

Conventional Distributing Frames (DF's) used in telephone systems are essentially a crosshatch of vertical and horizontal planes, so that outside cable facilities terminated on the vertical side may be interconnected to central office equipment facilities, terminated on the horizontal side. Interconnection of outside terminals and inside terminals is accomplished by means of a connection known as a cross-connection, or jumper. This usually is a two-wire cord, but may also be optic fiber, coax, or any material suitable for conducting telecommunications transmissions. Vertical planes provide a means for cross-connections to move vertically, and horizontal planes, or shelves, provide a means for cross-connections to move horizontally.

Such distributing frames have known limitations. A better approach is outlined in U.S. Pat. Nos. 5,459,644 and 5,704,115, issued to the present inventor, the entire disclosures of which are hereby incorporated by reference. These patents disclose a readily expandable structure. However, because of the large base of more conventional installations, the structures disclosed in these patents are often not utilized. There is a long felt need for a technique to expand conventional distributing frame structure, and for structures along more conventional lines that can be expanded to provide for an ever increasing number of required interconnections.

FIGS. 1A, 1B and 1C illustrate the framework of a common conventional two-sided linear distributing frame design, consisting of fifty verticals 1 (V1-V50) and 12 shelves 2 (S1-S12). A common standard for shelf and vertical spacing is 8 inches (20.3 cm), and the width of shelves and verticals is about 2 feet (70 cm). Rings 3 (R1-R12) are located at the intersections of shelves and verticals to facilitate and control the passage of cross-connections from vertical to horizontal planes. Conventionally, DF's expanded along the line of the DF in the horizontal direction, as shown by the Growth Arrow G in FIG. 1A. This results in increasing the number of verticals and the length of the shelves, while the number of shelves and height of verticals remain constant.

In FIGS. 2A and 2B, connector blocks 4 (VB1-VB12) are mounted on the outside edge of the vertical 1 (V1). Attached to the connector 4 (VB1) is a connector tail 5, which travels on one face (called the cable face—shown as the back face in FIG. 2A) of the vertical 1, through a slot 6, and down into the cable vault or subfloor splicing trap (not shown), where it is spliced into the outside network. A conductor path exists from the connector tail 5, through the block 4, to terminals projecting from the block 4. Presently used 310 type connectors have a termination capacity of 100 pairs, and twelve are typically mounted on a vertical 1, making the total termination capacity of the vertical 1 1,200 pairs. On the horizontal side of the frame, central office equipment terminal blocks 7 (HB1-HB7) are mounted on the edge of the shelf 2. The terminals on this block likewise project through the block, where they are connected to a central office equipment cable 8. This cable travels on the lower face of the shelf 2, and up the cable face of the vertical 1, to an overhead cable rack 9, leading to the central office equipment (C.O.E—switch or other equipment. The termination capacity of the equipment terminal blocks on the horizontal side is approximately the same per linear foot as on the vertical side. On a working DF, the vast majority of verticals 1 are equipped with connector blocks 4 on the vertical side that are connected to the outside cable network. Similarly, on the horizontal side of a working DF, and the vast majority of shelves 2 are equipped with terminal blocks 7 that are connected to equipment cable, leading to the switch or other central office equipment.

FIGS. 3A, 3B and 3C illustrate a DF that has expanded to 100 verticals 1 and is fully equipped with both vertical connector blocks 4 and horizontal terminal blocks 7. A single cross-connection 10 runs from vertical block VB7 on vertical V1, along the front face (as shown in FIG. 3C), called the cross-connect face, of the vertical plane of the vertical V1, through the ring 3, onto shelf S12, and across shelf S12 to horizontal equipment block HB5. The path that has been taken for this connection is defined as a 'correct' path: i.e., starting at the VB on the vertical, the cross-connection travels on the cross-connect face to the ring at the shelf level of the HB, through the ring at that level, onto the shelf and continues on that shelf to the HB where it terminates. This connection could have been run as follows: VB7 on V1→R4 on V1→along S4 (because its level is more convenient for installation)→R4 on V5→up the cross-connect face of V5→R12 on V5→across S12 to HB5. Incorrect routing of cross-connections in this manner causes an overload of cross-connections on the middle level shelves and an underutilization of the lower and upper shelves.

A single short cross-connection is shown in FIGS. 3A, 3B and 3B to illustrate the complete path using correct routing that a single connection may take. It is obvious, since the vertical height never increases due to DF expansion, that the vertical portion of any cross-connection is always limited to the height of the vertical. However, the horizontal portion of any cross-connection is limited only by the length of the shelf, which is initially much greater than the height, and the potential for much longer connections increases as the shelves grow longer due to DF expansion.

Longer connections cause larger piles of connections to occur on the shelves of a DF. Historically, much effort was expended to limit the horizontal length of cross-connections on conventional linear DF's. However, as a DF expands and frame activity (connects and disconnects) increases, random intermingling becomes difficult to control. This causes longer connections (on the average) to occur, thus causing bigger piles of connections. Misrouting of new connections and non-removal of dead connections only compound the problem.

To illustrate the effects that multiple connections have on connection densities on a DF, we must first define the places where cross-connection densities will be measured. The area between adjacent shelves on the cross-connect face of a vertical is defined as a vertical cross-section, and the area between adjacent verticals on the upper face of a shelf is defined as a horizontal cross-section. Vertical cross-sections take the number of the shelf of the lower shelf boundary; horizontal cross-section numbers take the number of the vertical of the lower vertical boundary. FIGS. 4A and 4B illustrates a typical vertical 1 and a portion of a typical shelf 2. Vertical cross-section numbers 11 are shown on the vertical 1 in FIG. 4A, and horizontal cross-section numbers 12 have been shown on the shelf 2 in FIG. 4B.

FIGS. 5A and 5B illustrates the effects of a small number of cross-connections on the densities in the cross-sections 11 on a vertical plane 1 and the cross-sections 12 of a horizontal plane 2. In FIG. 5A, 5 cross-connections 10 emanate from 4 vertical blocks 4, and travel across the cross-connect face of the vertical 1, and arrive at 3 rings 3, where they disperse onto their respective shelves 2. The vertical densities caused by these connections are shown as the count 13 of the cross-connections passing through each vertical cross-section 11. Note that the direct connection, VB7 to R7, does not contribute to the vertical density count 13 of any vertical cross-section 11, since it does not travel through any vertical cross-section 11. In FIG. 5B, 5 cross-connections (not the same 5 cross-connections as in FIG. 5A) enter the shelf 2, and disperse to the various HB's 7 on the edge of the shelf 2. Horizontal densities caused by these connections are shown as the count 14 of the cross-connections passing through each horizontal cross-section 10.

Cross-connection lengths can be accurately measured by counting the number of cross-sections (11 & 12) traversed by a cross-connection and neglecting the widths of the vertical and horizontal planes (1 & 2). Thus, a direct cross-connection, such as VB7 to R7 in FIG. 5A, has zero length, since it does not traverse any cross-sections. Average cross-connection length can then be calculated by summing the densities in all the cross-sections, and dividing by the total number of connections. The average vertical component can be calculated by adding the vertical densities and dividing by the number of connections, and the average horizontal component can be calculated by adding the horizontal densities and dividing by the number of connections. For the cross-connections shown in FIG. 5A, Average Vertical Length=(0+0+0+1+2+2+3+2+2+2+1)/5=15/5=3

For the cross-connections shown in FIG. 5B,

Average Horizontal Length=(2+4+4+2+1+1)/5=14/5=2.8

FIG. 6 illustrates the final state of a vertical 1 when the shelf 2 destination of each cross-connection was perfectly random. At maximum capacity, each connector 4 would have 100 cross-connections 10 emanating from it. Assuming they were evenly dispersed, each ring 3 would have 100 cross-connections 10 passing through them, and onto the shelves 2 (S1-S12). If the dispersal were perfectly random, the number of cross-connections between each VB and each ring 3 would be 100/12=8.33. The resulting densities 13 in each of the vertical cross-sections 11 are shown. For the perfect random dispersal shown, these densities may be calculated using the following relationship:

$$D_v = 2k_v s(S-s),$$

where
$k_v$=Vertical Connection Constant=8.33
s=Vertical Cross-section#=Lower Shelf#
S=Total Number of Shelves=12

Note that the maximum density occurs at the midpoint, and that its value is one half of the total number of connections present on the vertical (1200/2). The average vertical connection length for FIG. 6 may also be calculated by summing the densities and dividing by the total number of connections on the vertical:

$$\begin{aligned}\text{Average Length} &= (183+333+450+533+583+600+583+450+333+183)/\\ &\quad 1200\\ &= 4764/1200\\ &= 3.97\end{aligned}$$

Average length may also be calculated using the following formula:

$$\begin{aligned}\text{Average Verticle Length} &= (S^2-1)/3S\\ &= (12^2-1)/3\times 12\\ &= 3.97\end{aligned}$$

For S>>1, the above relationship can be simplified to S/3, or ⅓ the Vertical Height.

The justification for the assumption of perfect randomness in the vertical direction is based on the following:
1. Since the vertical distance is very small, there is no need to worry about it
2. Therefore, no attempts were made to control vertical randomness
3. Direct observation—all verticals on a DF exhibit the pattern of FIG. 6

On the horizontal side of a DF, patterns cannot be distinguished due to the numbers of cross-connections present. However, relative pile sizes of cross-connections can be compared. Invariably, the largest pile of connections occurs at the midpoint, and is the starting point for congestion problems, should they occur. Piles of connections at the ends are sparse by comparison.

A fully connected DF at maximum vertical randomness would be one in which all the verticals are completely connected at maximum randomness, as shown in FIG. 6. In this case, 100 Cross-connections would emerge from every ring on every shelf of the DF. If the dispersal from ring to destination HB (on every shelf) is also completely random, then the vertical relationships for density and length can be adapted for use with horizontal side variables. Density and length relationships at maximum horizontal randomness are as follows:

$$D_H = 2k_H v(V-v),$$

where
$k_H$=Horizontal Connection Constant=100/V
v=Horizontal Cross-section#=Lower Vertical#
V=Total Number of Verticals Average Horizontal Length=$(V^2-1)/3V=V/3$ for V>>1

However, a critical distinction between horizontal and vertical relationships exists. The Vertical Connection Constant would change only when the concentration of terminals on the verticals changed, which, in turn would cause different numbers of cross-connections to emerge from each ring, thus changing the Horizontal Connection Constant. In contrast, the Horizontal Connection Constant changes for different size DF's, or as a single DF expands, because the number of destination HB's varies with each size. For example, if there are fifty verticals, then the number of cross-connections between each ring and each HB would be 100/50=2, if the DF has 100 verticals, the number would be 100/100=1, etc. Although the numbers of connections between ring and HB are decreasing, the lengths that the connections are traveling on the shelf are increasing, causing densities to increase significantly. This can be termed the Linear Expansion Problem.

FIGS. 7A and 7B and FIGS. 8A and 8B illustrate a typical shelf 2 undergoing physical expansion. The initial shelf 2 starts at fifty verticals in FIG. 7A, and expands to 100 verticals 1, in FIG. 7B. FIGS. 8A and 8B illustrate, respectively, expansions to 200 and 300 verticals 1. Each shelf 2 in the two figures has 100 cross-connections randomly dispersing from each ring 3. Thus, the 50V shelf contains 5,000 connections, the 100V shelf contains 10,000 connections, the 200V shelf 20,000 connections, and the 300V shelf 30,000 connections. Since it is impossible to draw that number of connections, only the densities 14 for selected cross-sections 12 are represented. Note that the densities 14 are low and stable (196-199) at the ends, but that half of the total connections on each shelf are present at the midpoint of the shelf: 2,500 at V25 on the 50V shelf, 5,000 at V50 on the 100V shelf, 10,000 at V100 on the 200V shelf, and 15,000 at V150 on the 300V shelf.

FIG. 9 is a graph of cross-connection densities for all cross-sections of shelves of various lengths. Curve 15 represents the density distribution for a 100V shelf; curve 16 for a 200V shelf, curve 17 for a 300V shelf, curve 18 for a 400V shelf, and curve 19 for a 500V shelf. The series of 5,000 cross-connection increases in maximum density from each of curves 15, 16, 17, 18, 19 to the next curve, strongly suggests that there is a limit beyond which a conventional linear DF should not be extended when full random connectivity is present.

When considering DF's during physical expansion, the time required for enough random intermingling to occur to cause a new density distribution can vary from DF to DF. When DF activity is volatile—new service demands, new technology introduced, change of service requests, etc., the change can be quite rapid. When DF activity is stable, the change is slow to occur, or may never occur. Software that chooses shortest connections for service requests also slows the randomization process, but at some point, the only choices available to satisfy customer demand may be long connections. The extent to which randomization has occurred on a DF, whether through expansion or increased activity, or both, can be determined through physical inspection.

FIG. 10 graphically compares density distributions for a 500V shelf with 50,000 horizontal cross-connections under varying extents of randomness. If we consider a 500V shelf with barriers at every 100V, such that no cross-connection could physically travel from one 100V group to another, we effectively would have five separate 100V shelves, end to end, each with its own random density distribution. This is represented by curve 22. If we removed the barriers, but only allowed random intermingling up to a 100V span (i.e., each ring is connected only to the closest 100 HB's), then the density distribution would be as shown in curve 23. The flat portion from V100 to V400 on curve 23 is due to the fact that, emerging from each ring, the 100 cross-connections may travel 50V to the right or left to connect to the 100 closest HB's. Note that this results in a substantial (50%) density reduction from the maximum value on curve 22. The bumps at the ends of curve 22 are due to the fact that connections emerging from rings near the ends have no choice but to travel primarily inward to reach the closest 100 HB's, resulting in longer end connections, and larger end densities. Curve 21 represents the density distribution when random intermingling is allowed up to 250 verticals, or one half of the length of the 500V shelf (50% randomness). Note that there is a distinct reduction at the midpoint, as compared to maximums at V125 and V375, but that these maximums are below the maximum for the 200V full random density 16 shown in FIG. 9. Curve 20 represents the full random density distribution over the entire 500 verticals. Densities increase continuously from the ends to the middle, where the maximum value is reached.

Density curves 20, 21, 22, and 23 can be directly related to pile sizes on a DF shelf. The exact number of cross-connections at a specific point on a shelf may be impossible to determine, but a pile of 1,000 is easily distinguished from a pile of 5,000, and 5,000 from 10,000, etc. Further, even without a specific number reference, the pattern of pile sizes can be discerned. If the piles are larger at the ends with a smaller flat portion between them, then the randomness has been controlled, as in curve 23. If there a decrease in density at the midpoint, we'd be close to curve 21. If the piles increase continuously in size from the ends to a maximum at the middle, and there is an observable maximum pile at the midpoint, then it is certain that the randomness is 67% or greater.

The problems of misrouted and un-removed dead connections are often cited as the cause for congestion problems on DF shelves. However, misrouted and dead connections will follow the same horizontal dispersal patterns as correctly routed live connections, and therefore contribute to horizontal densities in the same way, except that the wrong shelves may be used. If misrouting were extreme—say that the upper four shelves (S9-S12) and the two lowest shelves (S1-S2) were not used, then six shelves (S3, S4, S5, S6, S7, S8) would have to carry the load of twelve, thus doubling their densities. Dead cross-connections would contribute in equal proportions to both correctly routed and incorrectly routed cross-connections—i.e., half the dead connections would be on S3-S8, and half on S1-S2 & S9-S12. Therefore, if the non-removal rate of dead connections were 10%, the S3-S8 load would increase by a factor of 2.2. This would be sustainable for curves 22 and 23 in FIG. 10, but not for curves 20 and 21.

The fundamental problem with many prior art attempts to reduce congestion problems on DF's has been the underestimation or misunderstanding of randomness and its relationship to the geometry of points being interconnected. Randomness by itself means that the physical location of circuit elements required to satisfy service requests, becomes, over time, unpredictable, and connection paths required to interconnect them become difficult to utilize, find, or establish. In relation to the geometry of points being interconnected, the more randomness is present, the more important is the geometry of the configuration on which physical connections are made. When randomness is extreme, the more elongated the object, the worse it performs in respect to densities and lengths of connections. A long skinny rectangle, which is what a DF resembles from a distance, is one of the worst shapes on which to interconnect points at random. Abstractly, the most efficient object for interconnecting points in three dimensions with a straight line, is a sphere.

The traditional linear design of the DF has not changed in over 100 years, and with present higher density connectors, there is a limit to physical expansion when randomness is present. This limit is probably about 300 verticals. At 300V, all twelve shelves would contain 15,000 cross-connections at the V150 location, and density levels would be above 10,000 from V64 to V236, or about 58% of each shelf. If the DF operated at 90% capacity, at 100% randomness, shelf densities would be above 10,000 from V73 to V227, or 52% of each shelf.

SUMMARY OF THE INVENTION

It is an object of the invention to provide a structure for a distributing frame that is easily expanded as the need for additional interconnections arises.

It is a further object of the invention to provide a structure for a distributing frame that may be used to expand existing an distributing frame as the need for additional interconnections arises.

It is another object of the invention to provide a method for connection density analysis that is useful in the design of distributing frames.

These objects are achieved by using another method of expansion which keeps maximum densities at a safe level, and significantly reduces average connection length: a parallel DF construction that is bridged at predetermined intervals, and essentially expands over an area, rather than in a single straight line. An existing structure may be expanded by placing a new structure parallel to the original structure, and providing a bridge, or a series of bridges, between the existing structure and the new structure.

These objects and others are achieved in accordance with the invention by a distributing frame comprising a first distribution portion having a first series of verticals, and a first series of horizontal shelves; a second distribution portion having a second series of verticals, and a second series of horizontal shelves, the second distribution portion being disposed generally parallel to and spaced apart from the first distribution portion; and at least one horizontal bridge between the first distribution portion and the second distribution portion to support interconnections between a shelf of the first distribution portion and a shelf of the second distribution portion.

The first series of horizontal shelves have at least one first upper shelf and lower shelves, and the second series of horizontal shelves have at least one first upper shelf and lower shelves, and the at least one bridge connects the at least one first upper shelf and the at least one second upper shelf so as to leave a region with no bridges between the first distribution portion and the second distribution portion. At least one distribution portion has opening along it length that serve as walkways, to allow access to space between the first distribution portion and the second distribution portion. Each of the shelves has a first face for providing support for interconnections thereon; and each of the verticals has a first face serving as a traveling surface for outside connector cables, and an opposing face serving as a traveling surface for interconnections; and terminal blocks for connecting the outside connector cables to the interconnections.

A portion of the first face of a portion of the shelves is used for the terminal blocks for connecting the interconnections to outside connector cables. This portion may be up to one third, but may be larger.

At least one bridge may be an integral extension of a shelf of the first distribution portion and a shelf of the second distribution portion. There may be at least one shelf of the first distributing portion without bridges, and at least one shelf of the second distributing portion without bridges, at a height between the bridges. At least one bridge may be disposed at a distance between successive ones of a shelf of the first distribution portion and a shelf of successive ones of the second distribution portion.

The invention is also directed to a distributing frame comprising a first distribution portion having a first series of verticals, and a first series of horizontal shelves; a second distribution portion having a second series of verticals, and a second series of horizontal shelves, the second distribution portion being disposed generally parallel to and spaced apart from the first distribution portion; and wherein each of the shelves has a first face for providing support for interconnections thereon; and each of the verticals has a first face serving as a traveling surface for outside connector cables, and an opposing face serving as a traveling surface for interconnections; and terminal blocks for connecting the interconnections to outside connector cables; and wherein a portion of the first face of a portion of the shelves is used for the terminal blocks for connecting the outside connector cables to the interconnections. Up to one third, or more, of a first face of a portion of the shelves may be used for the terminal blocks for connecting the interconnections to outside connector cables.

In another aspect the invention is directed to a distributing frame, comprising a frame having a first series of verticals, and a first series of horizontal shelves; and upper ones of the shelves being continuous and lower one of the shelves having opening therein to define an access opening between successive portions of the frame. The openings may be walkways.

The invention is also directed to a method for simulating a design for a distributing frame comprising steps of specifying a proposed design; generating interconnection paths resulting from the design; and computing section interconnection densities for sections of the design, and interconnection densities for intersections of the design. The method may be used for simulating a bridged parallel distributing frame, wherein the specifying includes specifying the location of at least one bridge, and wherein the computing further comprises computing density of interconnections on the bridge. The shelves may be specified as self closing.

The path generation may comprise generating diagonal paths; generating section combinations; generating top to bottom paths; generating bottom to top paths; generating same column paths; and generating same row paths. The method may further comprise storing data representative of the generated paths in at least one file, and data representative of the densities in a file. The method may further comprise using the computed densities to evaluate the design.

The invention is also directed to a computer readable medium having thereon computer readable instructions for causing a computer to perform the steps of the method, as set forth above.

BRIEF DESCRIPTION OF THE DRAWINGS

The foregoing aspects and other features of the present invention are explained in the following description, taken in connection with the accompanying drawings, wherein:

FIGS. 1A, 1B and 1C are plan, side and elevation views of the framework of a prior art distributing frame, twelve shelves high by fifty verticals long.

FIG. 6 illustrates the final state of a vertical when fully connected at maximum randomness.

FIGS. 7A and 7B illustrate a typical shelf undergoing physical expansion from 50 verticals to 100 verticals, and the effect it has on cross-connection density when fully connected at maximum randomness.

FIG. 11A is a plan view of the lower levels of the framework of a bridged parallel distributing frame, in accordance with the invention.

FIG. 11B is a plan view of the upper levels of the framework of a bridged parallel distributing frame, in accordance with the invention.

FIG. 11C is an elevation view of the framework of a bridged parallel distributing frame, in accordance with FIGS. 11A and 11B.

FIG. 11D is a cross-sectional view taken along line B-B of FIG. 11B.

FIG. 11E is a cross-sectional view taken along line A-A of FIG. 11B.

FIG. 12A is a plan view of upper level cable and connector detail for a bridged parallel distributing frame, in accordance with FIGS. 11A-11E.

FIG. 12B is a plan view of lower level cable and connector detail for a bridged parallel distributing frame in accordance with FIGS. 11A-11E.

FIG. 12C is a cross-sectional view of cable and connector detail for a bridged parallel distributing frame in accordance with FIGS. 11A-11E.

FIG. 13A is a detailed cross-sectional view of cross-connect rings and paths of a cross-connection on a vertical that has been partially converted to a shelf, in a distributing frame in accordance with FIGS. 11A-11E.

FIG. 13B is a detailed elevation view of cross-connect rings and horizontally mounted outside connectors on a vertical that has been partially converted to a shelf, in a distributing frame in accordance with FIGS. 11A-11E.

FIG. 13C is a detailed upper level plan view of cross-connect rings and horizontally mounted outside connectors on a vertical that has been partially converted to a shelf, in a distributing frame in accordance with FIGS. 11A-11E.

FIG. 14A is a plan view of the lower levels of the framework of a 120 vertical bridged parallel distributing frame, fully equipped with outside cable connectors and horizontal terminal blocks, in accordance with the invention.

FIG. 14B is a plan view of the upper levels of the framework of a 120 vertical bridged parallel distributing frame, fully equipped with outside cable connectors and horizontal terminal blocks, in accordance with the invention.

FIG. 14C is an elevation view of the framework of a bridged parallel distributing frame, fully equipped with outside cable connectors and horizontal terminal blocks, in accordance with FIGS. 14A and 14B.

FIG. 14D is a cross-sectional view taken along line B-B of FIG. 14B.

FIG. 14E is a cross-sectional view taken along line A-A of FIG. 14B.

FIG. 16A is a plan view of the lower levels of the fully equipped framework of a 120 vertical bridged parallel distributing frame with no walkways and upper shelf conversion, in accordance with the invention.

FIG. 16B is a plan view of the upper levels of the fully equipped framework of a 120 vertical bridged parallel distributing frame with no walkways and upper shelf conversion, in accordance with the invention.

FIG. 16C is an elevation view of the framework of a bridged parallel distributing frame, in accordance with FIGS. 16A and 16B.

FIG. 16D is a cross-sectional view taken along line B-B of FIG. 16B.

FIG. 16E is a cross-sectional view taken along line A-A of FIG. 16B.

FIG. 17A is a plan view of the upper levels of a fully equipped 136 vertical bridged parallel distributing frame with no walkways and no upper shelf conversion, in accordance with the invention.

FIG. 17B is an elevation view of the fully equipped framework of the parallel distributing frame, in accordance with the FIG. 17A.

FIG. 17C is a cross-sectional view taken along line B-B of FIG. 17A.

FIG. 17D is a cross-sectional view taken along line A-A of FIG. 17A.

FIGS. 23A, 23B and 23C illustrate possible bridge to shelf attachment methods.

FIGS. 24A, 24B, 24C and 24D illustrate four geometric configurations of twelve points each.

FIGS. 26A to 26L illustrate various non-reversing paths on a 3×4 array of points.

FIGS. 27A, 27B, 27C(1), 27C(2), 27D(1) and 27D(2) illustrate densities and lengths on varying arrays of points, some with varying path rules.

FIG. 30 illustrates a small 2×3(1,1,1) bridged parallel distributing frame with all connections made.

FIG. 31 illustrates the linear equivalent of the FIG. 30 DF.

FIGS. 32A, 32B, 32C and 32D illustrate the connections of FIG. 30 separated into path types.

FIGS. 35A to 35I illustrate the types of connection paths found inside the various types of intersections on a bridged parallel DF.

FIG. 36, (including FIGS. 36A and 36B thereon), illustrates the densities recorded by the Simulator for all intersections on a bridged parallel DF.

FIG. 37 illustrates the output files of the Cross-connect Simulator for a 2×3(1,1,1), E=6 User request.

FIG. 38 illustrates the output files of the Cross-connect Simulator for a 2×3(8,8,8), E=48 User request.

FIG. 44 illustrates the maximum row and column boundaries for User requests to the Simulator.

FIG. 46 is a source code listing for generating sequence numbers representing non-reversing diagonal paths in a 6×6 matrix.

DETAILED DESCRIPTION OF THE PREFERRED EMBODIMENT

Figure 2B:
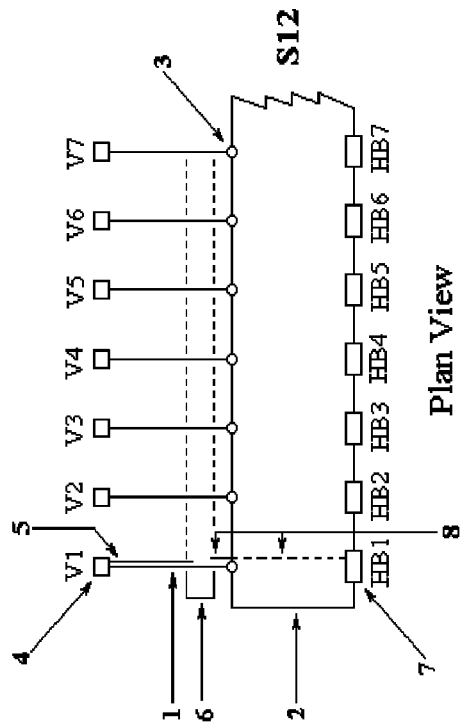
FIGS. 2A and 2B are side and plan views of a vertical with outside cable and connectors mounted and a shelf with central office equipment terminals and cables.
Figure 2A:
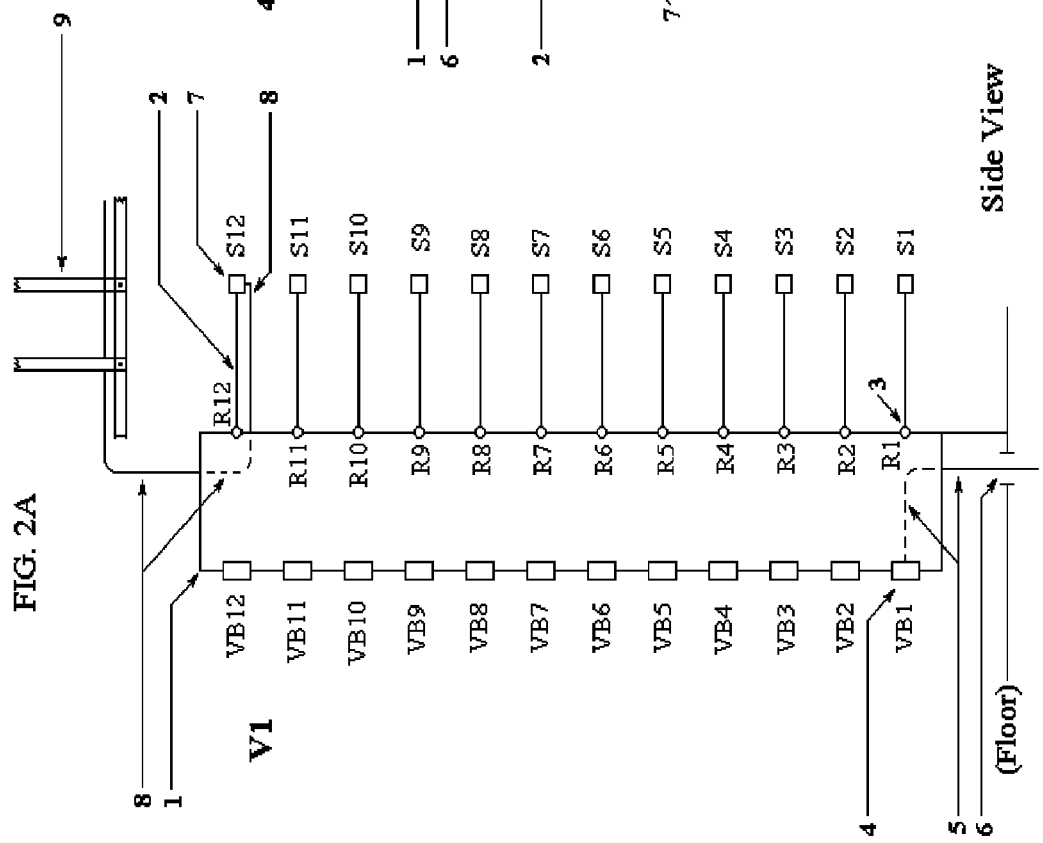
Figure 3A:
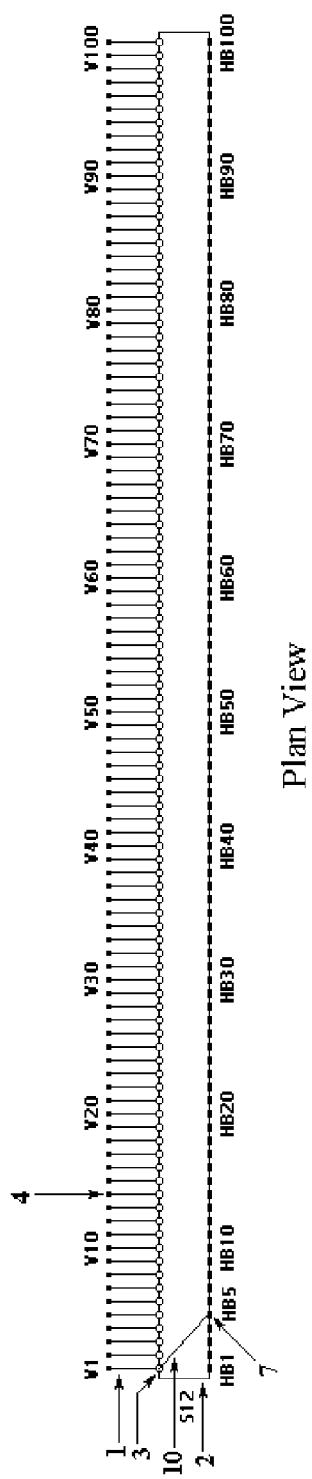
FIGS. 3A, 3B and 3C are plan, side and elevation views of a prior art distributing frame that has expanded to 100 verticals, fully equipped with vertical connectors and horizontal terminal blocks; the path of a single cross-connection is shown.
Figure 3C:
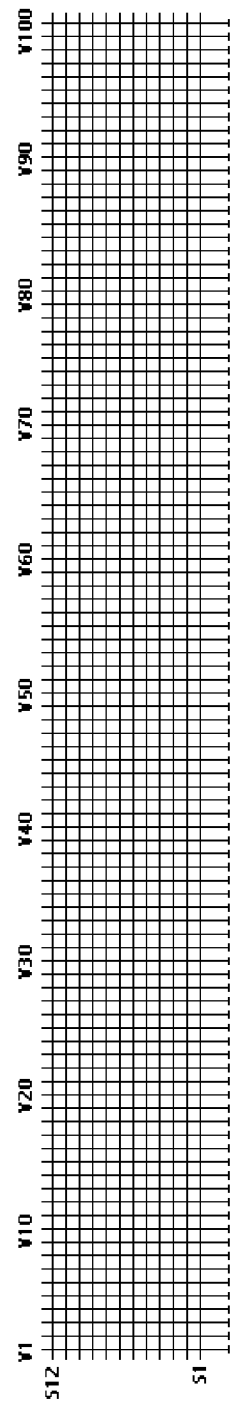
Figure 3B:
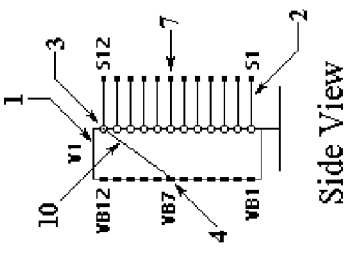
Figure 4B:
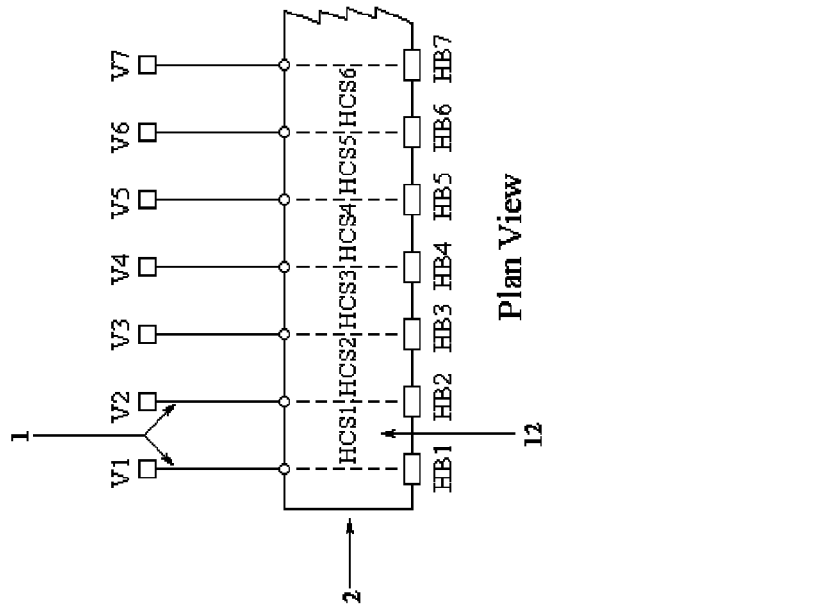
FIGS. 4A and 4B are side and plan views that define the vertical and horizontal areas where cross-connection density will be measured on a prior art distributing frame.
Figure 4A:
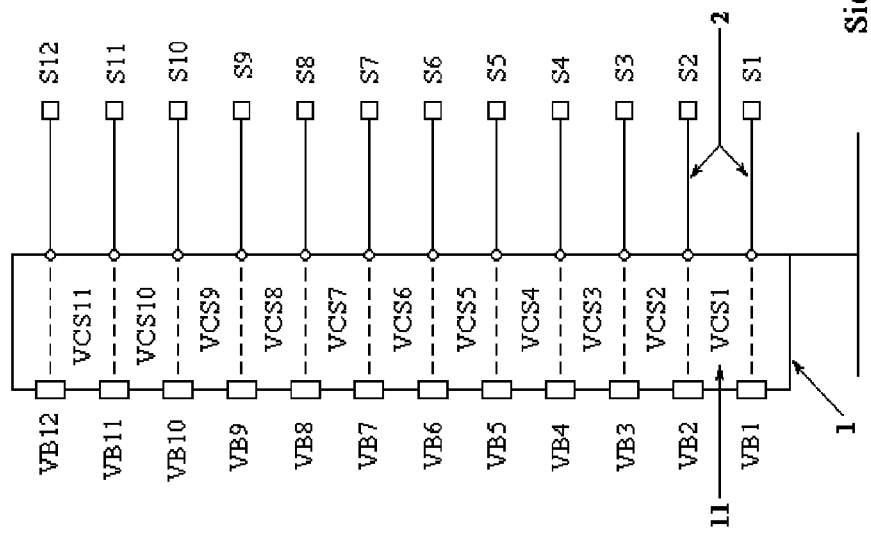
Figure 5B:
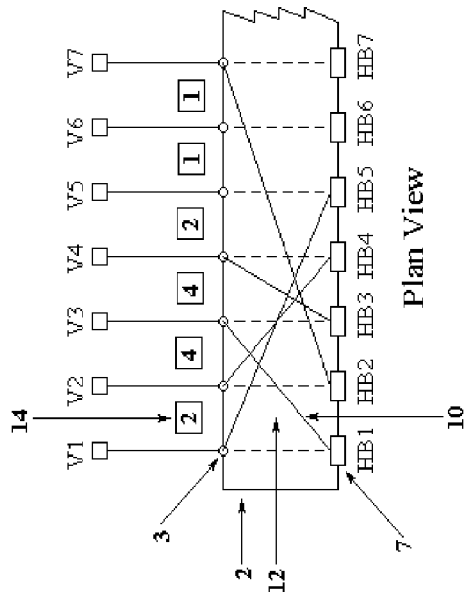
FIGS. 5A and 5B are side and plan views that illustrate density measurement of a few cross-connections on the vertical and horizontal surfaces of a prior art distributing frame.
Figure 5A:
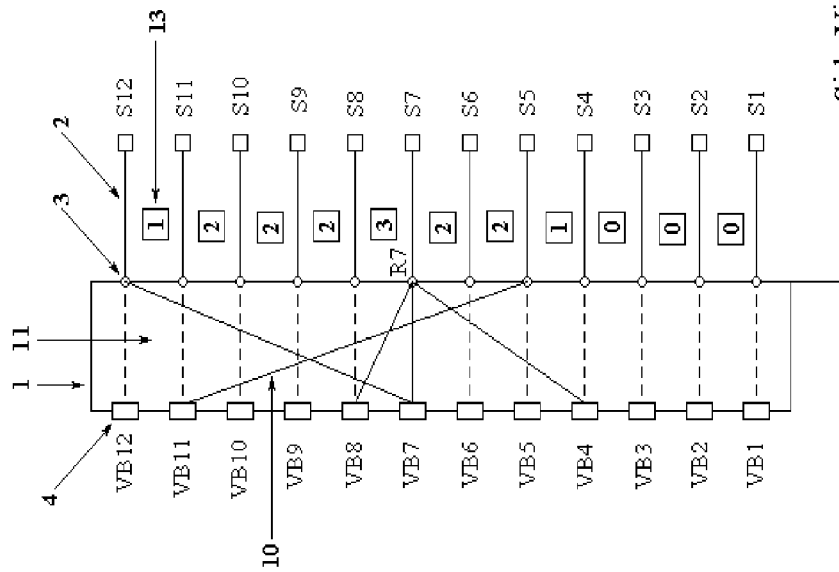
Figure 8A:
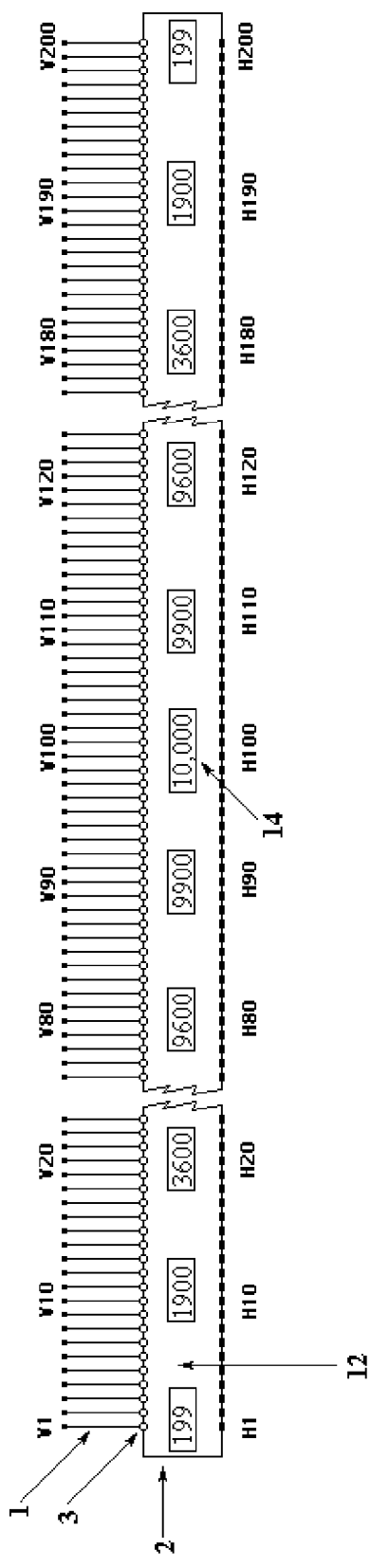
FIGS. 8A and 8B illustrate shelf densities (at maximum randomness) for expansions to 200 and 300 verticals.
Figure 8B:
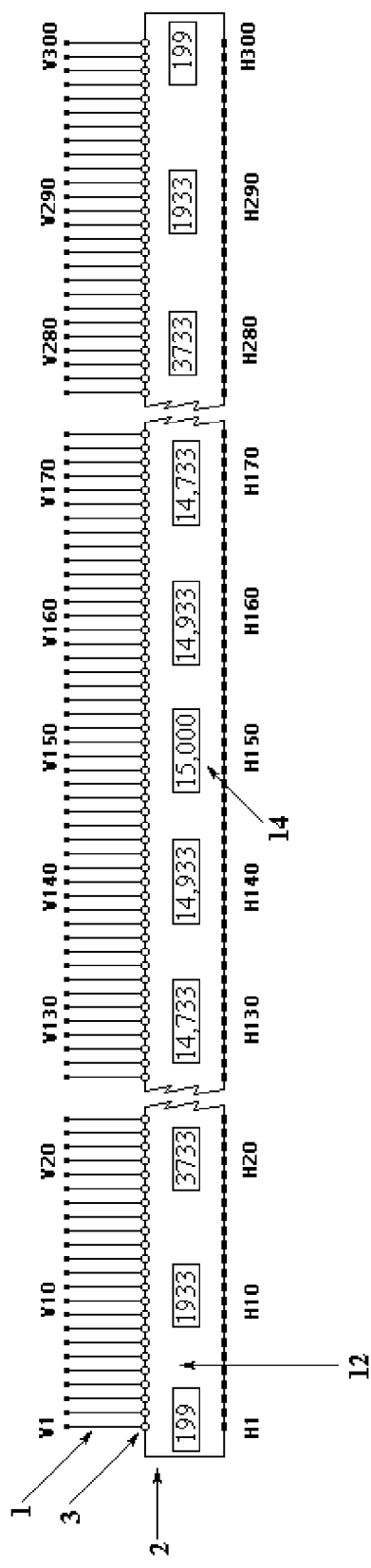
Figure 9:
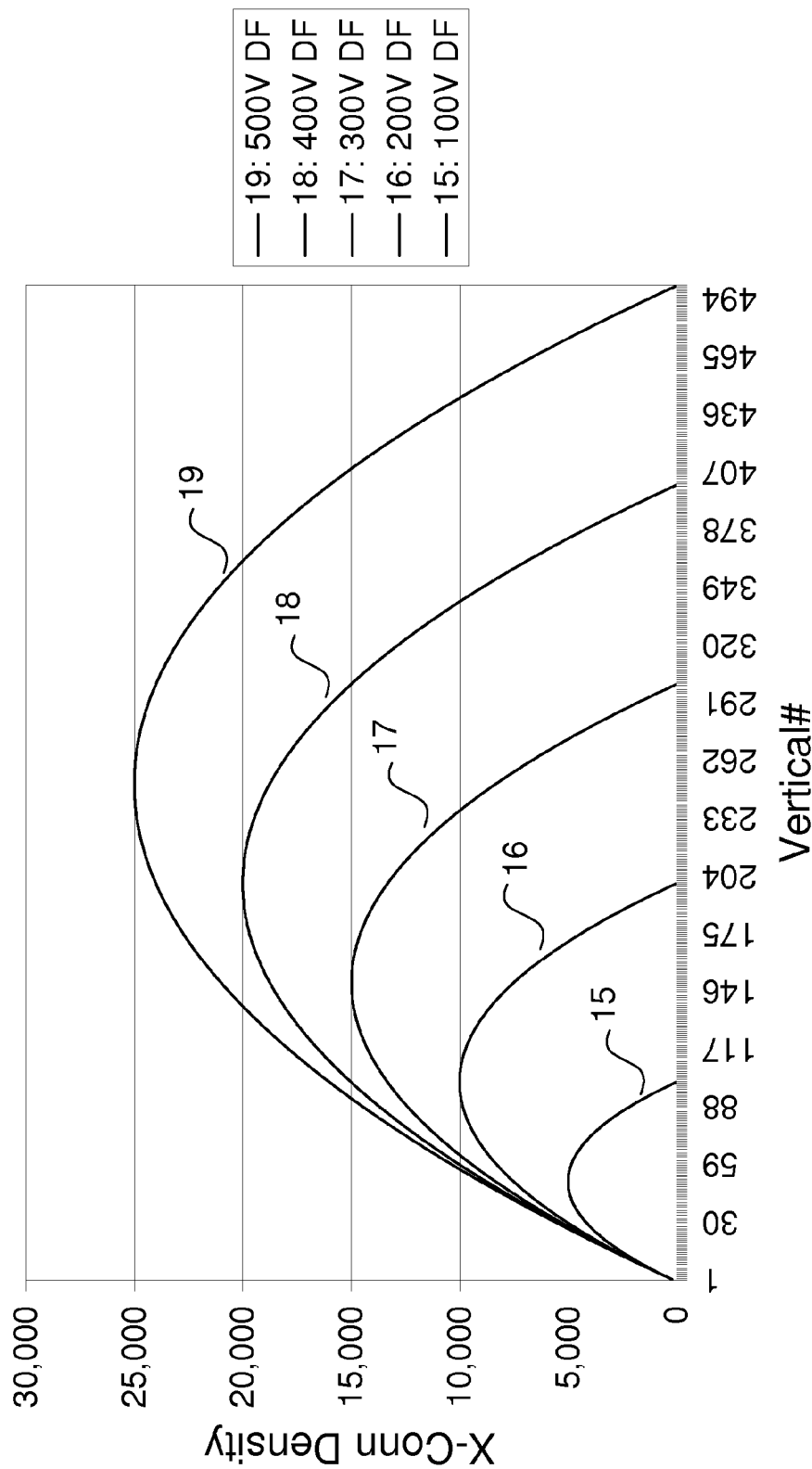
FIG. 9 is a graph of Cross-connect Density vs. Vertical Number as shelf size increases—at 100% randomness.

FIGS. 11-15 illustrate a bridged-parallel distributing frame according to an embodiment of the present invention. Although the present invention will be described with reference to the embodiments shown in the drawings, it should be understood that the present invention can be embodied in many alternate forms of embodiments. In addition, any suitable size, shape or type of elements or materials could be used.

FIGS. 11A-11E illustrates the framework of a distributing frame that has been designed to expand in 2 directions. It is comprised of sections 98, which are further subdivided into the upper portion 98U and lower portion 98L. Lower sections 98L are separated by (optional) walkways 99. Upper sections 98U are continuous, interconnected by upper level shelves 202. The upper portions of verticals have (optionally) been converted into shelves to increase upper level horizontal surface area, creating shortened vertical 101, and upper shelves 302, which are also continuous, providing more interconnection between sections 98U. Taken collectively, sections 98 interconnected by upper level shelves 202 and 302, form rows 97. The DF of FIGS. 11A-11E contains 2 rows 97, each containing 60 verticals 101. The rows 97 are interconnected by bridges 100 connecting the upper shelves 302 of the first row 97 (V1-V60) to the upper shelves 202 of the second row 97 (V61-120). The bridges 100 are located at the beginning (B1) and ends (B4) of the rows 97, and at walkway 99 junctures (B2 and B3).

Figure 22:
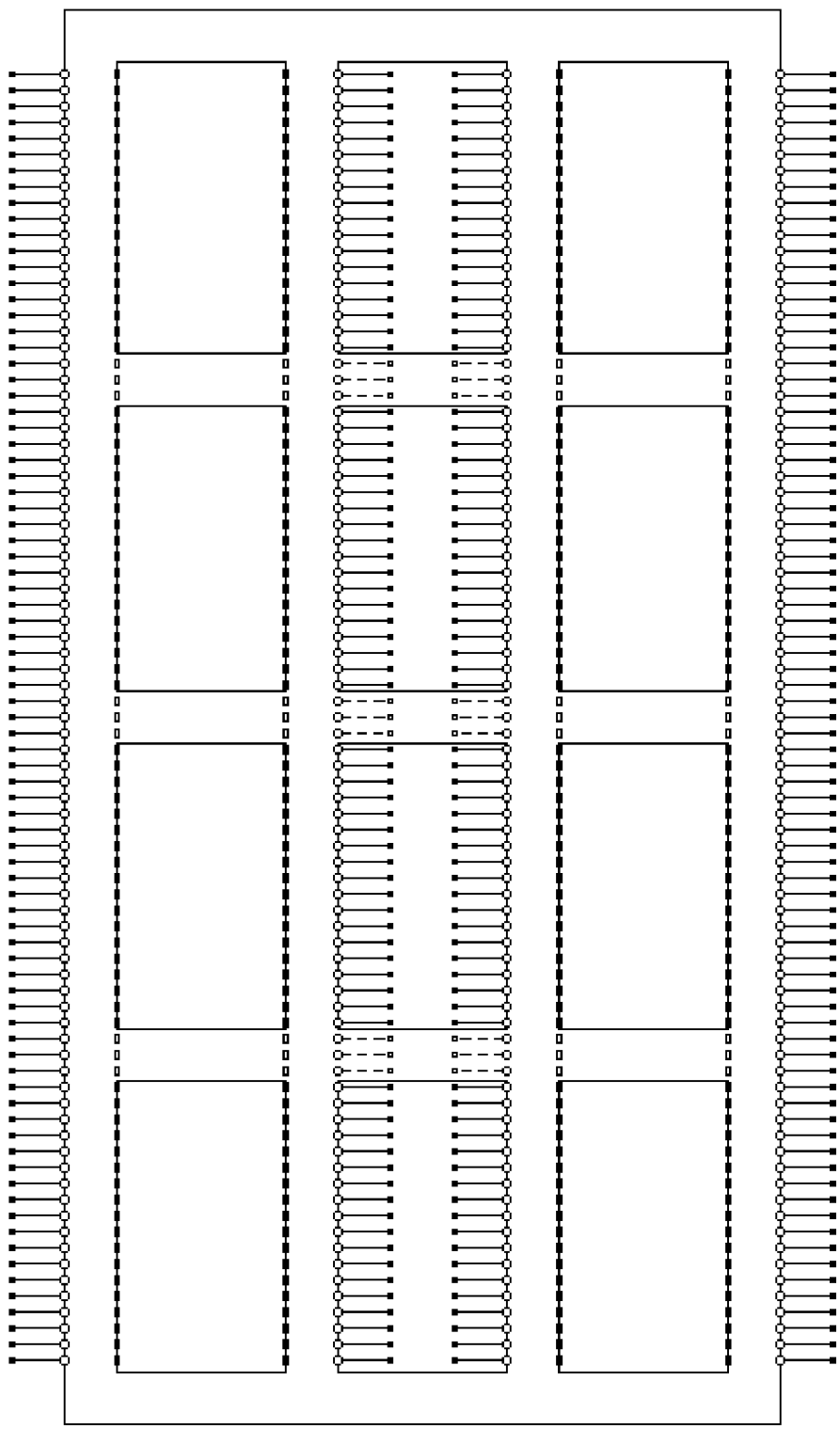
FIG. 22 illustrates an alternating shelf-to-shelf, vertical-to-vertical alignment of a bridged parallel DF.
Figure 25A:
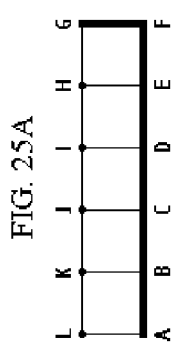
FIGS. 25A to 25J illustrate various non-reversing paths on a 2×6 array of points.
Figure 25B:
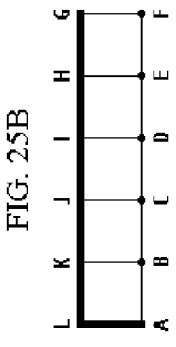
Figure 25C:
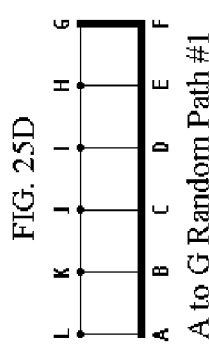
Figure 25D:
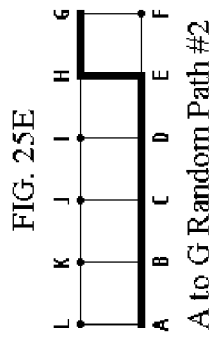
Figure 25E:
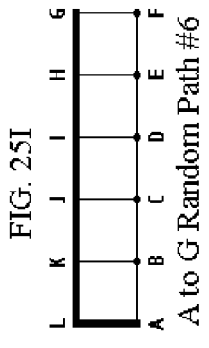
Figure 25F:
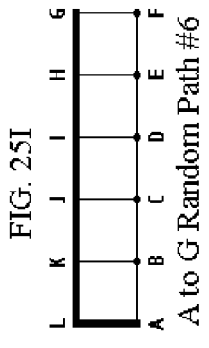
Figure 25G:
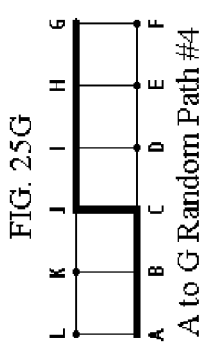
Figure 25H:
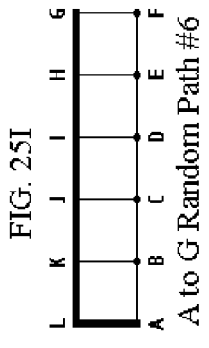
Figure 25I:
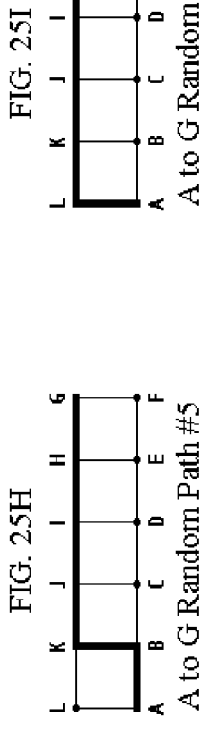
Figure 25J:
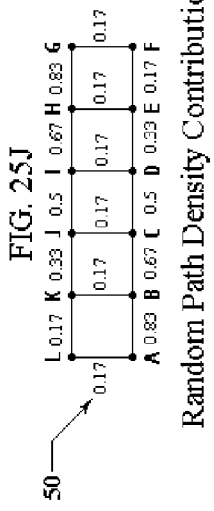

The DF as shown in FIGS. 11A-11E (2 rows 97 of 3 sections 98, each section 98 containing 20 verticals 101, bridged together by the bridges 100 at locations B1, B2, B3, and B4), could have been initially built as such, or it could have started from a smaller configuration and expanded. Expansion can take place either by increasing the length of an existing row 97 by adding sections 98 to the row and connecting the upper shelves 202 and 302, or by starting a new parallel row, and bridging back to an adjacent row. Using 20 vertical sections 98, the DF of FIGS. 11A-11B can be expanded to a variety of shapes. Also, in general, the alignment of shelves from row to row does not have to be as shown in FIGS. 11A-11E. An alternating shelf to shelf, vertical to vertical alignment, as shown in FIG. 22, or hybrid arrangement could also be used.

In the DF of FIGS. 11A-11E, rings 3 are located at the intersections of lower shelves 101 and lower verticals 102, to facilitate and control the passage of cross-connections from vertical 101 to horizontal planes 102. Similarly, to control the passage of cross-connections from verticals 101 to upper shelves 302, horizontal rings 103 are added. Larger rings 203 are placed between upper old shelves 202 and upper new shelves 302, to accommodate higher cross-connection densities on the upper levels. In addition, the rings 203 are placed at a position higher than the level of the old shelves 202 and new shelves 302 so that larger piles of cross-connections will not block the passage of cross-connections from one side to the other.

FIGS. 12A, 12B and 12C illustrate connector and cable detail for the DF framework shown in FIGS. 11A-11E. In FIG. 12C, horizontal terminal blocks 7 are mounted on the outside edges of lower shelves 102 (S1-S8) and upper shelves 202 (S9-S12). Cables 8, attached to the terminal blocks 7 on S1-S8, travel underneath the shelves 102, and up the cable face of the vertical 101. In this view, the cable face is towards us, so solid lines are used. Once leaving the cable face of the vertical 101, they must pass through the slot 106 left between upper shelves 202 and 302 for this purpose, and on to the cable rack 9. Cables 8 from horizontal terminal blocks 7 on S9-S12 travel underneath the shelf 202, and then directly up through the slot 106, to the cable rack 9.

Also in FIG. 12C, outside cable connectors 4 (VB1-VB8) are mounted on the outer edges of the vertical 101. The cables 5 from these connectors 4 run across the cable face of the vertical 101, and down through the slot 6, to a splicing chamber or cable vault, where they are spliced into the outside cable network. Outside cable connectors 104 are mounted horizontally on the outside edge of the shelves 302 (202 shelf levels S9-S12).

The horizontal orientation of the mounting, as indicated in the FIGS. 12A and 12B and FIG. 13B, does not change the function of the connector—it is shown in this manner to signify a mounting different than normally used, and one which may require a mounting adaptor, or a new type of connector. The cables 105 from these connectors 104 run underneath the shelves 302, down through the slot 106, to the cable face of the vertical 101, joining the cables 5 from the connectors 4, down through the slot 6, to the splicing chamber or cable vault, where they are also spliced into the outside cable network. The dimensions of the slot 106 must be sufficient to accommodate the passage of both the outside cables 105 traveling down to the slot 6, and the inside cables 8, traveling up to the cable rack 9.

FIGS. 13A, 13B and 13C provide more detail on connector mounting, the cross-connect rings 3, 103, and 203, and some of the paths that cross-connections may take on the DF of FIGS. 11A-11E. FIG. 13B illustrates 3 verticals 101 and the converted shelves 302 above them. The outer verticals 101 and the shelf 302 portions above them have been left unequipped so that details for rings 3, 103, and 203 can be seen more clearly. The middle vertical 101 has outside cable connectors 4 mounted on its outer edge in a conventional manner. On the shelves 302 above middle vertical 101, outside cable connectors 104 are shown mounted in the horizontal orientation. Rings 3 in FIG. 13B are conventional. As explained with respect to FIGS. 11A-11E, rings 203 are larger in order to accommodate larger numbers of cross-connections on the upper levels, and mounted higher up so that larger piles of cross-connections do not cause a blockage. Horizontal ring 103 is shown in FIG. 13C, and is above slot 106. Depending on the planned ultimate DF size, this ring may have to be larger than either of the other two (3 or 203), because, under random connection conditions, more connections will be traveling through the rings 103 as the DF expands. Ring 103 at the S8 level will carry the largest load, and may have to be extra large. In the worst-case scenario, all of the cross-connections from the vertical 101 and to equipment terminals 7 on S1 to S8 (1,600 total) will pass through here in order to travel to other parts of the DF. It may also be useful to install an elongated ring in the slot 106 to facilitate cross-connection passage through the shelf. It may also be necessary to widen this slot to ensure easy passage of cross-connections from lower to upper levels.

Four cross-connections 10A, 10B, 10C, and 10D are shown in the FIG. 13A. These connections originate and terminate in the plane of the vertical 101 in order to illustrate the paths possible from connector blocks VB1-12. Cross-connection 10A runs from outside terminal 4 (VB2), across the cross-connect face of the vertical 101 (which is facing away from the viewer and is thus shown in the dashed line), up through 2 horizontal rings 103, through vertical ring 203, across shelf 202 (S9), to the equipment terminal 7 at the edge of the shelf 202 (S9). Cross-connection 10B runs from the horizontally oriented outside cable connector 104 (VB11) at the edge of the shelf 302 (S11 level), through 4 horizontal rings 103, down the cross-connect face of the vertical 101, through the ring 3 at S5 level, across the shelf 102 (S5), and terminates on the equipment terminal 7 at the outer edge of the shelf 102 (S5). Cross-connection 10C runs from VB10, across the shelf 302, through the ring 203, across shelf 202, and terminates on the equipment terminal 7 on the edge of the shelf 202 (S10). Cross-connection 10 D runs from VB1, across the vertical 101, through the ring 3, across the shelf 102, to the equipment terminal 7 at the edge of the shelf 102 (S2).

The connections 10A-10D in FIG. 13A travel only within the plane of FIG. 13A. Most connections from VB1-VB12 would travel a distance horizontally on the shelves 102, 202, or 302, before terminating on a horizontal block 7. Traveling rules for this are:

Non-Crossover Rules (connections not crossing bridges or walkways):
1. The shelf level of the horizontal travel should always be that of the HB—this is the same as in the prior art.
2. When the HB is on an upper level, 202 or 302 may be used.
3. When the HB is on a lower level, the only choice is 102.

Crossover Rules:
1. LLVB→LLHB—
    a. Travel on vertical from VB to the shelf level dedicated for the VB:
        i. VB1 & VB2→S9 Level
        ii. VB3 & VB4→S10 Level
        iii. VB5 & VB6→S11 Level
        iv. VB7 & VB8→S12 Level
    b. Traverse bridge matrix to vertical location of HB
    c. Travel down vertical at HB location to HB level
    d. Through ring at HB level, across shelf to HB
2. LLVB→ULHB—
    a. Travel on vertical from VB to level of HB
    b. Traverse bridge matrix to HB
3. ULVB→LLHB—
    a. Travel on level of VB (202 or 302) to vertical location of HB
    b. Travel down vertical at HB location to HB level
    c. Through ring at HB level, across shelf to HB
4. ULVB→ULHB—
    a. Same upper levels: Traverse matrix from VB to HB
    b. Different upper levels:
        i. Travel on vertical from VB to level of HB
        ii. Traverse matrix to HB FIGS. 14A-14E show the DF framework of FIGS. 11A to 11E equipped with outside and inside terminals. For clarity, ring details 3, 103, and 203, have been omitted from FIG. 14C. Terminals have not been mounted on shelves over walkways 99, in anticipation of possible expansion in either direction. Terminals can be mounted here if expansion in that direction is not planned or is impossible.

Basic path types have been discussed when the upper portions of the verticals were converted to shelves and walkways inserted. These possibilities can change, depending on other design options (no walkways or no upper vertical conversion). It is best at this point to illustrate these other design options and how they may effect paths of cross-connections.

Figure 15A:
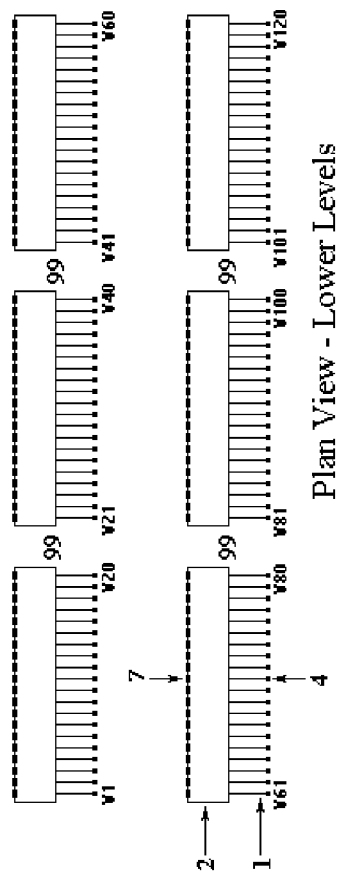
FIG. 15A is a plan view of the lower levels of the fully equipped framework of a 120 vertical bridged parallel distributing frame with walkways and no upper shelf conversion, in accordance with the invention.
Figure 15B:
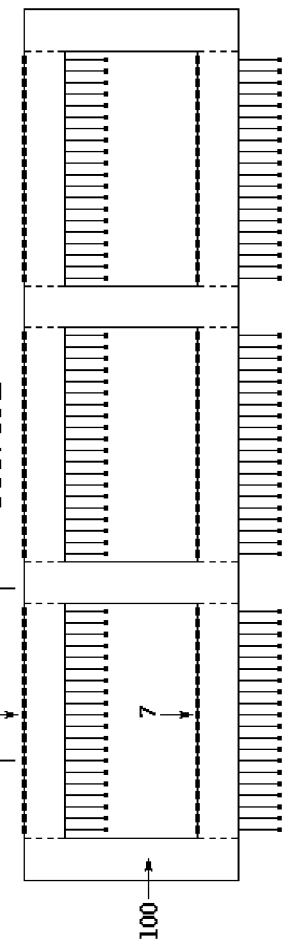
FIG. 15B is a plan view of the upper levels of the fully equipped framework of a 120 vertical bridged parallel distributing frame with walkways and no upper shelf conversion, in accordance with the invention.
Figure 15C:
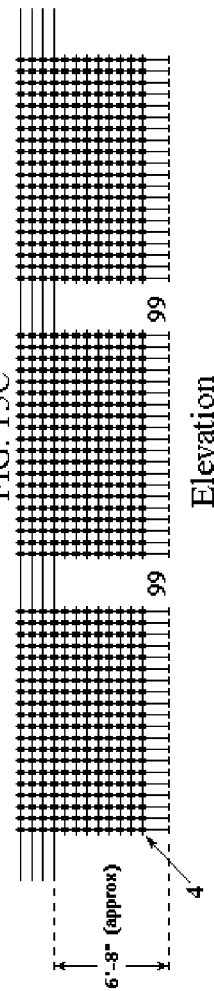
FIG. 15C is an elevation view of the fully equipped framework of a bridged parallel distributing frame, in accordance with FIGS. 15A and 15B.
Figure 15D:
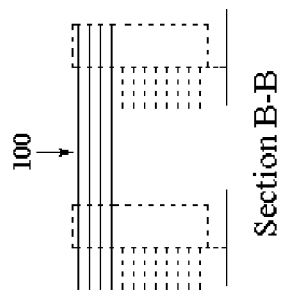
FIG. 15D is a cross-sectional view taken along line B-B of FIG. 15B.
Figure 15E:
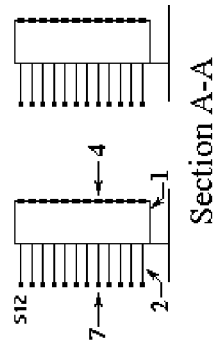
FIG. 15E is a cross-sectional view taken along line A-A of FIG. 15B.

FIGS. 15A-15B show the DF of FIGS. 14A-14B without upper shelf conversion. In this design, cross-connections that do not have to cross a bridge 100 or travel over a walkway 99 follow the same paths as that in the prior art. For crossovers, the same rules apply as for FIGS. 14A-14E, except that there is only one shelf on which to travel on the upper level matrix.

FIGS. 16A-16E show the DF of FIGS. 14A-14E without walkways. The same non-crossover rules would apply as for FIGS. 14A-14E. However, by closing off the walkways, we can reach all the bridges from any vertical location, not just the bridges on either side of the section 98. This means that connections originating and/or terminating on lower level terminals can travel entirely on lower level shelves, with only the bridges being used for upper level travel, and not upper level shelves. Since there is a choice of bridges, the horizontal travel may be apportioned in as many ways as there are intervening bridges, when the two terminals are between different sets of bridges. When the two terminals being interconnected are between the same set of bridges, the shorter overall path will be taken. For equidistant overall paths in this situation, it is assumed that half will be routed in one direction, and half in the other. The net effect of all this will be the reduction of upper level densities, which will be reflected in a loading factor, which is discussed below.

FIGS. 17A-17D show the DF of FIGS. 14A-14E without walkways and without upper shelf conversion. Non-crossovers follow the same path rules as the prior art. Crossovers have the same horizontal travel flexibility as described for FIGS. 16A-16E, thereby reducing upper level shelf densities.

Figure 18:
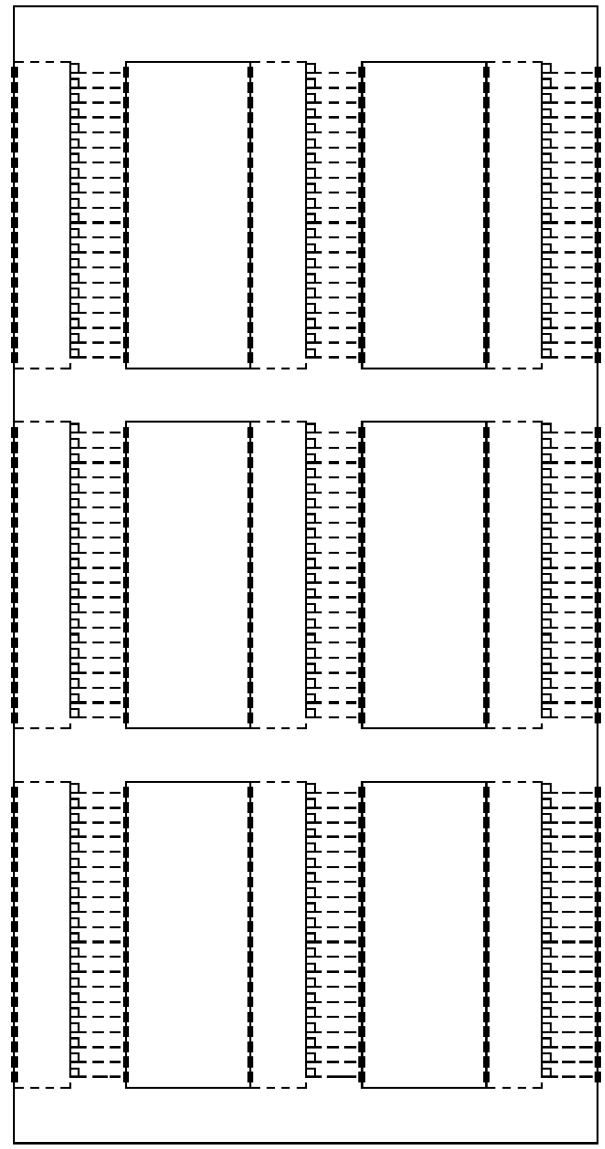
FIG. 18 is a plan view of a possible expansion of the DF in FIGS. 14A-14E to 180 verticals.

FIGS. 18-21 show Upper Level Plan Views of FIG. 14 after possible expansions as follows:

FIG. 18—Expansion to 3 rows of 60 verticals each for 180V total

Figure 19:
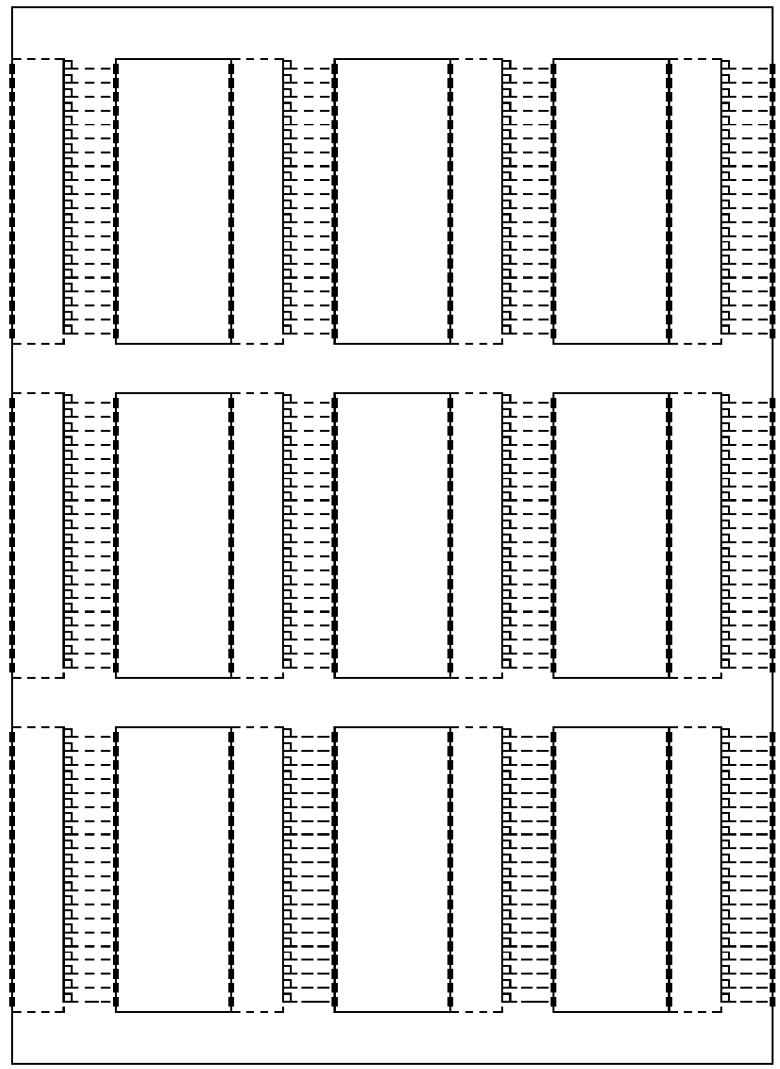
FIG. 19 is a plan view of a possible expansion of the DF in FIGS. 14A-14E to 240 verticals.

FIG. 19—Expansion to 4 rows of 60 verticals each for 240V total

Figure 20:
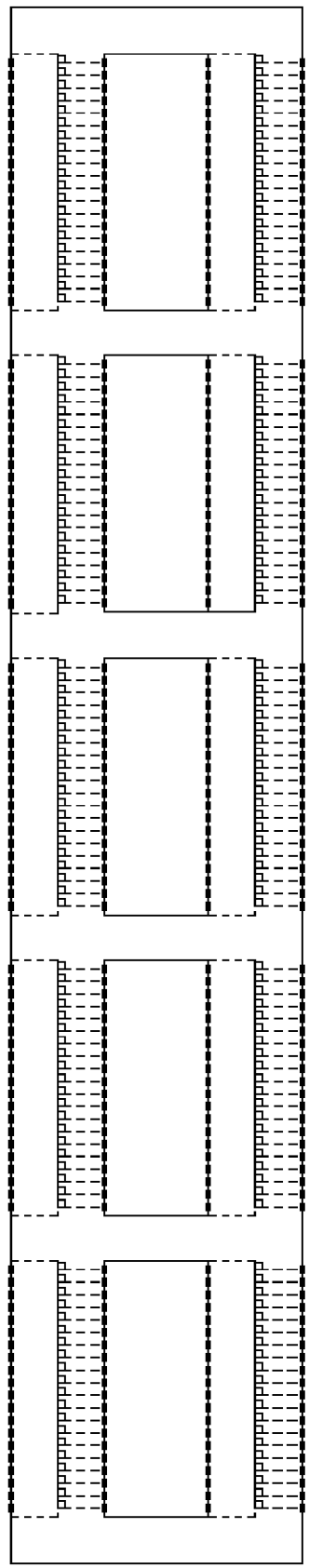
FIG. 20 is a plan view of a possible expansion of the DF in FIGS. 14A-14E to 200 verticals.

FIG. 20—Expansion to 2 rows of 100 verticals each for 200V total

Figure 21:
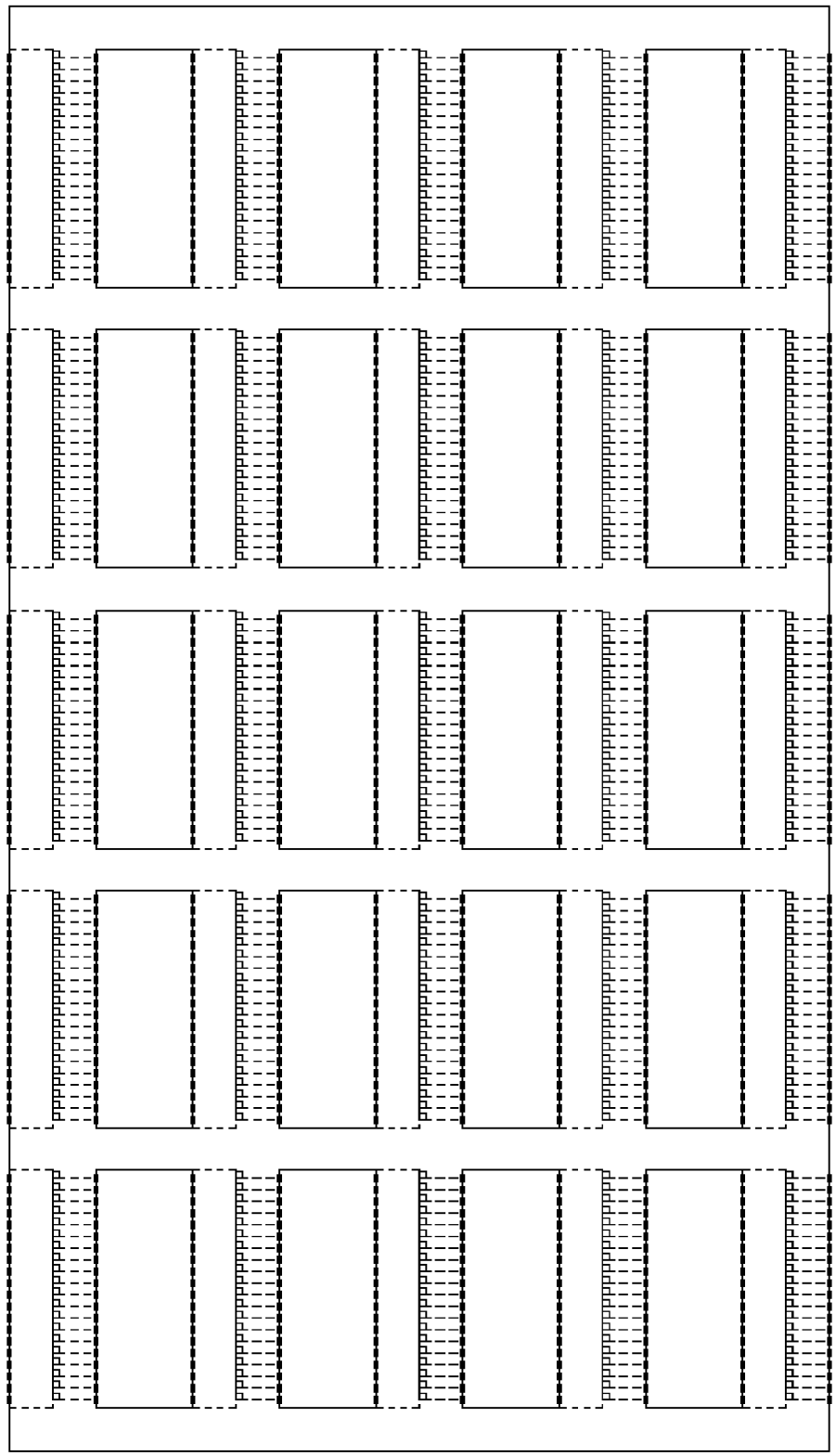
FIG. 21 is a plan view of a possible expansion of the DF in FIGS. 14A-14E to 500 verticals.

FIG. 21—Expansion to 5 rows of 100 verticals each for 500V total

FIG. 22 illustrates a possible alternating alignment of verticals and shelves.

FIGS. 23A, 23B and 23C illustrate some bridge to shelf attachment details.

Path possibilities for traversing the matrix in the horizontal direction must now be considered in order to show how density calculations are performed. FIGS. 24-27 present an abstract example to illustrate the effect that varying arrays of points have on path possibilities, how various travel rules can be formulated, depending on the array, and how densities resulting from connections following the allowed paths are calculated.

FIGS. 24A-24D illustrate four arrays of twelve points. In each array, adjacent points are spaced at a 1-unit distance. Various adjacent points on each array are connected by a line segment 49. For twelve points, there are (12)(12−1)/2=66 possible combinations of points, or 66 possible connections. All 66 possible connections will be made on each array, each connection using only the segments 49 shown for the array. When multiple paths are possible within the traveling rules for the array, they will be assumed to be equally likely, and an equal portion allotted for density contribution to the segments of each path. On the linear array, there is only 1 path possibility for each connection. On the ring array, it is obvious that 2 paths are possible for each connection. When the paths are of unequal length, the shorter path will be taken; when two paths are equidistant, a half-connection will be routed in each. For the last two arrays (2×6 and 3×4), only non-reversing paths are allowed, but the number of path possibilities, even with this restriction is still variable, and depends on the relative position of the two points. If the points are in the same row or column, there is only one path possible, but if the row and column of the two points are different, there are multiple paths possible, and further rules can be applied. One rule is the simple path rule: use only one row and one column to form the connection path. The other rule is the random rule: use segments from any row and column, so long as direction is not reversed. When the simple rule is followed, there are only two paths possible, and half a connection will be routed in each. When the random rule is followed, there can be a large number of paths possible. The number of these paths can be calculated as follows:

Number of non-reversing random paths=$(\Delta R+\Delta C)!/\Delta R!\Delta C!$ where $\Delta R$=the row difference between the 2 points $\Delta C$=the column difference between the 2 points FIGS. 25 and 26 illustrate these rules for each of the two arrays (2×6 and 3×4), using the farthest apart points in each array. FIG. 25 illustrates the 2×6 array. For points A and G, $\Delta R=1$, and $\Delta C=5$, so the number of random paths=(1+5)!/1!5!=6. These paths, along with the simple paths, are shown in FIG. 25. For each of the 6 random paths, ⅙ is added to the density count for each segment that each path traverses. For each of the simple paths, ½ is added to the density count for each segment in each path. The resulting density contributions 50 for the simple path and random path connection AG in the 2×6 array are also shown in FIG. 25. The distribution of the same connection length is quite different—i.e., all the density contributions 50 are different for the Simple Path array than they are on the Random Path, although they both add up to the same number. FIG. 26 illustrates the 3×4 array, using points A and L. For these points in the 3×4 array, $\Delta R=2$, and $\Delta C=3$, so the number of random paths=(2+3)!/2!3!=10. These 10 random paths, along with the two simple paths, and the resulting contribution to the segment densities 50 of the array are shown.

FIGS. 27A, 27B, 27C(1), 27C(2), 27D(1) and 27D(2) show the total densities 50 for all segments 49 in each array, after all sixty-six connections have been made according to the rules previously described. Note that the linear array of FIG. 27A is by far the worst in terms of high segment density 50. Nine of its eleven segments 49 contain higher densities than found in any other array. By forming the ring array in FIG. 27B, the maximum density is cut in half. Progressing from the ring to the 2×6 array of FIG. 27C(1) and FIG. 27C(2), as soon as segments 49 were added between opposing points K and B, J and C, I and D, and H and E, densities dropped again. The densities further decrease for the 3×4 array of FIG. 27D(1) and FIG. 27D(2). Note the density distribution differences between random and simple path on the 2×6 and 3×4 arrays. When two rows (2×6 array) are used, densities of crossing segments 49 are constant for simple path connections, but for random path connections, are less at the ends, and increase to higher numbers at the center. When more than two rows are used (3×4 array), there is also an increase towards the center. Generally, for random paths, there is more of a buildup towards the center in both directions, than for simple paths. For both arrays, the total lengths in both directions are the same, but the distributions of those lengths on the arrays are different. Finally, a general optimization rule that can be concluded from the example, is that the closer the array is to a square, the more efficient it is in terms of decreasing connection densities and lengths.

Having described in general the methods used in calculating connection densities for a given array and set of path and travel rules, we can now apply that method to the bridged-parallel DF. Based on these applied methods, cross-connection simulation software was developed to perform the density calculations for random path connections on a wide range of possible bridged-parallel DF configurations. This software also calculates the densities created by an equivalent linear DF, and compares the results in graphic form. The random path scenario was chosen to generate worst-case maximum density results for the bridges and upper shelves of a particular DF. Depending on the design option chosen (walkways, upper shelf conversion) a specific loading factor will be applied to densities produced by the software for bridges and upper shelves. Simulating cross-connection densities quickly and accurately for practically any bridged-parallel design is a valuable tool for designing a bridged-parallel DF, since densities everywhere depend on the number of bridges and their location. The ability to play with these variables to see immediately what effect they have on cross-connection densities at critical points is a great advantage. Once a design is picked, knowing bridge densities in advance is necessary in determining the number and/or size of bridges needed at a particular location.

Figure 28:
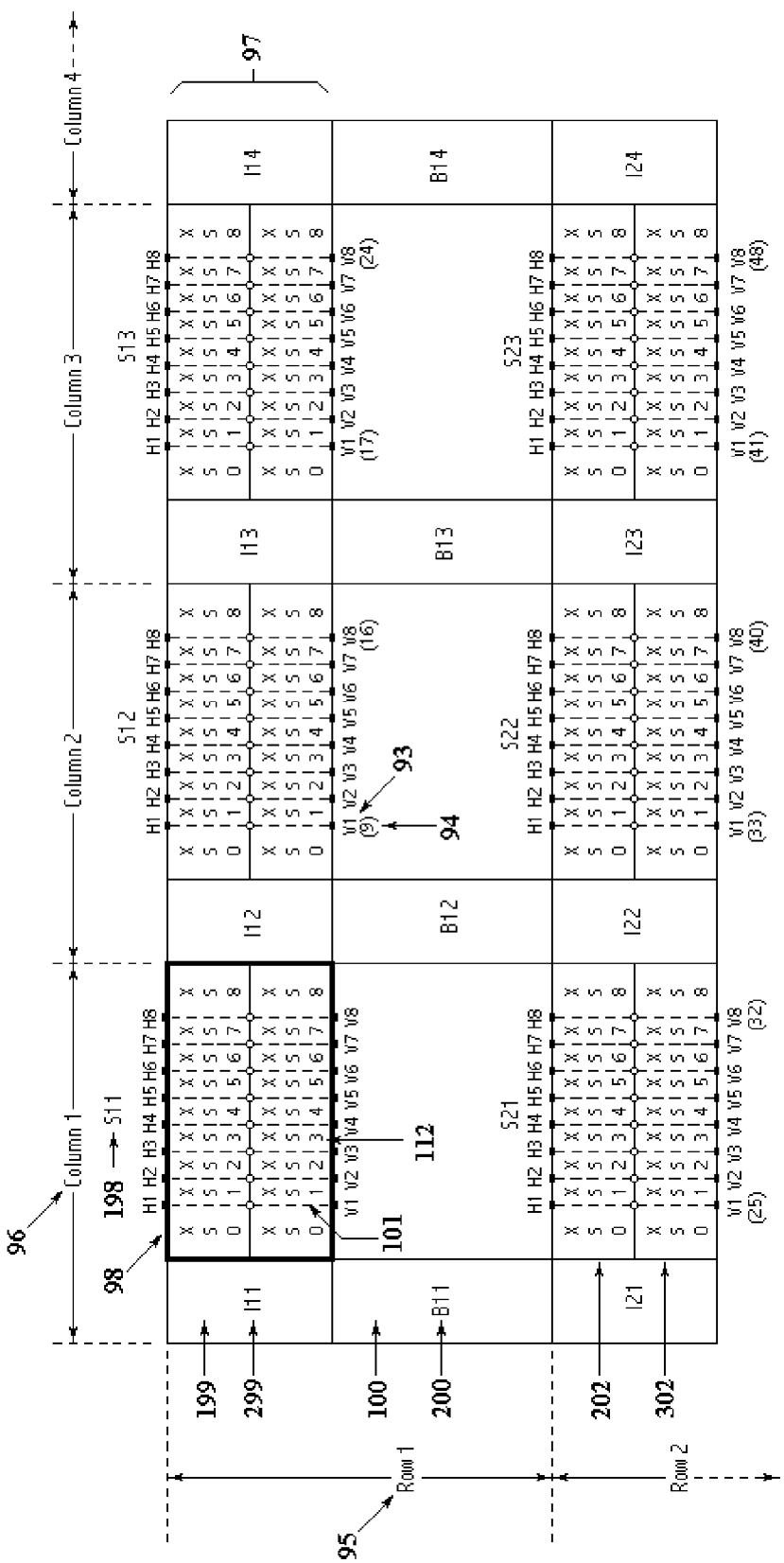
FIG. 28 illustrates the formalized bridged parallel notation.

A more formal system of identifying areas where densities are calculated and recorded on a bridged-parallel DF is used for the simulation software. Areas on a bridged-parallel DF are referenced by row and column number. FIG. 28 shows the row 95 and columns 96 boundaries on the upper levels, defining the physical areas in which densities will be measured and recorded, as well as the notation used to reference those physical areas. In addition to bridges 100 and sections 98U, a new area, intersections 199, has been included so that separate density counts for it can be recorded. Intersections 199 are the areas between sections 98U in a row 97 and bridges 100 in a column 96. Bridges 100 have also been included in the row reference 95, making the basic physical components of a row-column unit the bridge 100, the intersection 199, and the section 98U. These are illustrated in the first row-column unit of FIG. 28. All row-column units, except for the last column, contain all these components. The last column contains only intersections and bridges. The row and column reference applies to the lower levels as well, except that there are no bridges, and the intersections are the walkways.

In FIG. 28, notations for DF components are as follows: bridges 100 are identified by the notation 200: B11, B12, B13, B14; intersections 199 are identified by the notation 299: I11, I12, I13, and I14; sections 98U are identified by the notation 198: S11, S12, and S13. Within each section 98U of upper shelves 202 and 302, cross-sections 112 take their number from the areas between adjacent verticals 101 below. However, on the upper shelves 202 and 302, an area to the left of the first vertical 101 below exists, and is given the designation XS0, since it is an area in which cross-connections will be present. There is no counterpart to this in the prior art because no traveling surface is physically present to the left of the first vertical in the linear design. Also, verticals 101 may be numbered (93) relative to the section 98, or continuously 94 from left to right, and top to bottom. In graphical displays of density, the continuous or absolute number 94 will be used. In FIG. 28, a double set of the cross-sections 112 is shown because it represents the DF of FIG. 14, in which the upper verticals have been converted to shelves. The number of verticals per section has been reduced to 8 (from 20) for ease of presentation. When other design options are used, such as no walkways, or no upper vertical conversion, the row-column designations still apply.

Figure 29:
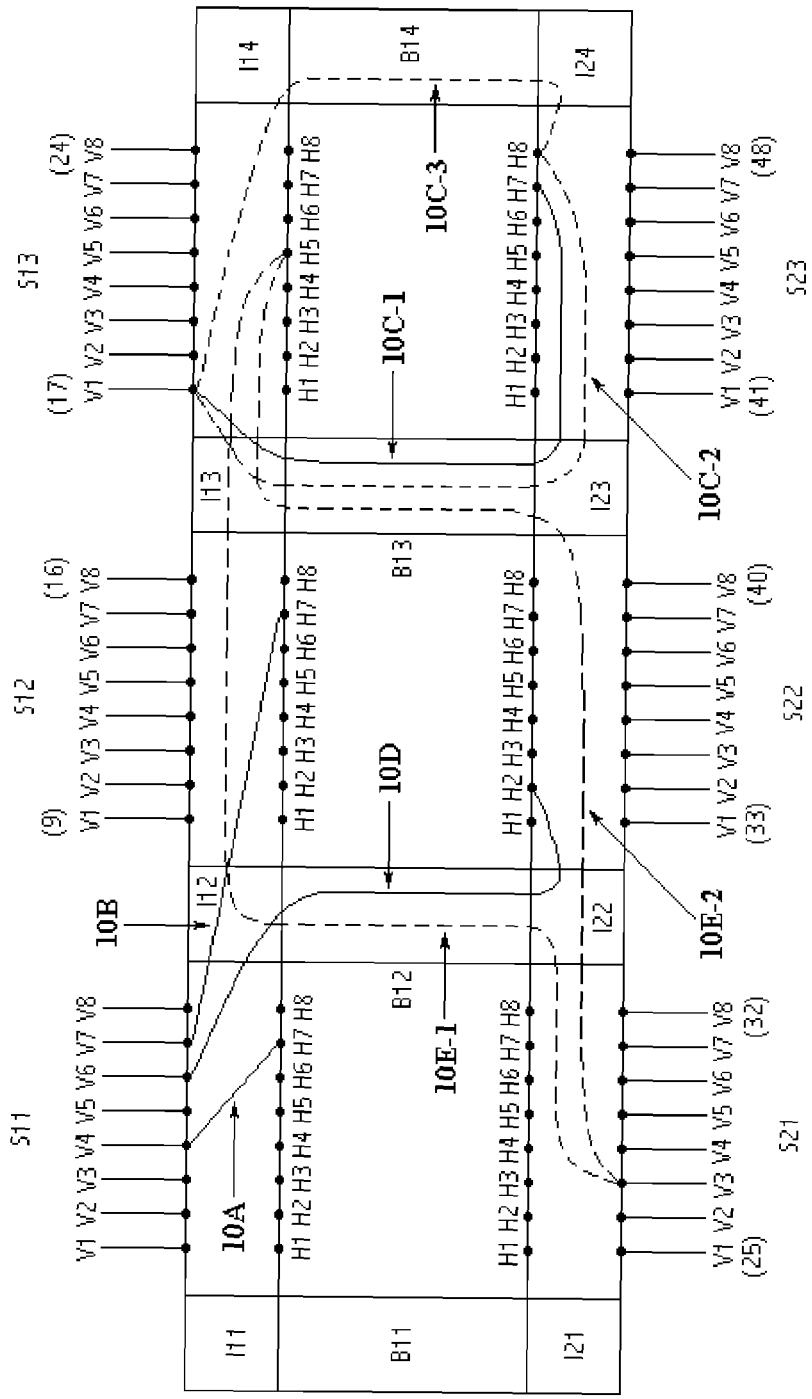
FIG. 29 illustrates types of connection paths on a bridged parallel array.

FIG. 29 shows the types of connection paths possible on the upper levels of a bridged-parallel DF, similar to those shown in the abstract example in FIGS. 25 and 26. The conversion of the upper portions of the verticals to shelves does not affect these basic path types. Definitions of the path type on the upper levels is necessary in order to account for densities in a logical manner (as in the abstract example), and a necessary first step in designing software capable of doing reliable calculations for larger configurations. Definitions of the paths depicted in FIG. 29 are as follows:

| Path Type | Definition | Multi-Path? | Example |
|---|---|---|---|
| Internal | V&H terminals in same section | No | 10A |
| Same Row | V&H terminals in same row, different col | No | 10B |
| Same Col | V&H terminals in same col, different row | Yes | 10C-1, 10C-2, 10C-3 |
| Top to Bot | Left section is above section to right | Yes | 10D |
| Bot to Top | Left section is below section to right | Yes | 10E-1, 10E-2 |

FIG. 30 shows a small bridged-parallel array, so that the densities 114 resulting from all possible connections 10 can be illustrated and counted. The array used is a 2×3(1,1,1) array, meaning that there are 2 rows 97 of 3 sections 98 each, and within each section 98 there is 1 vertical 101. An emanating number of six is used, meaning that six cross-connections 10 emanate randomly from each vertical 101, creating one connection 10 between each ring 103 and horizontal terminal 7. When two paths are possible for a connection 10, a half-connection is routed in each path. Cross-connections 10 drawn as dashed lines indicate half-connections, and solid lines indicate a full connection. In addition, no upper level shelf conversion is shown, and the shelves 202 are facing each other, rather than being aligned in the same direction.

FIG. 31 shows the densities 14 of the same connections 10 for an equivalent linear configuration.

When comparing the densities of FIGS. 30 and 31, it is important to remember that we are dealing with a particular horizontal slice. For the linear slice, all levels will be the same, but for the bridged-parallel DF, we have upper and lower level differences—i.e., bridges only appear on the upper four levels, so bridge densities must be adjusted to account for crossover connections from lower levels. In addition, some intersections (I12, I13, I22, I23) may be walkways on the lower levels, causing Same Row connections (V & H terminals in same row, different column) to pass through upper level intersections. This brings up the question of loading factors and how upper level (bridges, intersections, and shelves) densities must be adjusted to account for this, with and without optional features (walkways and upper shelf conversion).

All configurations illustrated so far have had 4 bridges at a single location serving twelve shelves. Thus, each bridge would have to handle the density of two additional shelves, or three times the load shown in FIG. 30. If this loading is too great, wider bridges or more bridges (in parallel or stacked higher) could be used. If this were not acceptable, then more and/or other bridge locations are tried.

Intersection and upper shelf density are affected by walkways and upper shelf conversion. Walkways under intersections with no upper shelf conversion would cause three times the density shown in FIG. 30. Upper shelf conversion with walkways greatly reduces this to one half, since the area doubled. When the walkways are removed below, the lower level Same Row connections do not have to be routed on top, so they would be subtracted from the load for the two shelves below that would have added to the intersection density. Upper shelf conversion after this would cut this in half.

Upper shelf conversion cuts upper shelf density in half. When there are no walkways and no upper shelf conversion, there would be no difference between upper and lower shelf densities. Upper shelf conversion with no walkways results in upper shelf densities that are half that of the lower shelf, so generally, this combination of options probably should not be used. With walkways and no upper shelf conversion, upper shelves must carry three times the load, since connections traveling out of the section have 4 shelves on which to travel instead of 12. Therefore, with walkways, it would be a good idea to also have upper shelf conversion, since the density is cut to 1.5 times as much, instead of 3.

The table below summarizes the loading adjustment for the various options discussed.

| | Bridge Density | Intersection Density | Upper Shelf Density |
|---|---|---|---|
| WW & US Conversion | $3D_{BR}$ | $1.5D_I$ | $1.5D_{US}$-$D_{Internal}$ |
| WW & No US Conversion | $3D_{BR}$ | $3D_I$ | $3D_{US}$-$2D_{Internal}$ |
| No WW & US Conversion | $3D_{BR}$ | $1.5D_I$-$D_{SR}$ | $0.5D_{US}$ |
| No WW & No US Conver | $3D_{BR}$ | $3D_I$-$2D_{SR}$ | $1.0D_{US}$ |

FIG. 32 shows the connections of FIG. 30 separated into path types, so that the densities contributed by each type can be seen more easily. Each interior intersection (I12, I13, I22, I23) contains four Same Row Connections and the corners (I11, I14, I21, and I24) each contain zero. Since there is only one vertical per section, the only Internal Connections are direct connections (V1-H1, V2-H2, etc.) that produce no density on the shelves.

Figure 33B:
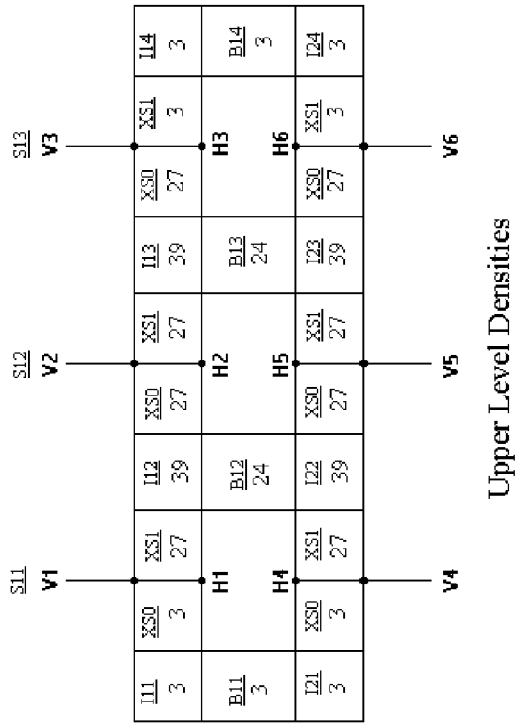
FIG. 33 illustrates densities from FIG. 30 adjusted for upper and lower levels on a bridged parallel DF with walkways and no upper shelf conversion.
Figure 33C:
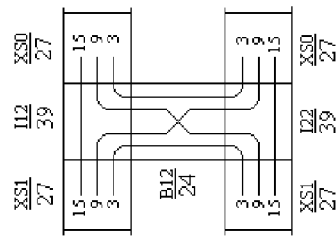
Figure 33A:
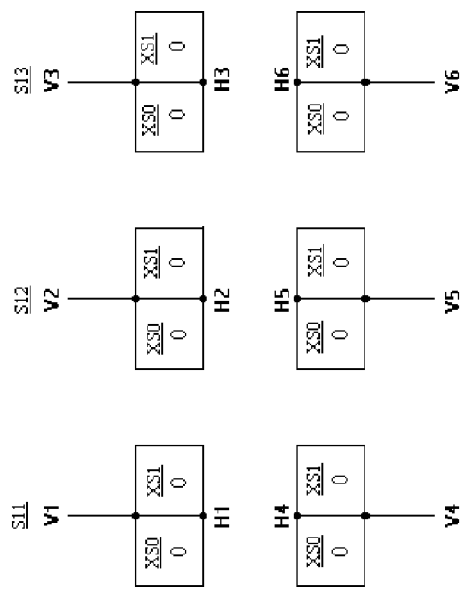

FIG. 33 illustrates the densities from FIG. 30 adjusted for lower and upper levels according to the Loading Table for walkways and no upper shelf conversion. This produces a distorted picture for so few verticals, but illustrates the fact that, under random connection conditions, most connections leave the section and travel over bridges and intersections, producing higher densities on the upper levels. Details of connections traveling through I12, B12, and I22 that comprise the densities of those areas are also shown.

Figure 34B:
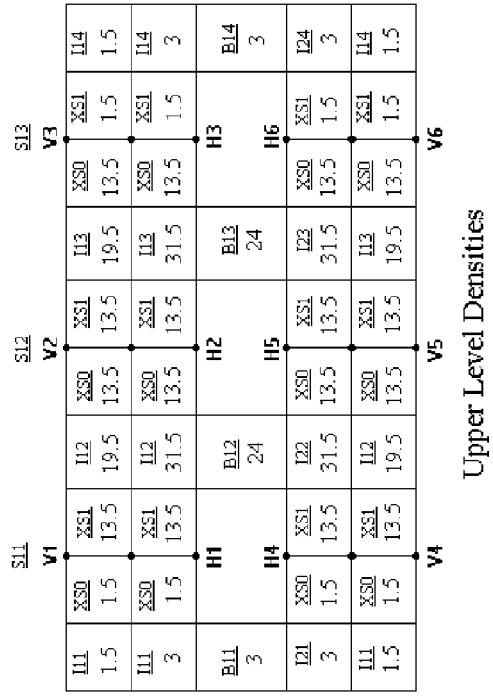
FIG. 34 illustrates densities from FIG. 30 adjusted for upper and lower levels on a bridged parallel DF with walkways and upper shelf conversion.
Figure 34C:
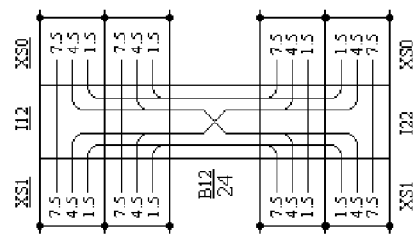
Figure 34A:
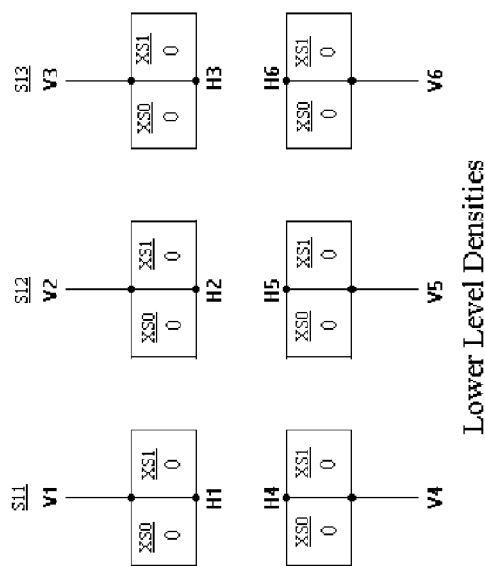

FIG. 34 illustrates the densities when FIG. 33 undergoes upper shelf conversion. The portions of the intersections I12 and I22 bordering the bridge B12 are significantly reduced, but not reduced to half. This is because this is an edge intersection, and there is no entry or exit from the 'top' (of the page). For intersections not on any edges or corners of the array, there are components on all four corners of the intersection, making upper shelf conversion more advantageous.

FIG. 35 illustrates all the types of connections (paths as shown in FIG. 29) found inside all nine possible types of intersections—corners, edges, and interiors. The only type path, according to the definitions for FIG. 29, not present is the Internal Connection. The four types present: TB (Top to Bottom), BT (Bottom to Top), SC (Same Column), and SR (Same Row), are further classified by the turns they make, or whether they pass straight through (the intersection) horizontally (on the page) or vertically (also on the page), making 14 classifications in all. Since intersections will contain the highest density of cross-connections on a bridged-parallel DF, it is important to know the details of everything passing through them. The simulation software developed for the bridged-parallel design DF keeps subtotals for each of the fourteen possible classifications for every intersection, as it does its calculations for all possible connections for a given set of parameters.

FIG. 36 lists these classifications, and relates them to the corners of the intersections, which have been arbitrarily numbered C1, C2, C3, and C4, with C1 at the upper right (corner), C2 at the upper left, C3 at the lower left, and C4 at the lower right (FIGS. 36A and 36B).

Along with Intersection density details, the simulation software calculates the densities of all the areas (bridges, shelves) as shown in FIG. 28, based on User specifications. All possible paths for each cross-connection are generated, and densities spread equally over all paths. For comparison purposes, densities for the equivalent linear shelf are also calculated.

Inputs to the Simulator: Expanded Path File and User Specifications
    Expanded Path File:
        File created by the path generation program
        Contains all possible paths for connections in a 6×6 matrix
        Each path includes a Section Number, Bridge Number, Intersection
        Number string from Section of VB origin to HB termination
The User Specifies:
    The number of sections by specifying
        The number of rows (1 to 6)
        The number of columns (1 to 6)
    The size of each section (thereby locating the bridges) by specifying
        The number of verticals for each column requested (1 to 100)
    The emanating number (1 to 999, usually 100)
        The number of connections emanating from each VB on the DF
The outputs of the simulation software are
    The Section Density File
    The Bridge Density File
    The Intersection Density Detail File
    The Intersection Density Subtotal File The Simulator outputs represent a horizontal slice of a bridged parallel distributing frame (BPDF) as in FIG. 30, and it is up to the user to determine the loading factor and produce the actual results, as was done in FIGS. 33 and 34. The actual file outputs for the User Request of 2×3(1,1,1), E=6, which produced the densities shown in FIG. 30, are shown in FIG. 37. The 2×3(1,1,1) example was done so that the individual connections could be drawn, and outputs shown in FIG. 37 could be verified. A slightly more realistic request, which cannot be drawn, but for which the output densities can be mapped, as in FIGS. 33 and 34, is 2×3(8,8,8), E=48.

The E=48 value was used so that one connection was made between each vertical and each HB.

Figure 39B:
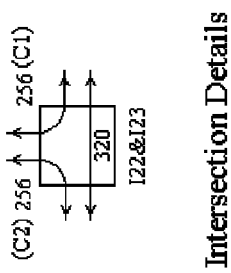
FIGS. 39A, 39B and 39C illustrate the mapping of numerical output for a 2×3(8,8,8), E=48 User request.
Figure 39A:
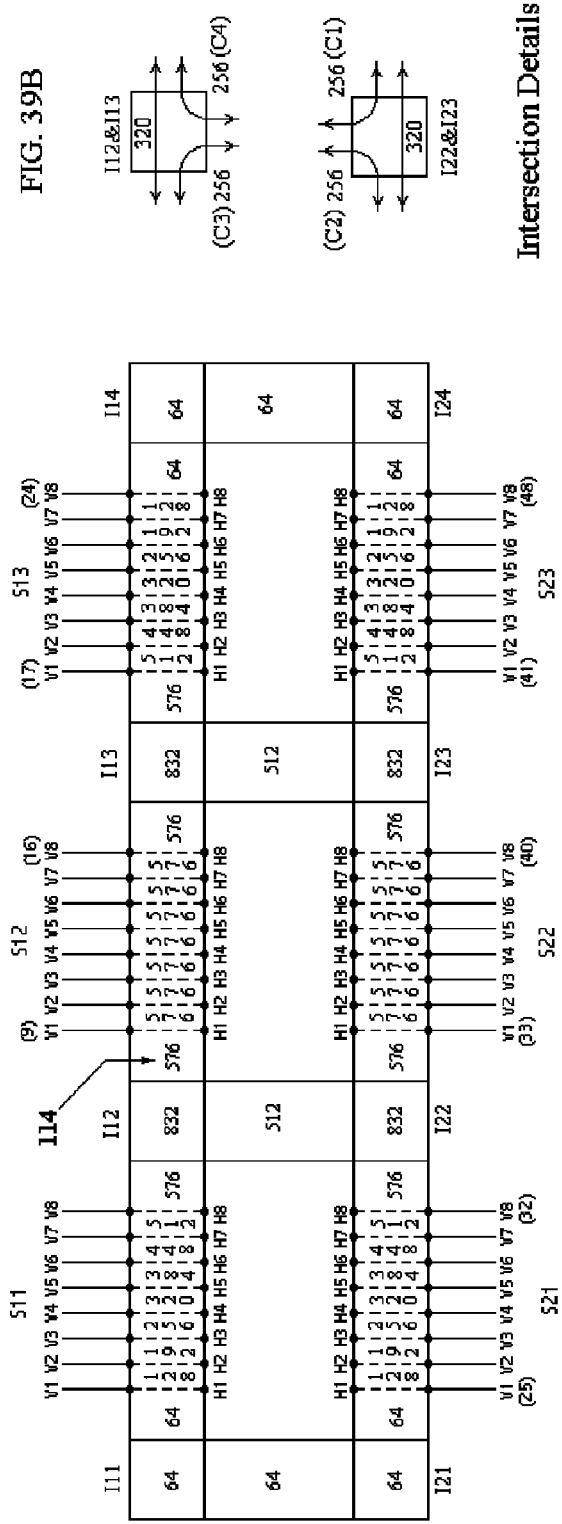
Figure 39C:
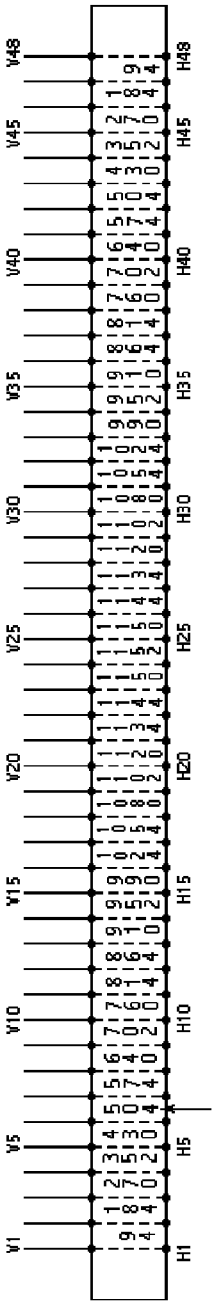

FIG. 38 shows the numerical output of all files except the Intersection Density Detail File. FIG. 39A shows the mapping of the numerical output in the format used in FIG. 28 to illustrate the bridged parallel notation. FIG. 39B illustrates density 114 details for the flow of connections through the interior intersections I12, I13, I22, and I23. FIG. 39C shows the mapping of the densities 14 for the conventional linear array, contained in the Section Density File.

Figure 40:
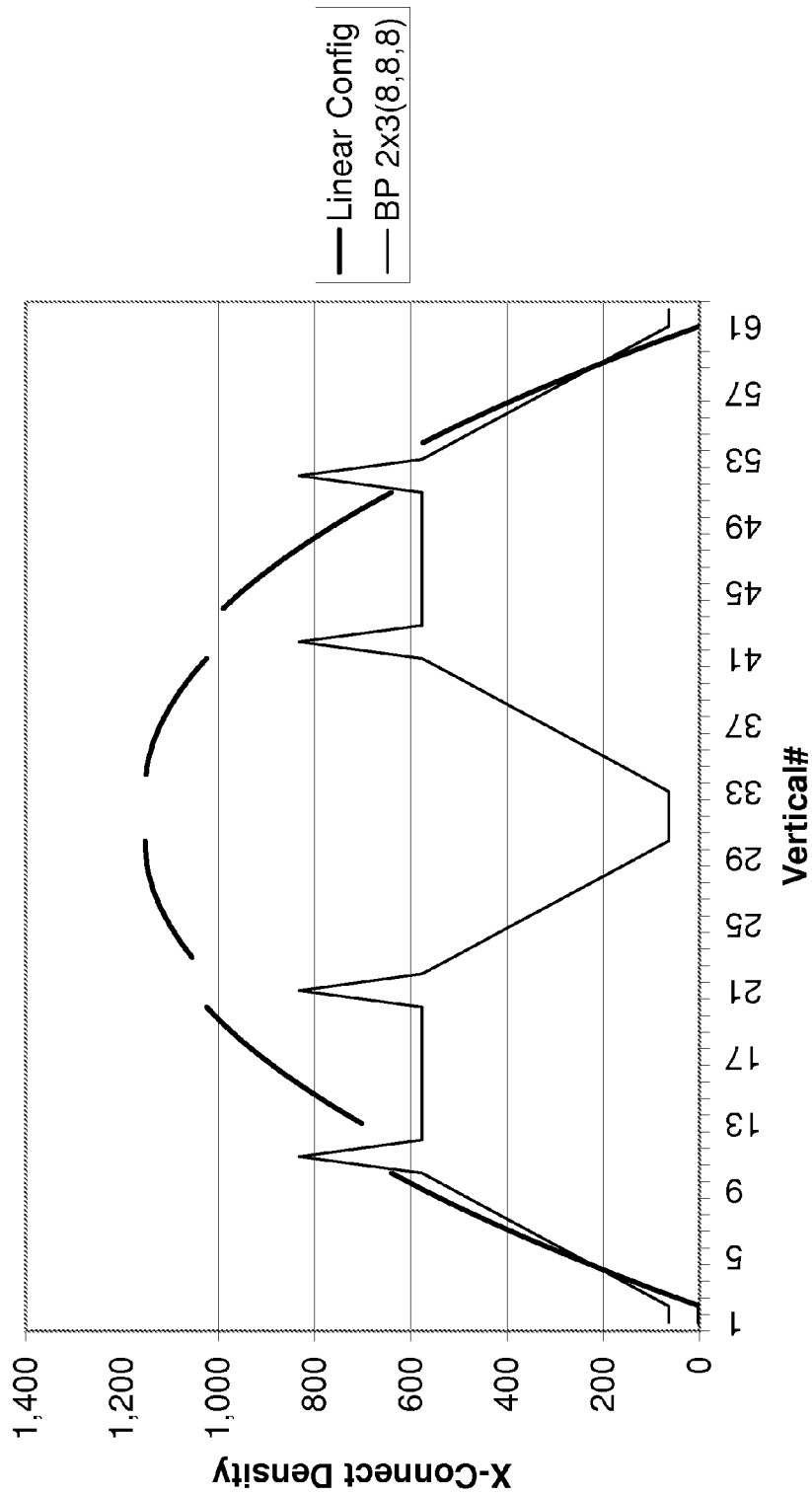
FIG. 40 is a graphical display of Simulator output: Density vs. Absolute Vertical Number for the raw data for the 2×3(8,8,8), E=48 User request.

FIG. 40 is the graphical representation of the Section Density File, and is the most convenient form of representation of the data for comparison of bridged-parallel and linear results. The gaps in the curve for the linear density are due to the inclusion of the intersections and the XS0 cross-sections in the data, which have no counterpart on the linear DF. The spikes are intersection densities, which are the densest on the bridged parallel design.

Figure 41:
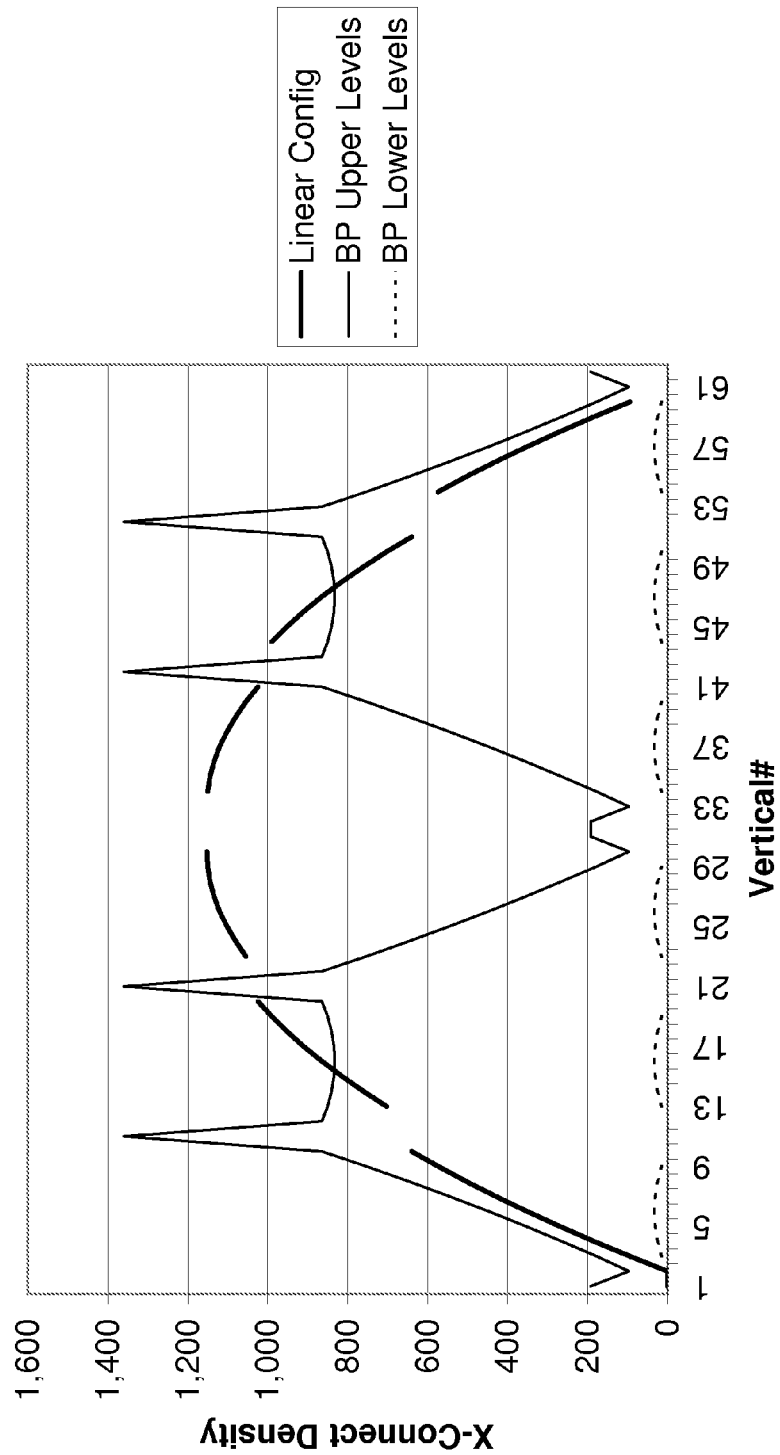
FIG. 41 is a graphical display of Simulator output: Density vs. Absolute Vertical Number for the data adjusted for walkways and upper shelf conversion for the 2×3(8,8,8), E=48 User request.
Figure 42:
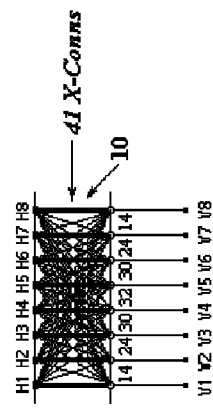
FIGS. 42A, 42B and 42C illustrate the mapping of numerical output for a 2×3(8,8,8), E=48 User request, adjusted for walkways and upper shelf conversion.

FIG. 41 is a graph of the data after it has been adjusted to reflect walkways and upper shelf conversion. Note that intersection densities have spiked even higher. However, intersections and bridges are isolated areas, without terminals, and can be designed to accommodate high loads without endangering the performance of the DF. Note especially that there are three curves—one for the linear configuration, and two for the bridged parallel. The curve with the spikes is for the upper levels, and down at the bottom we see the lower level densities. One huge benefit of designing a DF in this manner is that there is practically no cross-connect density on the lower levels, because the path of the connection on the upper level leaves it directly over its destination, so the vast majority of connections coming out of the ring do not disperse randomly—they go straight across to the HB FIG. 42 illustrates this, as well as upper level densities and intersection details, in the map form of FIG. 39. Although the connections are impossible to draw, density counts in FIGS. 39 and 42 can be balanced and verified through inspection. A strategy that can prove very useful on large DF's is to remove terminals from the upper levels altogether, or possibly just in the middle portions, where connections are most dense.

Figure 10:
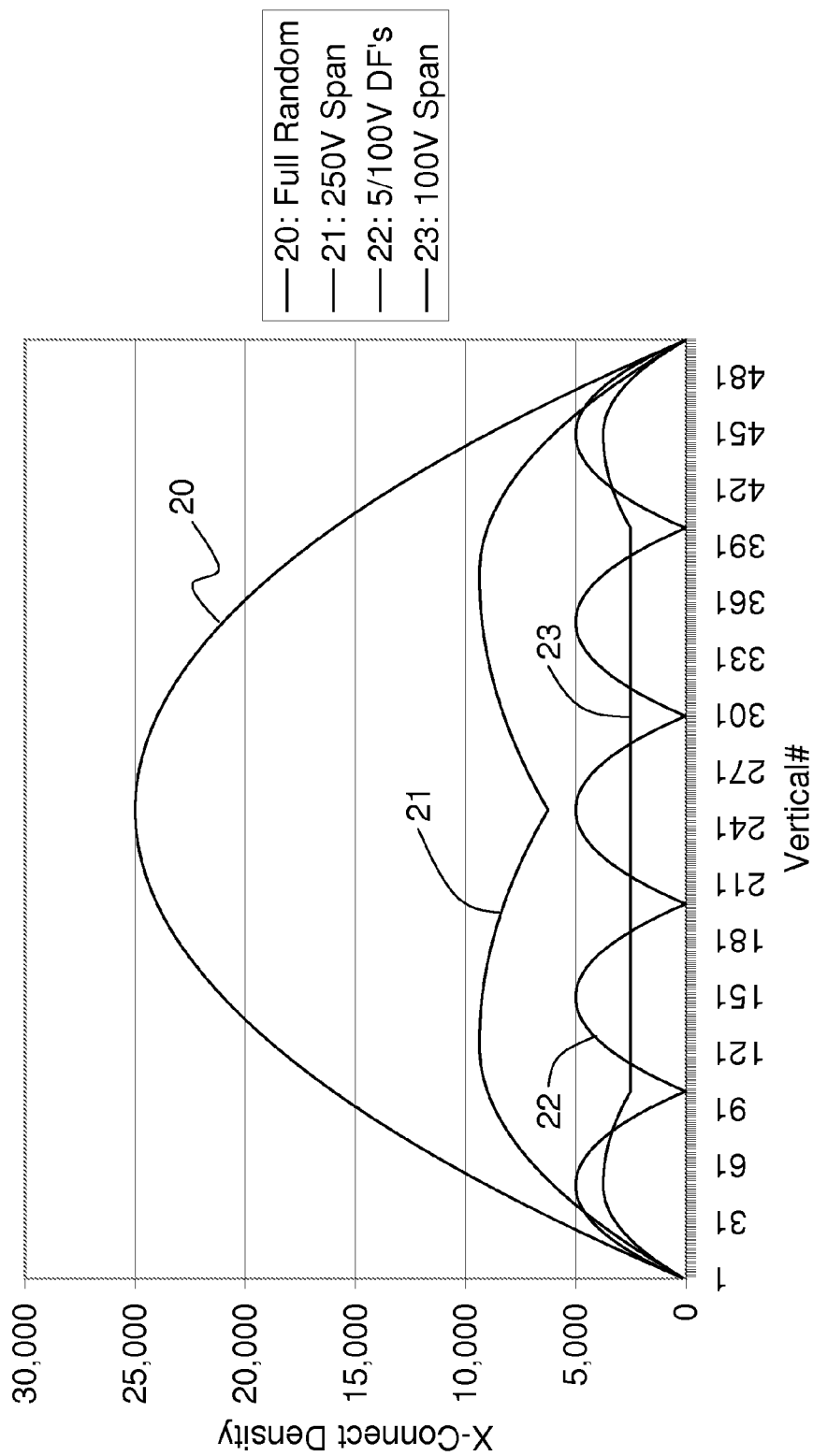
FIG. 10 is a graph of Cross-connect Density vs. Vertical Number for a 500 vertical shelf under varying degrees of randomness.

We can now apply the simulator to the DF of FIG. 21, and compare the results to the curves shown in FIG. 10 for the equivalent linear DF of the prior art design. Curve 22 in FIG.

Figure 43:
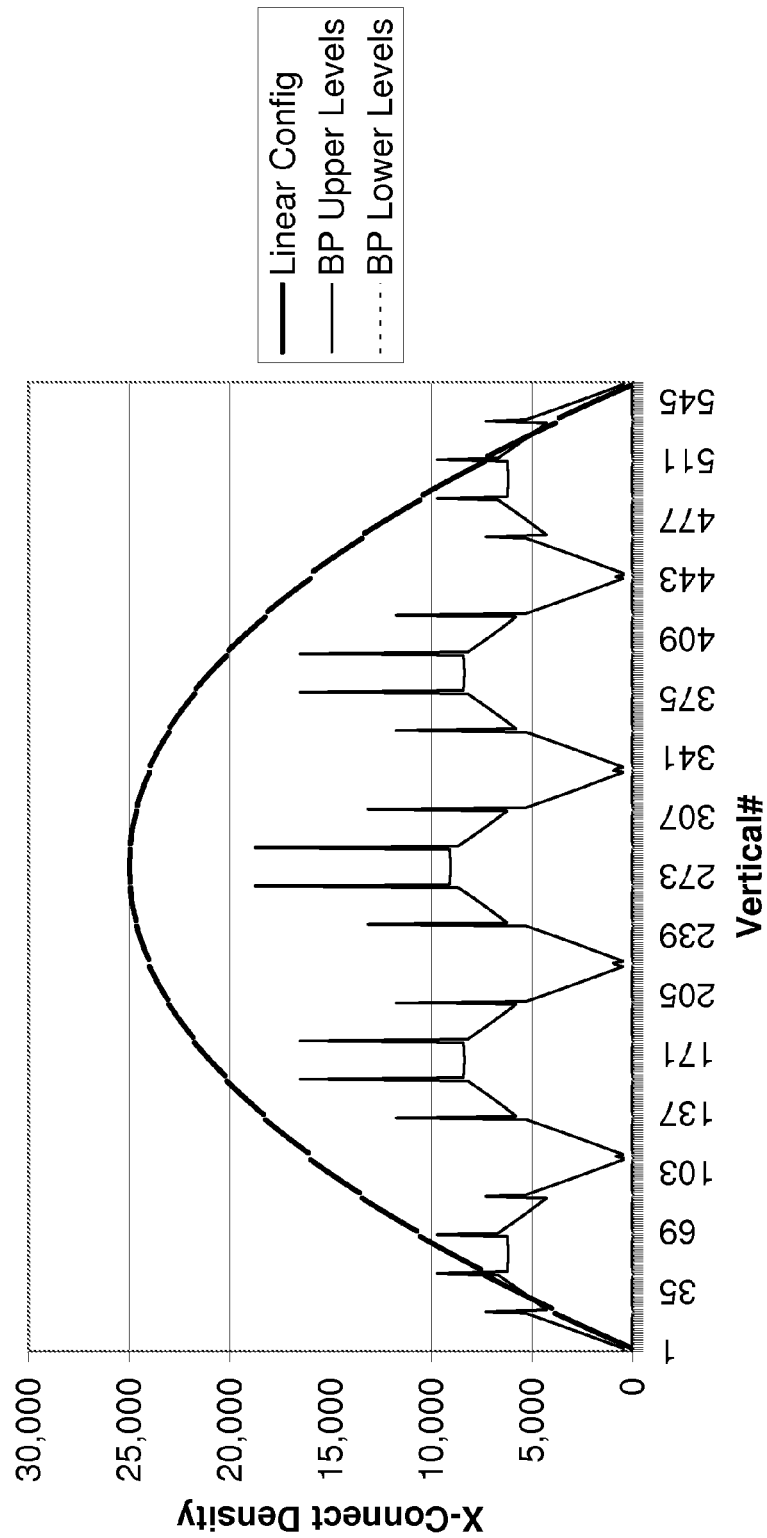
FIG. 43 is a graphical display of Simulator output: Density vs. Absolute Vertical Number for the data adjusted for walkways and upper shelf conversion for a 5×5(20,20,20,20,20), E=100 User request.

10 represents the densities of five 100V linear DF's, end to end, with no interconnection. The densities shown on the graph in FIG. 43 almost match this, but the bridged parallel DF offers complete random connectivity, with only isolated and predictable density spikes as a tradeoff. This is because expanding over an area offers huge advantages over expanding in a single linear direction.

The simulator software logic will now be explained.

At the beginning of development, it was decided that it would be simpler and more efficient to develop a master file of all paths of a matrix large enough to represent the largest practical bridged parallel DF, and use this as input to the density calculation process, rather than fabricate paths for each user request. When a user submits a request, the simulator can then extract the paths it needs to do its calculations.

FIG. 44 represents the maximum row and column boundaries of the Cross-connect Simulator. Connections may be made between any two sections 98, identified by the section numbers 198 in FIG. 44 as well as within a section 98. All possible cross-connect paths for any bridged parallel DF within or up to its boundaries must be considered by the software logic. However, these paths have been limited to non-reversing paths, as in the abstract example presented in FIGS. 25 and 26. These paths may be divided into four categories: Same Row—the two sections are within the same row; Same Column—the two sections are within the same column; Top to Bottom—the sections are in different rows and columns, with the section on the left above the section to the right; Bottom to Top—different rows and columns, with the section on the left below the section on the right.

(FIG. 45—Step 1.0) Top to Bottom and Bottom to Top paths are diagonal paths, and can be generated at the same time with a simple algorithm, the high level code for which is shown in FIG. 46. Basically, a 6 digit number is incremented from zero to 555555 in increments of 1. Moving left to right, each successive digit would represent a level of a section 98, shown in FIG. 44, with Row 6 in FIG. 44 being the zero level. The first digit would represent Col 1, the second digit Col 2, and so on. Any number containing a digit beyond 5 is rejected. Any number in which all the digits are equal would be a Same Row path, so those are rejected also. Passing these two tests, if each successive digit is less than or equal to the previous, then, moving left to right, the number describes a series of levels which form a Top to Bottom path in the matrix of FIG. 44. Section numbers 198, Bridge numbers 200, and Intersection numbers 299 can then be generated to form a complete description of the path from I61 to I17. Similarly, if each successive digit is greater than or equal to the previous, the number would describe a series of levels which form a Top to Bottom path in the Matrix of FIG. 44. Section numbers, etc, can then be generated. When we are finished, we have a table of all the paths from I61 to I17 (Bottom to Top), and a table of paths from I11 to I67 (Top to Bottom).

Next (FIG. 45—Step 2.0), all combinations of section numbers are generated. Since there are 36 sections 98, there are 36(36−1)/2=630 possible combinations. By comparing the row and column numbers of the sections of each combination, we can determine whether they are at the ends of a Same Row path, Same Column path, Top to Bottom path, or Bottom to Top path. Each combination is identified as one of these, and the information is saved in a combination table.

Next (FIG. 45—Step 3.0), all Top to Bottom paths are generated by passing through the combination table. For each Top to Bottom section to section combination, the portions of the paths that start with the first section and end with the second section are extracted from the Diagonal Path Table and saved on an All-TB-Table. The same process (FIG. 45—Step 4.0) is performed for Bottom to Top paths, and they are saved on an All-BT-Table.

Next (FIG. 45—Step 5.0), Same Column paths are generated by passing through the Combination Table. For each Same Column combination, 2 paths are generated—one taking bridges down the left side, and one taking bridges down the right side.

Finally (FIG. 45—Step 6.0), each entry on the combination table designated as Same Row is processed. Only one path exists, and that is through all the intervening sections in the row.

Figure 45:
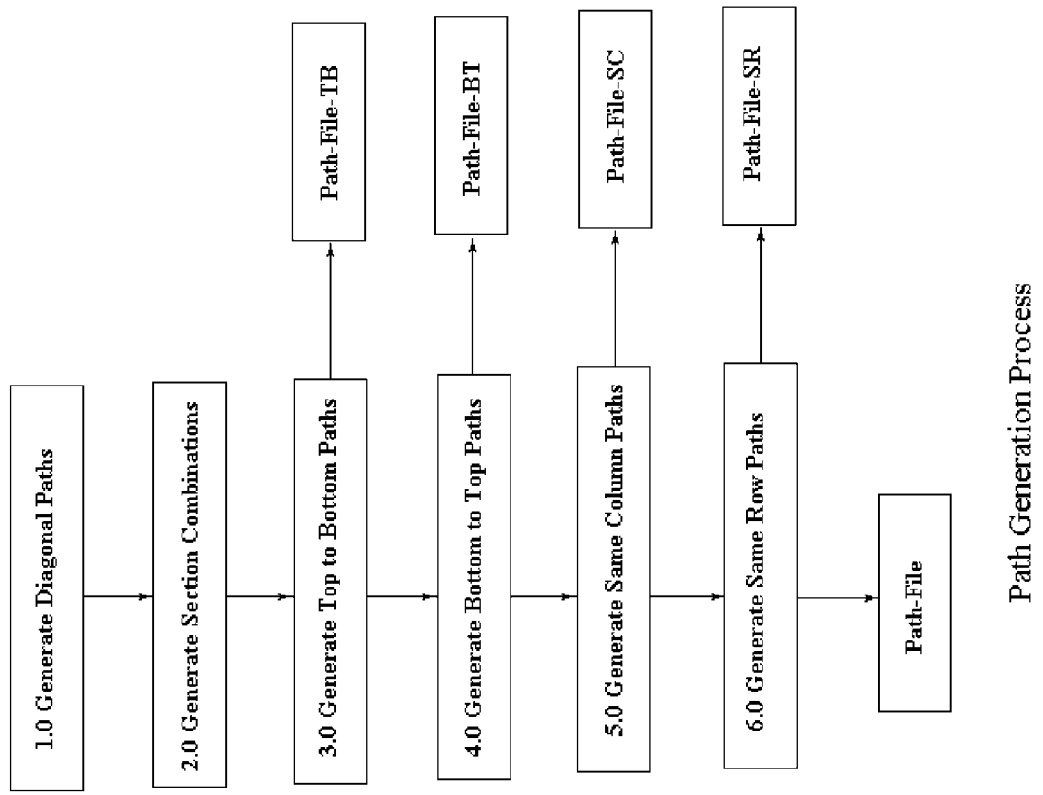
FIG. 45 is a flow chart for the Path Generation process that produces an independent Path File used for Simulator input.

The process shown in FIG. 45 ends with a file for each path type, as well as a file containing all paths. The file containing all the paths may undergo a few more changes to make it easier to process by the simulator, but is substantially the same.

Figure 47:
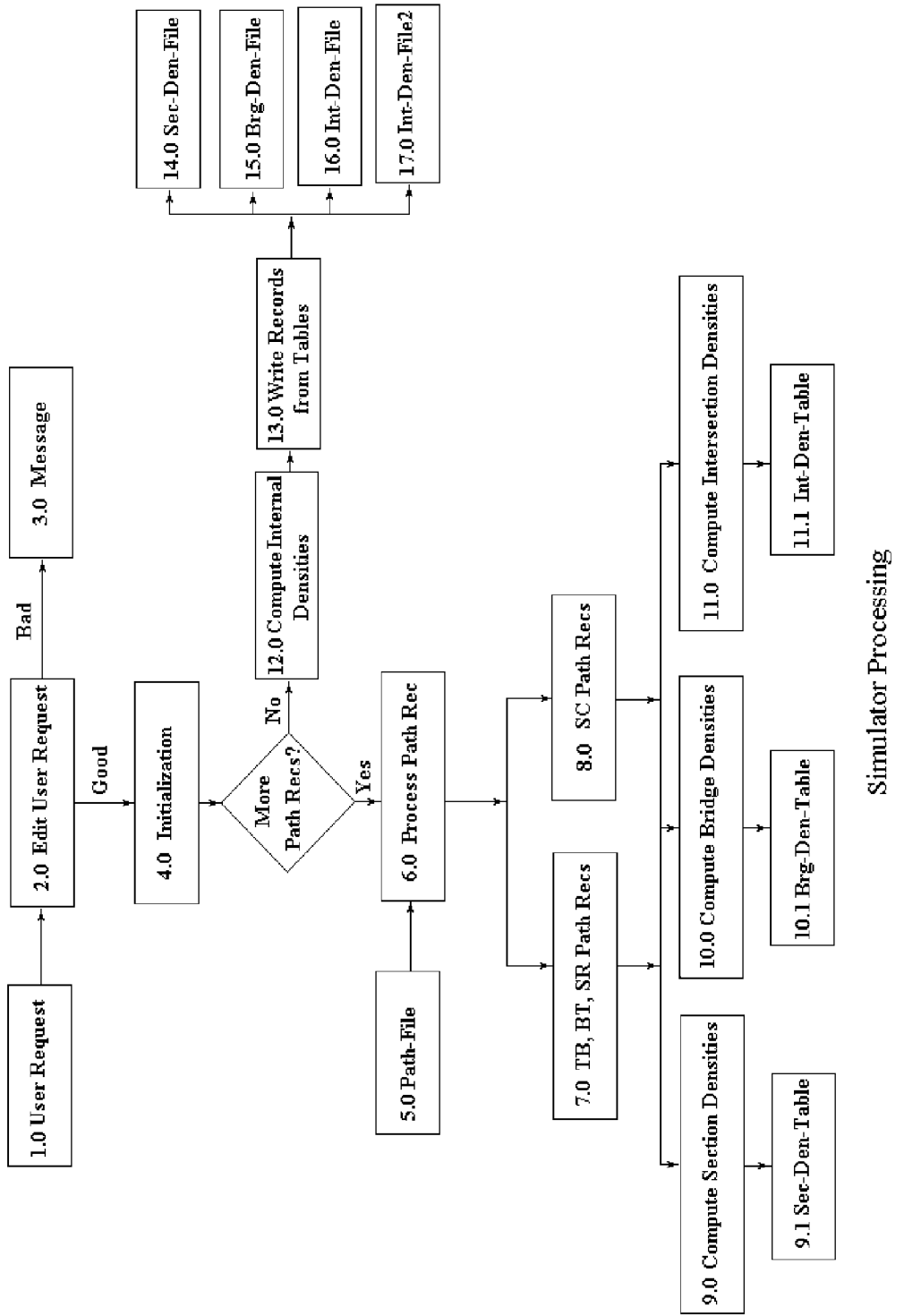
FIG. 47 is a flow chart of Simulator processing.

FIG. 47 shows the basic processing of the Simulator as follows:
FIG. 47—Step 1.0: The User Specifies:
The number of sections by specifying
The number of rows (1 to 6)
The number of columns (1 to 6)
The number of verticals for each column requested (1 to 100)
The number (1 to 999, usually 100) of connections emanating from each VB
FIG. 47—Step 2.0 Edit User Request: Allowable values shown above.
FIG. 47—Step 3.0 Message: Only if bad request
FIG. 47—Step 4.0 Initialization.
The number of verticals per row and the total number of verticals is computed.
The terminal to terminal connection constant is computed:

$$K\text{conn-Term-toTerm} = User\text{-}Specified\text{-}Eman\text{-}Number/Tot\text{-}Num\text{-}Ver$$

FIG. 47—Step 5.0 Path File and Step 6.0 Process Path Recs.
The path file is read, and any path falling within the boundaries of the user request will be processed. Since the path file contains every path of every possible section-to-section combination, processing will be complete when we hit the end of file. To be within the bounds of the user request, both the row and column number of the From and To sections on the path record must be less than or equal to the maximum row and maximum column of the user request.

Generally, for each path record that is processed, the densities for all the cross-sections in all the sections must be incremented. The From and To sections must be incremented by an increasing amount from the ends to the middle, until the exit of the section is reached. All intermediate sections, bridges, or intersections are incremented by a 'Pass-Through' amount, which is the total number of connections between the From and To sections. These are all specified in the Path-Rec.

The number of connections between sections depends on the number of verticals in each section, and the number of connections between each pair of vertical and horizontal terminals, or Kconn-Term-toTerm, just calculated. The user has specified the number of verticals for each column, so the column location of the from and to section of the path will determine the number of verticals in the 'from' and 'to' section of the path record. The number of connections between the from and to section of the path record can be calculated as follows:

$$K\text{conn-Sec-toSec} = 2 * K\text{conn-Term-to-Term} * NumVer\text{-}in\text{-}From\text{-}Sec * Num\text{-}Ver\text{-}in\text{-}To\text{-}Sec$$

For Top to Bottom, Bottom to Top, and Same Row Records, processing is the same, because there is a distinct front end and back end of the 2 sections being interconnected, and they pass through intermediate sections, as well as bridges and intersections, along the path specified on the Path Rec. Same Column connections, however, do not pass through any intermediate sections, only bridges and intersections connect the from and To sections.

FIG. 47—Step 7.0 TB, BT, and SR Recs.

Each Path Rec contains the number of paths associated with each From-To section combination for which the Path-Rec is specifying a path. Thus, we know, for every Path Rec, how many paths to spread the connections over, just as they were in the paths presented in FIG. 26. We can compute the following needed constants:

$K$Conn-per-pass-Thru=$K$conn-Sec-to-Sec/Num-Paths $K$conn-Term-toTerm-per-Path=$K$Conn-Term-to-Term/Num-Paths We also compute the internal increment in the From and To sections:

Internal-Increment-in-From-Sec=$K$conn-Term-to-Term-per-Path*Num-Ver-in-From-Sec Internal-Increment-in-To-Sec=$K$conn-Term-toTerm-per-Path*Num-Ver-in-To-Sec FIG. 47—Step 8.0 Same Column (SC) Path Recs Since the two sections and the bridges form a ring, a constant amount can be added in the sections and bridges. This amount is the Pass-Through amount. However, the internal connections would be included in this, and must be deducted, because they are done separately at the end of processing for a Path-Rec.

The Section-Density Table is incremented only for the From an To sections. The Bridge and Intersection Tables are incremented by the Pass-Through amount.

FIG. 47—Step 9.0 Compute Section Densities.

The remainder of the processing involves incrementing the From section, all intermediate sections, bridges, or intersections, and the To section. The From section has the buildup effect as more connections are picked up as travel progresses through the section. Once reaching the last cross-section, the amount has built to the Pass-Through amount for the path. On the To section at the other end, the Internal-Increment-in-the-To-Sec amount is deducted from the density addition as the cross-sections of the To section are passed.

The full pass-through per path amount is added to all cross-sections of each intermediate section in the path.

All amounts for density totals are stored on the Sec-Den-Table.

FIG. 47—Step 10.0 Compute Bridge Densities.

The full pass-through amount is added to all intermediate bridges in the path. Bridge densities are stored on the Bridge-Den-Table.

FIG. 47—Step 11.0 Compute Intersection Densities.

The Pass-Through per path amount is added to the appropriate fields on the Intersection Table for each intersection on the path. Left or right turns are determined by the prior path segment and type of path (stored on Path Rec).

FIG. 47—Step 12.0 Compute Internal Densities.

When all the Path-Recs are exhausted, there are some connections for all the sections within the bounds of the user request that are not path dependent—they are internal to each section, being from VB's in the section to HB's in the same section. These densities are added to the Section-Density Table only.

FIG. 47—Step 13.0 Write Records from Tables.

Finally, all populated occurrences of each table are used to populate the fields of each of the out put files. The Int-Den-File2 is merely an abbreviated version of the Int-Den-File.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A method for simulating a design of interconnections for a distributing frame by using a computer to perform steps comprising:
   a. specifying a proposed design for the distributing frame;
   b. specifying regions in which connection densities of the interconnections will be measured or calculated;
   c. specifying assumptions necessary to enable density measurement or calculation of the interconnections;
   d. generating connection paths of the interconnections resulting from said design;
   e. computing connection densities of the interconnections for said specified regions of said design;
   f. computing total connection length dimensions and average connection length of the interconnections for said design; and
   g. displaying said computed connection densities and length dimensions of the interconnections.

2. The method of claim 1, used for simulating a linear distributing frame, wherein said specifying a proposed design further comprises:
   a. specifying a number of verticals of said proposed design;
   b. specifying a number of terminals per vertical; and
   c. specifying a number of shelves of said proposed design.

3. The method of claim 1, used for simulating for a bridged parallel distributing frame, wherein said specifying a proposed design further comprises:
   a. specifying a number of said rows of said sections of said proposed design;
   b. specifying a number of said columns of said sections of said proposed design;
   c. specifying a number of verticals for each of said specified columns of said sections;
   d. specifying a number of terminals per vertical of said proposed design; and
   e. specifying a number of shelves of said proposed design.

4. The method of claim 1, used for simulating for a linear distributing frame, wherein said specifying regions in which connection densities are measured or calculated, further comprises defining and identifying said regions as follows:
   a. vertical cross-sections, defined as the areas between shelves on a vertical and identified by shelf number of a shelf on a lower boundary; and
   b. horizontal cross-sections, defined as the areas between verticals on a shelf and identified by a vertical number of a vertical on the lower boundary.

5. The method of claim 1, used for simulating a bridged parallel distributing frame, wherein said specifying regions in which connection densities are measured or calculated, further comprises defining and identifying said regions as follows:
   a. major regions including:
      (i.) sections defined as a continuous series of verticals and shelves and identified as part of a matrix, using a row-column designation S(i,j)

(ii.) intersections defined as a region connecting a the upper shelves of two sections in a same row and identified as part of a matrix, using a row-column designation I(i,j)

(iii.) bridges defined as the region connecting two intersections of adjacent rows and identified as part of a matrix, using a row-column designation B(i,j)

b. subdivisions including:
   (i.) vertical cross-sections of sections defined as subdivisions of sections, with regions between shelves on a vertical within a section identified by the shelf number of the shelf on a lower boundary and absolute vertical number or relative vertical number within a section;
   (ii.) horizontal cross-sections of sections defined as subdivisions of sections, with a regions between verticals on a shelf within a section identified by an absolute vertical number or relative vertical number of a vertical on the lower boundary and the shelf number;
   (iii.) corners of intersections defined as subdivisions of intersections for connections traveling from a bridge to a shelf or from a shelf to a bridge, identified as C1, C2, C3, C4; and
   (iv.) pass-throughs of intersections defined as subdivisions of intersections for connections passing straight through an intersection, rather than turning a corner, and identified as vertical pass-through from bridge to bridge and horizontal pass-throughs from shelf to shelf, wherein vertical and horizontal refer to being viewed from a representation of a plan view of an upper shelf matrix of the distributing frame.

6. The method of claim 1, further comprising specifying assumptions necessary to enable density measurement or calculation, including:
   a. specifying assumptions of terminal capacity, further including:
      (i.) assuming that all verticals have equal termination capacity;
      (ii.) assuming that all shelves, in a region directly opposite each vertical, have a termination capacity equal to or greater than the vertical terminal capacity;
   b. specifying the assumption of terminal grouping, further comprising:
      (i.) assuming that all terminals on a vertical are grouped into points directly opposite a ring located at the intersection of the vertical and shelf, and that each of these points contain an equal portion of the total termination capacity of the vertical;
      (ii.) assuming that all terminals on a shelf are grouped into points directly opposite a ring located at an intersection of the vertical and shelf, and that each of these points contain a termination capacity equal to, or greater than that of each vertical terminal grouping;
   c. specifying a theoretical connection state for calculation purposes, including:
      (i.) specifying a percentage of vertical terminals on which a connection is terminated for all vertical terminal groupings;
      (ii.) defining a theoretical perfect random connection state in which each vertical terminal grouping of the distributing frame is connected to each horizontal terminal grouping by an equal number of connections;
      (iii.) defining partial randomness on the shelves of distributing frames, in which an equal number of connections pass through each ring at each vertical to shelf intersection and the connections passing through each ring at each vertical location are dispersed equally to a specified number of closest horizontal terminals.

7. The method of claim 1, used for simulating for a linear distributing frame, wherein said generating connection paths resulting from said design further comprises defining a single correct path for each connection as follows: from a vertical terminal to a ring at shelf level of a horizontal terminal to a horizontal terminal.

8. The method of claim 1, further comprising specifying connection densities, for said specified regions of said design by:
   a. initializing said density of all said regions to zero; and
   b. for each said connection, or fraction of said connection present on said proposed design, incrementing by one, or by an appropriate fraction, the connection density for each of said regions through which said connection or fraction of said connection travels, from vertical terminal to horizontal terminal.

9. The method of claim 1, used for simulating for a linear distributing frame, wherein said computing connection densities for said specified regions of said design, when a perfect random connection state exists, and connection paths of said perfect random connection state are used, further comprises:
   a. computing vertical densities by means of the following formula:

$$D_v = 2k_v s(S-s)$$

where:
   $k_v$=vertical connection constant
   =number of terminals per vertical/(S×S)
   s=vertical cross-section number=lower shelf number
   S=total number of shelves; and b. computing horizontal densities by means of the following formula:

$$D_H = 2k_h v(V-v)$$

where:
   $K_h$=horizontal connection constant
   =number of terminals per Vertical/(S×V)
   v=horizontal cross-section number=lower vertical number
   V=total number of verticals.

10. The method of claim 9, further comprising storing data representative of said densities in a file.

11. The method of claim 1, used for simulating for a linear distributing frame, wherein said displaying said computed densities further comprises displaying stored data representative of shelf densities in a graphical format of density vs. vertical number, thus representing an identification of a horizontal cross-section for which said computed connection density is plotted.

12. The method of claim 11, further comprising storing data representative of said densities in at least one file.

13. The method of claim 1, used for simulating for a bridged parallel distributing frame, wherein said displaying of said computed densities is in a graphical format, further comprises:
   a. displaying stored data representative of said densities in a graphical format of density verses vertical number, thus representing identification of a horizontal cross-section for which said computed density is plotted;
   b. displaying maximum density of each section, total density of each intersection, and bridge density in a grid corresponding to the boundaries of said design;
   c. providing bar graphs of bridge densities; and
   d. providing bar graphs of intersection densities.

14. The method of claim 1, used for simulating for a linear distributing frame, wherein said computing total connection length dimensions and average connection length of the interconnections for said design further comprises:
   a. summing said computed densities for all cross-sections;
   b. multiplying a summation of densities by a spacing of verticals, to compute total connection dimension; and
   c. dividing total connection footage by a total number of connections, to compute average connection length.

15. The method of claim 1, used for simulating a bridged parallel distributing frame, wherein said computing total connection length dimensions and average connection length of the interconnections for said design further comprises:
   a. summing said computed densities for all cross-sections;
   b. multiplying the summation of densities by a spacing of verticals, to compute total cross-section dimension;
   c. summing all vertical pass-through densities of all intersections;
   d. multiplying the summation of densities by front to back dimension of the frame, to compute total vertical pass-through dimension;
   e. summing all horizontal pass-through densities of all intersections;
   f. multiplying the summation of horizontal pass-through densities by intersection width, to compute total horizontal pass-through dimension;
   g. summing all corner densities of all intersections;
   h. multiplying the summation of corner densities by length inside an intersection of a connection turning a corner of that intersection, to compute total corner dimension;
   i. computing a total intersection dimension as the sum of total vertical pass-through dimension, total horizontal pass-through dimension and total corner dimension;
   j. summing all bridge densities of all bridges;
   k. multiplying the summation of bridge densities by bridge length dimension, to compute a total bridge dimension;
   l. computing a total connection footage as the sum of total cross-section dimension, total intersection dimension and total bridge footage; and
   m. dividing total connection dimension by the total number of connections, to compute average connection length.

16. The method of claim 1, further comprising using the computed densities and lengths to evaluate the design.

17. The method of claim 1 for optimizing matrix arrays of points such that lengths and densities resulting from random connections, following defined path rules, will be minimized.

18. The method of claim 1, used for simulating for a bridged parallel distributing frame, wherein computing connection densities for said specified horizontal regions of said design is accomplished by numerical means when a perfect random connection state exists and only connection paths of said perfect random connection state are used, in the following steps:
   a.) compute preliminary constants as follows:
      (i.) number of verticals per row;
      (ii.) total number of verticals; and
      (iii.) number of connections between each vertical and horizontal terminal;
   b.) compute connection densities caused by connections originating and terminating in the same section of said design; and
   c.) compute connection densities in all regions caused by connections originating and terminating in different sections of said design.

19. The method of claim 1, used for simulating a bridged parallel distributing frame, wherein said path generation further comprises:
   A. creating a set of definitions describing the paths that are allowed on a matrix formed by the upper shelves of the bridged parallel configuration in general;
   B. generating all section to section combinations possible for said proposed design; and
   C. generating all allowable paths for each section to section combination.

20. The method of claim 19, further comprising storing data representative of the generated allowable paths in at least one file.

21. A non-transitory computer readable medium having thereon computer readable instructions for causing a computer to perform the method of claim 1.

22. The method of claim 1, wherein step d. comprises calculating a number of non-reversing paths between two points in a row-column matrix array of points in the distributing frame, using only horizontal and/or vertical steps between adjacent points, by means of the following $$\text{\#Non-reversing Paths} = (\Delta R + \Delta C)!/(\Delta R! \times \Delta C!)$$

where $\Delta R$ is the distance between the points in rows and $\Delta C$ is the distance between the two points in columns.

* * * * *